United States Patent
Tachibana et al.

(10) Patent No.: US 9,580,623 B2
(45) Date of Patent: Feb. 28, 2017

(54) PATTERNING PROCESS USING A BORON PHOSPHORUS SILICON GLASS FILM

(71) Applicants: SHIN-ETSU CHEMICAL CO., LTD., Tokyo (JP); INTERNATIONAL BUSINESS MACHINES CORPORATION, Armonk, NY (US)

(72) Inventors: Seiichiro Tachibana, Jyoetsu (JP); Yoshinori Taneda, Jyoetsu (JP); Rie Kikuchi, Jyoetsu (JP); Tsutomu Ogihara, Jyoetsu (JP); Yoshio Kawai, Jyoetsu (JP); Karen Petrillo, Voorheesville, NY (US); Martin Glodde, Pine Brook, NJ (US)

(73) Assignees: SHIN-ETSU CHEMICAL CO., LTD., Tokyo (JP); INTERNATIONAL BUSINESS MACHINES CORPORATION, Armonk, NY (US)

( * ) Notice: Subject to any disclaimer, the term of this patent is extended or adjusted under 35 U.S.C. 154(b) by 98 days.

(21) Appl. No.: 14/664,503

(22) Filed: Mar. 20, 2015

(65) Prior Publication Data
US 2016/0276152 A1  Sep. 22, 2016

(51) Int. Cl.
*H01L 21/033* (2006.01)
*C09D 183/04* (2006.01)
(Continued)

(52) U.S. Cl.
CPC ...... *C09D 183/04* (2013.01); *H01L 21/02129* (2013.01); *H01L 21/02282* (2013.01);
(Continued)

(58) Field of Classification Search
CPC ............... H01L 21/033; H01L 21/0337; H01L 21/0332; H01L 21/02129; H01L 21/02282;
(Continued)

(56) References Cited

U.S. PATENT DOCUMENTS

2006/0019195 A1\* 1/2006 Hatakeyama ........... G03F 7/091
430/271.1
2007/0238300 A1 10/2007 Ogihara et al.
(Continued)

FOREIGN PATENT DOCUMENTS

JP  2007-302873 A  11/2007
JP  2009-126940 A   6/2009
(Continued)

OTHER PUBLICATIONS

Nakamura et al., "Contact Hole Formation by Multiple Exposure Technique in Ultra-low k1 Lithography," Optical Microlithography XVII, Proceedings of SPIE, vol. 5377, pp. 255-263, 2004.

*Primary Examiner* — Selim Ahmed
(74) *Attorney, Agent, or Firm* — Oliff PLC

(57) ABSTRACT

The present invention provides a patterning process, which comprises step of forming a BPSG film on the under layer film by using a composition for forming a coating type BPSG film including a base polymer and an organic compound with a content of 25 parts by mass or more of the organic compound with respect to 100 parts by mass of the base polymer, the base polymer having a silicon containing unit, a boron containing unit and a phosphorus containing unit with a total content of the boron containing unit and the phosphorus containing unit being 10 mol % or more, the organic compound having two or more hydroxyl groups or carboxyl groups per one molecule. There can be provided a patterning process in which a fine mask pattern can be formed on the substrate to be processed by the multilayer resist method, and the residue of the resist under layer film on the mask pattern can be removed cleanly enough to process the substrate to be processed without causing damage to the substrate to be processed and the under layer film.

12 Claims, 1 Drawing Sheet

(51) Int. Cl.
 *H01L 21/02* (2006.01)
 *H01L 21/311* (2006.01)

(52) U.S. Cl.
 CPC .... *H01L 21/0332* (2013.01); *H01L 21/31111* (2013.01); *H01L 21/31122* (2013.01); *H01L 21/31138* (2013.01); *H01L 21/31144* (2013.01)

(58) Field of Classification Search
 CPC ......... H01L 21/31144; H01L 21/31111; H01L 21/31138
 See application file for complete search history.

(56) References Cited

U.S. PATENT DOCUMENTS

2009/0136869 A1 5/2009 Ogihara et al.
2010/0285407 A1 11/2010 Ogihara et al.

FOREIGN PATENT DOCUMENTS

JP 4355943 B2 11/2009
JP 2010-262230 A 11/2010

\* cited by examiner

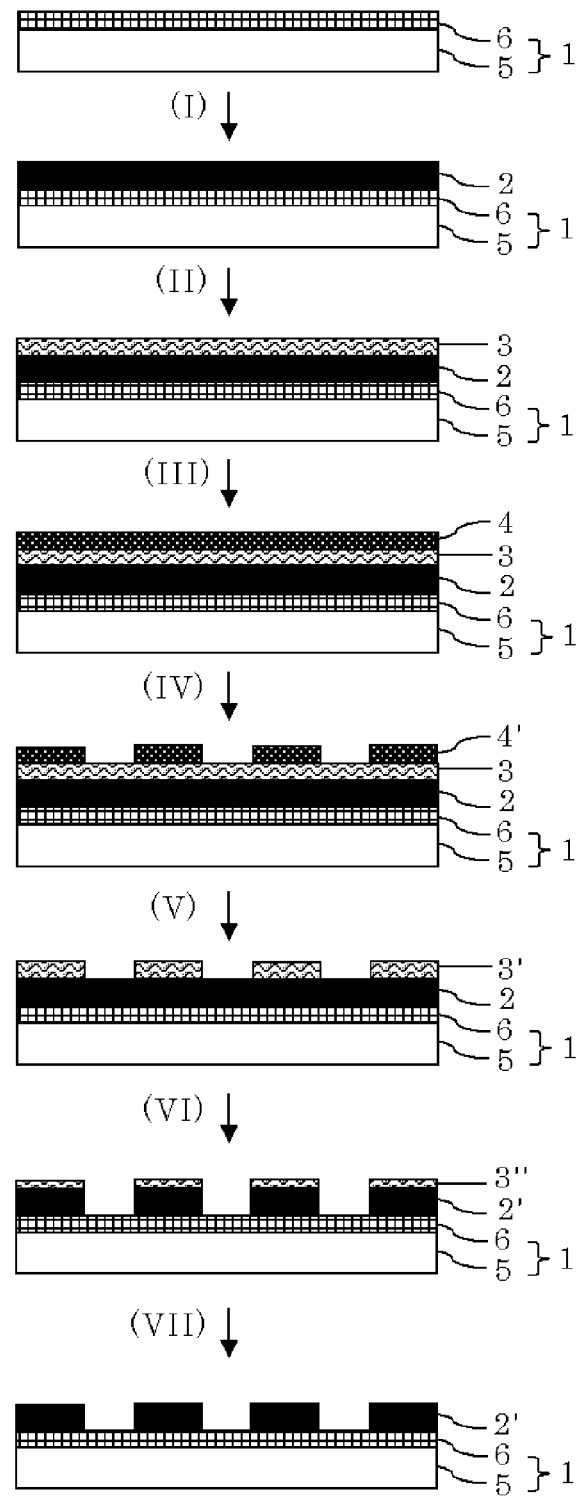

PATTERNING PROCESS USING A BORON PHOSPHORUS SILICON GLASS FILM

BACKGROUND OF THE INVENTION

Field of the Invention

The present invention relates to a patterning process using a BPSG (Boron Phosphorus Silicon Glass) film as a resist under layer film in the multilayer resist method.

Description of the Related Art

In 1980s, photo-exposure using a g-beam (436 nm) or an i-beam (365 nm) of a mercury lamp as a light source had been widely used in the resist patterning. As a means for further finer patterning, shifting to a shorter wavelength of the exposure light was assumed to be effective, so that, in mass production process after the DRAM (Dynamic Random Access Memory) with 64 MB (work size of 0.25 μm or less) in 1990s, a KrF excimer laser (248 nm), a shorter wavelength than the i-beam (365 nm), had been used in place of the i-beam as the exposure light source.

However, in production of DRAMs with integration of 256 MB and 1 GB or higher which require further finer process technologies (work size of 0.2 μm or less), a light source with further short wavelength is required, and thus, a photolithography using an ArF excimer laser (193 nm) has been investigated seriously since about a decade ago. At first, the ArF lithography was planned to be applied to manufacturing of a device starting from a 180 nm-node device, but the life of the KrF excimer lithography was prolonged to mass production of the 130 nm-node device; and thus, a full-fledged application of the ArF lithography started from the 90 nm-node.

Further, mass production of the 65 nm-node device is now underway by combining it with a lens having an increased numerical aperture (NA) till 0.9. Further shortening of wavelength of the exposure light is progressing for the next 45 nm-node device; and the $F_2$ lithography with 157 nm wavelength became a candidate for it. However, there are many problems in the $F_2$ lithography: cost-up of a scanner due to use of the large quantities of the expensive $CaF_2$ single crystal for a projection lens; extremely poor durability of a soft pellicle, which leads to change of an optical system due to introduction of a hard pellicle; decrease in etching resistance of a resist film, and so forth. Because of these problems, development of the $F_2$ lithography was suspended, and the ArF immersion lithography was introduced. In the ArF immersion lithography, water having refractive index of 1.44 is introduced between a projection lens and a wafer by a partial fill method thereby enabling high speed scanning; and thus, mass production of the 45 nm-node device is now underway by using a lens with a NA class of 1.3.

For the 32 nm-node lithography technology, which is the next fine processing technology, lithography with a Extreme-ultraviolet beam (EUV) of 13.5 nm wavelength is considered to be a candidate. Problems to be solved in the EUV lithography are to obtain a higher output power of the laser, a higher sensitivity of the resist film, a higher resolution power, a lower line edge roughness (LER), a non-defect MoSi laminate mask, a lower aberration of the reflective mirror, and so forth; and thus, there are innumerable problems to be solved. Development of the immersion lithography with a high refractive index, another candidate for the 32 nm-node, was suspended, because transmittance of LUAG, a candidate for a high refractive index lens, is low, and refractive index of the liquid could not reach an aimed value of 1.8. As mentioned above, in the photo-exposure used as a general technology, resolution power based on the wavelength of a light source is approaching to its inherent limit.

Accordingly, development of a fine processing technology for obtaining a work size exceeding a limiting resolution of an existing ArF-immersion exposure technology has been promoted. As a technology thereof, double patterning technology is being proposed. Specifically, the double patterning technology is a method (method (1)) for forming a first photoresist pattern by first exposure and development with an interval rate of a line to a space of 1:3; processing an under layer hard mask by dry etching; laying another hard mask thereon; forming a second line pattern by second exposure and development of a photoresist film at a space portion obtained by the first exposure; processing the hard mask by dry etching; to form the first pattern and the second pattern alternately. By this method, it is possible that forming a line and space pattern whose pitch is half that of an exposure pattern.

Also, there is another method (method (2)) for forming a first photoresist pattern by first exposure and development with an interval rate of a line to a space of 3:1; processing an under layer hard mask by dry etching; forming a pattern on a remaining portion of the hard mask by applying a photoresist film on the under layer hard mask and second exposure; and processing the hard mask by dry etching with the pattern as a mask. In both methods, the hard mask is processed by dry etching twice, and a pattern whose pitch is half that of an exposure pattern can be formed. In the method (1), the hard mask has to be formed twice. On the other hand, in the method (2), the hard mask has to be formed once, but a trench pattern which is more difficult to resolve than a line pattern has to be formed.

Another method (method (3)) proposed is a method for forming a line pattern with a positive resist film in X direction by using a dipole light; curing a resist pattern; applying a resist composition thereon again; exposing a line pattern in Y direction by using a dipole light, to form a hole pattern from a gap of a grid-like line pattern (Non-Patent Document 1). Moreover, a method for halving a pitch with one-time pattern exposure by using spacer technology in which a resist pattern, an organic hard mask or a polysilicon film having a transferred pattern is regarded as a core pattern, and the core pattern is removed by using dry etching etc., after forming a silicon oxide film around the core pattern at a low temperature, is being proposed.

Accordingly, since finer processing is difficult to achieve only by using a photoresist film, a finer patterning process cannot readily be introduced without using a hard mask formed under the resist film. Under the circumstances, multilayer resist method is known as a method for using a hard mask as a resist under layer film. The method is that a middle layer film (e.g. a silicon-containing resist under layer film), whose etching selectivity is different from a photoresist film (i.e. a resist upper layer film), is formed between the resist upper layer film and a substrate to be processed; a pattern is formed to the resist upper layer film; then the pattern is transferred to the resist under layer film by dry etching using the resist upper layer film pattern as a dry etching mask; and further the pattern is transferred to the substrate to be processed or a core film of the spacer process by dry etching using the resist under layer film as a dry etching mask.

A composition for forming a silicon-containing resist under layer film as disclosed in Patent Document 1 or Patent Document 2, etc., has been proposed for a patterning process by the multilayer resist method in a manufacturing process of a semiconductor apparatus which exceeds the limit of resolution of ArF liquid immersion lithography in recent years.

In addition, in the cutting-edge semiconductor apparatus, technologies such as three-dimensional transistor and through interconnection, etc., have been used to improve properties of the semiconductor apparatus. In a patterning process for forming such a structure in the semiconductor apparatus, patterning by the multilayer resist method has also been carried out. In such a patterning, after pattern formation, there are cases where the process for removing the silicon-containing resist under layer film remaining on the pattern without causing damage to the pattern is required. If the removal is insufficient, more specifically, if the wafer is subjected to a subsequent manufacturing process while an object to be cleaned (i.e. a residue of the silicon-containing resist under layer film) remains thereon, yield of device production is surely lowered.

Accordingly, as a device progresses toward miniaturization, a higher cleaning degree is required in the cleaning process. However, main constitutional elements of the conventional silicon-containing resist under layer film and main constitutional elements of the semiconductor apparatus substrate are both silicon in many cases. Therefore, if one wishes to selectively remove the resist under layer film by dry etching, wet etching using a hydrofluoric acid type peeling solution, etc., there is a problem that the semiconductor apparatus substrate is damaged because constitutional components of the resist under layer film are similar to that of the semiconductor apparatus substrate. In addition, there is another problem that if a silicon-containing resist under layer film is used as a mask to process an under layer film just under the same by dry etching, the silicon-containing resist under layer film is modified by the dry etching, thereby hardly removed by subsequent wet etching.

PRIOR ART DOCUMENTS

Patent Documents

Patent Document 1: Japanese Patent Laid-Open Publication No. 2007-302873
Patent Document 2: Japanese Patent Laid-Open Publication No. 2010-262230
Non-Patent Document 1: Proc. SPIE Vol. 5377 p 255 (2004)

SUMMARY OF THE INVENTION

The present invention has been done in view of the above-mentioned problems, and an object thereof is to provide a patterning process in which a fine mask pattern can be formed on a substrate to be processed by the multilayer resist method, and a residue of the resist under layer film on the mask pattern can be removed cleanly enough to process the substrate to be processed without causing damage to the substrate to be processed and the under layer film.

To solve the above-mentioned problems, the present invention provides a patterning process of forming a mask pattern on a substrate to be processed for use in processing the substrate to be processed, comprising the steps of:
(I) forming an under layer film consisting of an organic under layer film or a CVD hard mask on the substrate to be processed;
(II) forming a BPSG film on the under layer film by using a composition for forming a coating type BPSG film including a base polymer and an organic compound with a content of 25 parts by mass or more of the organic compound with respect to 100 parts by mass of the base polymer, the base polymer having a silicon containing unit, a boron containing unit and a phosphorus containing unit with a total content of the boron containing unit and the phosphorus containing unit being 10 mol % or more, the organic compound having two or more hydroxyl groups or carboxyl groups per one molecule;
(III) forming a resist upper layer film on the BPSG film;
(IV) forming a pattern to the resist upper layer film;
(V) transferring the pattern to the BPSG film by dry etching using the resist upper layer film having the formed pattern as a mask;
(VI) transferring the pattern to the under layer film by dry etching using a gas including $N_2$, $H_2$ or both and the BPSG film having the formed pattern as a mask; and
(VII) removing a residue of the BPSG film remaining on the under layer film having the formed pattern by wet etching using an ammonia aqueous solution containing hydrogen peroxide; to form a mask pattern for use in processing the substrate to be processed.

In this manner, a fine mask pattern (i.e. an under layer film pattern) can be formed on the substrate to be processed by the multilayer resist method in which the BPSG film is used as the resist under layer film. Moreover, by using the above-mentioned BPSG film, the residue of the BPSG film on the under layer film pattern can be easily removed by wet etching using an ammonia aqueous solution containing hydrogen peroxide which does not cause damage to the substrate to be processed and the under layer film. Therefore, the under layer film pattern after wet etching can be made clean enough to process the substrate to be processed. Furthermore, using a gas including $N_2$, $H_2$ or both of them in dry etching for transferring the pattern to the under layer film, can suppress damage to the substrate to be processed.

At this time, it is preferred that in the step (VII), the residue of the BPSG film remaining on the under layer film having the formed pattern is removed such that a silicon content on the under layer film is 5 atomic percent or less when X-ray photoelectron spectroscopy is performed on the under layer film.

In this manner, the residue of the BPSG film on the under layer film pattern can more reliably removed. Therefore, the mask pattern can be more reliably made clean enough to process the substrate to be processed.

At this time, the substrate to be processed may be a material in which any of a metal film, an amorphous metal film, a metal carbide film, a metal oxide film, a metal nitride film, a metal oxycarbide film and a metal oxynitride film is formed on a semiconductor apparatus substrate on which a part or whole of semiconductor circuits has/have been formed, as a layer to be processed.

Further, the metal constitutes the substrate to be processed may comprise silicon, titanium, tungsten, hafnium, zirconium, chromium, germanium, copper, aluminum, indium, gallium, arsenic, palladium, iron, tantalum, iridium, molybdenum, or an alloy thereof.

The patterning process of the present invention can form a pattern by processing the above substrate to be processed.

Further, the pattern formation of the resist upper layer film is preferably carried out by any of a lithography method using light with a wavelength of 300 nm or less or EUV light, an electron beam direct drawing method, a directed self-assembly method and a nano-imprinting lithography method.

By using these methods, a fine pattern can be formed to the resist upper layer film.

As mentioned above, the patterning process of the present invention can form a fine mask pattern (i.e. an under layer film pattern) on the substrate- to be processed by the multilayer resist method using the BPSG film as the resist under layer film. Moreover, since the BPSG film shows good adhesiveness to the resist upper layer film pattern, no collapse of the pattern is caused even if a fine pattern is formed. Moreover, the BPSG film shows high dry etching selectivity to both of the resist upper layer film pattern formed over the BPSG film and the under layer film (i.e. the organic under layer film or the CVD hard mask) formed under the BPSG film, so that the resist upper layer film pattern can be transferred to the under layer film by dry etching without generating a difference in size conversion. Moreover, by using the above-mentioned BPSG film as the resist under layer film, a residue of the BPSG film on the under layer film pattern can be easily removed by wet etching using an ammonia aqueous solution containing hydrogen peroxide, which does not cause damage to the substrate to be processed and the under layer film. Therefore, the under layer film pattern after wet etching can be made clean enough to process the substrate to be processed, whereby yield of device production can be improved. Furthermore, using a gas including $N_2$, $H_2$ or both in dry etching for transferring the pattern to the under layer film, can suppress damage to the substrate to be processed.

BRIEF DESCRIPTION OF THE DRAWING

FIG. 1 is a schematic illustration of a patterning process of forming a mask pattern on a substrate according to an embodiment.

DETAILED DESCRIPTION OF THE PREFERRED EMBODIMENTS

As mentioned above, in manufacturing process of three-dimensional transistor or through interconnection, etc., which are required in the cutting-edge semiconductor apparatus, the patterning process using a silicon-containing resist under layer film has been used. In such a patterning, there is a problem that if one wishes to remove a residue of the resist under layer film by dry etching or wet etching using a hydrofluoric acid type peeling solution after processing the under layer film, the substrate is damaged. Moreover, there is also a problem that the silicon-containing resist under layer film is modified by dry etching, thereby hardly removed by subsequent wet etching. In addition to this, there is another problem that if the residue is not removed sufficiently, yield of device production is lowered, therefore a subsequent substrate processing cannot be performed.

Thus, it has been desired to develop a patterning process in which a fine mask pattern can be formed on a substrate to be processed by the multilayer resist method, and a residue of the resist under layer film on the mask pattern can be removed cleanly enough to process the substrate to be processed by wet etching using an ammonia aqueous solution containing hydrogen peroxide called SC (Standard Clean) 1, which has been generally used in the semiconductor manufacturing process and does not cause damage to the substrate to be processed and the under layer film.

The present inventors have intensively studied to solve the above-mentioned problems, and as a result, they have found that a fine mask pattern can be formed on the under layer film by using a BPSG film formed from a specific composition for forming a coating type BPSG film as the resist under layer film in the multilayer resist method, and such a BPSG film can be easily removed by SC1 even after being modified by a dry etching process of the under layer film, thereby bringing the invention to completion.

That is, as shown in FIG. 1, for example, the present invention is a patterning process of forming a mask pattern on a substrate 1 to be processed for use in processing the substrate 1 to be processed, comprising the steps of:

(I) forming an under layer film 2 consisting of an organic under layer film or a CVD hard mask on the substrate 1 to be processed;

(II) forming a BPSG film 3 on the under layer film 2 by using a composition for forming a coating type BPSG film including a base polymer and an organic compound with a content of 25 parts by mass or more of the organic compound with respect to 100 parts by mass of the base polymer, the base polymer having a silicon containing unit, a boron containing unit and a phosphorus containing unit with a total content of the boron containing unit and the phosphorus containing unit being 10 mol% or more, the organic compound having two or more hydroxyl groups or carboxyl groups per one molecule;

(III) forming a resist upper layer film 4 on the BPSG film 3;

(IV) forming a pattern to the resist upper layer film 4;

(V) transferring the pattern to the BPSG film 3 by dry etching using the resist upper layer film 4' having the formed pattern as a mask;

(VI) transferring the pattern to the under layer film 2 by dry etching using a gas including $N_2$, $H_2$ or both and the BPSG film 3' having the formed pattern as a mask; and (VII) removing a residue 3" of the BPSG film remaining on the under layer film 2' having the formed pattern by wet etching using an ammonia aqueous solution containing hydrogen peroxide; to form a mask pattern for use in processing the substrate 1 to be processed.

Hereinafter, the present invention will be described in detail, but the present invention is not limited thereto.

<(I) Step of Forming an Under Layer Film on the Substrate to be Processed>

In the patterning process of the present invention, first, as step (I), an under layer film consisting of an organic under layer film or a CVD hard mask is formed on the substrate to be processed.

[Substrate to be processed]

The substrate to be processed used in the patterning process of the present invention is not particularly limited, but may be a material in which any of a metal film, an amorphous metal film, a metal carbide film, a metal oxide film, a metal nitride film, a metal oxycarbide film and a metal oxynitride film is formed on a semiconductor apparatus substrate 5 on which a part or whole of semiconductor circuits has/have been formed, as a layer 6 to be processed, as shown in FIG. 1, for example.

As the semiconductor apparatus substrate, silicon substrate is generally used. However, the substrate is not limited to this and may be Si, an amorphous silicon (α—Si), p-Si, $SiO_2$, SiN, SiON, W, TiN, Al, or the like. The substrate may be a material different from the layer to be processed.

Examples of the metal constitutes the substrate to be processed include silicon, titanium, tungsten, hafnium, zirconium, chromium, germanium, copper, aluminum, indium, gallium, arsenic, palladium, iron, tantalum, iridium, molybdenum, or an alloy thereof. The layer to be processed may be made of Si, $SiO_2$, SiN, SiON, SiOC, p—Si, α—Si, TiN, WSi, BPSG, SOG, Cr, CrO, CrON, MoSi, W, Al, Cu, Al—Si, or the like; various low dielectric constant (low-k)

films, or etching stopper films. The thickness of the layer is preferably in the range of 50 to 10,000 nm, and more preferably 100 to 5,000 nm.

[Under Layer Film]

In the step (I) of the patterning process of the present invention, an under layer film consisting of an organic under layer film or a CVD hard mask is formed on the above-mentioned substrate to be processed or the like. The organic under layer film can be formed, for example, from a coating type organic under layer film material by using the spin coating method, etc. The organic under layer film is not particularly limited, but may be a known under layer film for use in the multilayer resist method such as a three-layer resist method and a two-layer resist method which uses a silicon-containing resist upper layer film. Such a known under layer film contains a resin synthesized by addition polymerization or polycondensation. Illustrative examples thereof include those containing a resin such as a 4,4'-(9-fluorenylidene)bisphenol novolac resin described in Japanese Patent No. 4355943 and a novolac resin obtained by condensation of catechol, resorcinol, 4,4'-biphenol, 1,5-dihydroxy naphthol, 1,6-dihydroxy naphthol, 1,7-dihydroxy naphthol, 2,6-dihydroxy naphthol, 2,7-dihydroxy naphthol, etc., with formaldehyde using an acid catalyst or an alkali catalyst. Also, if heat resistance needs to be improved over a normal novolac resin, a polycyclic skeleton such as a 6,6'-(9-fluorenylidene)-di(2-naphthol) novolac resin can be introduced, and a polyimide resin can be selected.

Particularly preferable examples of the resin for use in the organic under layer film include those containing a naphthalene skeleton. For example, a resin obtained by condensation of 1,5-dihydroxy naphthol, 1,6-dihydroxy naphthol, 1,7-dihydroxy naphthol, 2,6-dihydroxy naphthol, 2,7-dihydroxy naphthol, etc., with formaldehyde or dicyclopentadiene, and a 6,6'-(9-fluorenylidene)-di(2-naphthol) novolac resin can be mentioned.

The organic under layer film can be formed on the substrate to be processed, for example, by the spin coating method using a composition solution, as well as a later-explained resist upper layer film, etc. After the organic under layer film is formed by spin coating method, etc., it is desired to be baked for evaporating an organic solvent. The baking temperature is preferably in the range of 80 to 600° C., and the baking time is preferably in the range of 10 to 300 seconds.

Also, the CVD hard mask can be formed by the CVD method using an organic hard mask material mainly consisting of carbon, for example. The CVD hard mask is not particularly limited, but may be an amorphous carbon film, etc.

The thickness of the under layer film is not particularly restricted and depending on etching processing conditions, but it is preferably 5 nm or more, particularly preferably 20 nm or more and less than 50,000 nm.

This is not a limitation, but if the pattern formation is carried out by photo-exposure, it is preferable to use the under layer film which shows a sufficient antireflection function. By using such a under layer film, the pattern formed to the resist upper layer film can be transferred to the substrate to be processed without generating the difference in size conversion.

<(II) Step of Forming a BPSG Film on the Under Layer Film>

In the patterning process of the present invention, next, as step (II), a BPSG film is formed on the under layer film formed in the step (I). At this time, in the patterning process of the present invention, the BPSG film is formed by using a composition for forming a coating type BPSG film including a base polymer having a silicon containing unit, a boron containing unit and a phosphorus containing unit with a total content of the boron containing unit and the phosphorus containing unit being 10 mol % or more, and an organic compound having two or more hydroxyl groups or carboxyl groups per one molecule, with a content of 25 parts by mass or more of the organic compound with respect to 100 parts by mass of the base polymer.

[BPSG Film]

It is preferred that the composition for forming a coating type BPSG film used in the patterning process of the present invention contains (A) a base polymer and (B) an organic compound having two or more hydroxyl groups or carboxyl groups per one molecule, as essential components, and further contains (C) a silicon-containing compound, if necessary.

Hereinafter, each components will be described in detail.

(A) Base Polymer

The base polymer contained in the composition for forming a coating type BPSG film used in the patterning process of the present invention is a polymer having a silicon containing unit, a boron containing unit and a phosphorus containing unit with a total content of the boron containing unit and the phosphorus containing unit being 10 mol % or more.

Examples of the polymer include a polymer containing one or more structures comprising a silicic acid represented by the following general formula (1) as a skeletal structure, one or more structures comprising a phosphoric acid represented by the following general formula (2) as a skeletal structure and one or more structures comprising a boric acid represented by the following general formula (3) as a skeletal structure,

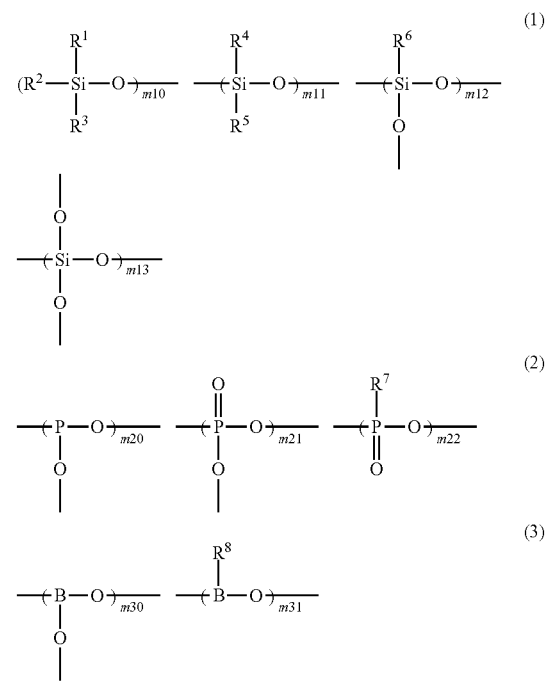

wherein, $R^1$, $R^2$, $R^3$, $R^4$, $R^5$, $R^6$, $R^7$ and $R^8$ each represent a hydrogen atom or an organic group having 1 to 30 carbon atoms, wherein a hydrogen atom(s) in the organic group may be substituted by a halogen atom(s), and a fluorine atom and a chlorine atom are preferable as the halogen atom; m10, m11, m12 and m13 each represent a molar fraction in the structure comprising a silicic acid as a skeletal structure, and satisfy m10+m11+m12+m13=1, 0≤m10≤0.3, 0≤m11≤0.5, 0≤m12≤0.7, and 0<m13≤1; m20, m21 and m22 each represent a molar fraction in the structure comprising a phosphoric acid as a skeletal structure, and satisfy m20+m21+m22=1, 0≤m20≤1, 0≤m21≤1, and 0≤m22<1; m30 and m31 each represent a molar fraction in the structure comprising a boric acid as a skeletal structure, and satisfy m30+m31=1, 0≤m30≤1, and 0≤m31≤1.

m10, m11, m12 and m13 in the general formula (1) each represent a molar fraction in the structure comprising a silicic acid as a skeletal structure, and satisfy m10+m11+m12+m13=1, 0≤m10≤0.3, 0≤m11≤0.5, 0≤m12≤0.7, and 0<m13≤1.

$SiO_2$ is an essential unit in the structure comprising a silicic acid as a skeletal structure. When the respective units satisfy the above ratio, the composition for forming a coating type BPSG film has good dry etching resistance, pattern adhesiveness and wet etching property with good balance.

m20, m21 and m22 in the general formula (2) each represent a molar fraction in the structure comprising a phosphoric acid as a skeletal structure, and satisfy m20+m21+m22=1, 0≤m20≤1, 0≤m21≤1, and 0≤m22<1.

$PO_{1.5}$ or $PO_{2.5}$ is an essential unit in the structure comprising a phosphoric acid as a skeletal structure. When the respective units satisfy the above ratio, the composition for forming a coating type BPSG film has good dry etching resistance, pattern adhesiveness and wet etching property with good balance.

m30 and m31 in the general formula (3) each represent a molar fraction in the structure comprising a boric acid as a skeletal structure, and satisfy m30+m31=1, 0≤m30≤1, and 0≤m31≤1.

The structure comprising a boric acid as a skeletal structure may contain either one of the above units alone, or both of them.

In the present invention, the total content of the structures comprising a boric acid as a skeletal structure (i.e. the boron containing unit) and the structures comprising a phosphoric acid as a skeletal structure (i.e. the phosphorus containing unit) is 10 mol % or more. This enables a BPSG film which is not only excellent in adhesiveness in a fine pattern but also easily removable by wet etching using SC1 even after the dry etching process of the under layer film to be obtained. The total content of the boron containing unit and the phosphorus containing unit is preferably in the range of 10 mol % to 50 mol %, and more preferably 15 mol % to 30 mol %.

Also, the above-mentioned base polymer can be obtained, for example, by hydrolysis, condensation or hydrolysis condensation of a mixture containing one or more silicon compounds represented by the following general formulae (A-1-1) to (A-1-4), one or more phosphorus compounds represented by the following general formulae (A-2-1) to (A-2-6) and one or more boron compounds represented by the following general formulae (A-3-1) to (A-3-3), $R^1R^2R^3SiOR$ (A-1-1)

$R^4R^5Si(OR)_2$ (A-1-2)

$R^6Si(OR)_3$ (A-1-3)

$Si(OR)_4$ (A-1-4)

wherein, R represents a hydrocarbon group having 1 to 6 carbon atoms; and $R^1$, $R^2$, $R^3$, $R^4$, $R^5$ and $R^6$ have the same meanings as defined above, $PX_3$ (A-2-1)

$POX_3$ (A-2-2)

$P_2O_5$ (A-2-3)

$H(HPO_3)_aOH$ (A-2-4)

$R^7PX_2$ (A-2-5)

$R^7POX_2$ (A-2-6)

wherein, $R^7$ has the same meaning as defined above; X represents a halogen atom, a hydroxyl group or an alkoxy group having 1 to 6 carbon atoms; and "a" is an integer of 1 or more, $BX_3$ (A-3-1)

$B_2O_3$ (A-3-2)

$R^8BX_2$ (A-3-3)

wherein, $R^8$ and X have the same meanings as defined above.

[Silicon Compound]

The silicon compound which can be used as a starting material of Component (A) may be mentioned a material represented by the following general formula (A-1-1), $R^1R^2R^3SiOR$ (A-1-1)

wherein, R represents a hydrocarbon group having 1 to 6 carbon atoms; and $R^1$, $R^2$ and $R^3$ each represent a hydrogen atom or an organic group having 1 to 30 carbon atoms, wherein a hydrogen atom(s) in the organic group may be substituted by a halogen atom(s).

Preferable examples of the silicon compound represented by the general formula (A-1-1) include trimethyl methoxy silane, trimethyl ethoxy silane, dimethyl ethyl methoxy silane, dimethyl ethyl ethoxy silane, dimethyl phenyl methoxy silane, dimethyl phenyl ethoxy silane, dimethyl benzyl methoxy silane, dimethyl benzyl ethoxy silane, dimethyl phenethyl methoxy silane, dimethyl phenethyl ethoxy silane, etc.

The silicon compound which can be used as a starting material of Component (A) may be mentioned a material represented by the following general formula (A-1-2), $R^4R^5Si(OR)_2$ (A-1-2)

wherein, R represents a hydrocarbon group having 1 to 6 carbon atoms; and $R^4$ and $R^5$ each represent a hydrogen atom or an organic group having 1 to 30 carbon atoms, wherein a hydrogen atom(s) in the organic group may be substituted by a halogen atom(s).

Preferable examples of the silicon compound represented by the general formula (A-1-2) include dimethyl dimethoxy silane, dimethyl diethoxy silane, methyl ethyl dimethoxy silane, methyl ethyl diethoxy silane, dimethyl dipropoxy silane, dimethyl diisopropoxy silane, diethyl dimethoxy silane, diethyl diethoxy silane, diethyl dipropoxy silane, diethyl diisopropoxy silane, dipropyl dimethoxy silane, dipropyl diethoxy silane, dipropyl dipropoxy silane, dipropyl diisopropoxy silane, diisopropyl dimethoxy silane, diisopropyl diethoxy silane, diisopropyl dipropoxy silane, diisopropyl diisopropoxy silane, dibutyl dimethoxy silane, dibutyl diethoxy silane, dibutyl dipropoxy silane, dibutyl diisopropoxy silane, di-sec-butyl dimethoxy silane, di-secbutyl diethoxy silane, di-sec-butyl dipropoxy silane, di-sec-butyl diisopropoxy silane, di-tert-butyl dimethoxy silane, di-tert-butyl diethoxy silane, di-tert-butyl dipropoxy silane, di-tert-butyl diisopropoxy silane, dicyclopropyl dimethoxy silane, dicyclopropyl diethoxy silane, dicyclopropyl dipropoxy silane, dicyclopropyl diisopropoxy silane, dicyclobutyl dimethoxy silane, dicyclobutyl diethoxy silane, dicyclobutyl dipropoxy silane, dicyclobutyl diisopropoxy silane, dicyclopentyl dimethoxy silane, dicyclopentyl diethoxy silane, dicyclopentyl dipropoxy silane, dicyclopentyl diisopropoxy silane, dicyclohexyl dimethoxy silane, dicyclohexyl diethoxy silane, dicyclohexyl dipropoxy silane, dicyclohexyl diisopropoxy silane, dicyclohexenyl dimethoxy silane, dicyclohexenyl diethoxy silane, dicyclohexenyl dipropoxy silane, dicyclohexenyl diisopropoxy silane, dicyclohexenylethyl dimethoxy silane, dicyclohexenylethyl diethoxy silane, dicyclohexenylethyl dipropoxy silane, dicyclohexenylethyl diisopropoxy silane, dicyclooctyl dimethoxy silane, dicyclooctyl diethoxy silane, dicyclooctyl dipropoxy silane, dicyclooctyl diisopropoxy silane, dicyclopentadienylpropyl dimethoxy silane, dicyclopentadienylpropyl diethoxy silane, dicyclopentadienylpropyl dipropoxy silane, dicyclopentadienylpropyl diisopropoxy silane, bis(bicycloheptenyl) dimethoxy silane, bis(bicycloheptenyl) diethoxy silane, bis(bicycloheptenyl) dipropoxy silane, bis(bicycloheptenyl) diisopropoxy silane, bis(bicycloheptyl) dimethoxy silane, bis(bicycloheptyl) diethoxy silane, bis(bicycloheptyl) dipropoxy silane, bis(bicycloheptyl) diisopropoxy silane, diadamantyl dimethoxy silane, diadamantyl diethoxy silane, diadamantyl dipropoxy silane, diadamantyl diisopropoxy silane, diphenyl dimethoxy silane, diphenyl diethoxy silane, methyl phenyl dimethoxy silane, methyl phenyl diethoxy silane, diphenyl dipropoxy silane, diphenyl diisopropoxy silane, etc.

The silicon compound which can be used as a starting material of Component (A) may be mentioned a material represented by the following general formula (A-1-3),

$$R^6Si(OR)_3 \quad (A\text{-}1\text{-}3)$$

wherein, R represents a hydrocarbon group having 1 to 6 carbon atoms; and $R^6$ represents a hydrogen atom or an organic group having 1 to 30 carbon atoms, wherein a hydrogen atom(s) in the organic group may be substituted by a halogen atom(s).

Preferable examples of the silicon compound represented by the general formula (A-1-3) include trimethoxy silane, triethoxy silane, tripropoxy silane, triisopropoxy silane, methyl trimethoxy silane, methyl triethoxy silane, methyl tripropoxy silane, methyl triisopropoxy silane, ethyl trimethoxy silane, ethyl triethoxy silane, ethyl tripropoxy silane, ethyl triisopropoxy silane, vinyl trimethoxy silane, vinyl triethoxy silane, vinyl tripropoxy silane, vinyl triisopropoxy silane, propyl trimethoxy silane, propyl triethoxy silane, propyl tripropoxy silane, propyl triisopropoxy silane, isopropyl trimethoxy silane, isopropyl triethoxy silane, isopropyl tripropoxy silane, isopropyl triisopropoxy silane, butyl trimethoxy silane, butyl triethoxy silane, butyl tripropoxy silane, butyl triisopropoxy silane, sec-butyl trimethoxy silane, sec-butyl triethoxy silane, sec-butyl tripropoxy silane, sec-butyl triisopropoxy silane, tert-butyl trimethoxy silane, tert-butyl triethoxy silane, tert-butyl tripropoxy silane, tert-butyl triisopropoxy silane, cyclopropyl trimethoxy silane, cyclopropyl triethoxy silane, cyclopropyl tripropoxy silane, cyclopropyl triisopropoxy silane, cyclobutyl trimethoxy silane, cyclobutyl triethoxy silane, cyclobutyl tripropoxy silane, cyclobutyl triisopropoxy silane, cyclopentyl trimethoxy silane, cyclopentyl triethoxy silane, cyclopentyl tripropoxy silane, cyclopentyl triisopropoxy silane, cyclohexyl trimethoxy silane, cyclohexyl triethoxy silane, cyclohexyl tripropoxy silane, cyclohexyl triisopropoxy silane, cyclohexenyl trimethoxy silane, cyclohexenyl triethoxy silane, cyclohexenyl tripropoxy silane, cyclohexenyl triisopropoxy silane, cyclohexenylethyl trimethoxy silane, cyclohexenylethyl triethoxy silane, cyclohexenylethyl tripropoxy silane, cyclohexenylethyl triisopropoxy silane, cyclooctyl trimethoxy silane, cyclooctyl triethoxy silane, cyclooctyl tripropoxy silane, cyclooctyl triisopropoxy silane, cyclopentadienylpropyl trimethoxy silane, cyclopentadienylpropyl triethoxy silane, cyclopentadienylpropyl tripropoxy silane, cyclopentadienylpropyl triisopropoxy silane, bicycloheptenyl trimethoxy silane, bicycloheptenyl triethoxy silane, bicycloheptenyl tripropoxy silane, bicycloheptenyl triisopropoxy silane, bicycloheptyl trimethoxy silane, bicycloheptyl triethoxy silane, bicycloheptyl tripropoxy silane, bicycloheptyl triisopropoxy silane, adamantyl trimethoxy silane, adamantyl triethoxy silane, adamantyl tripropoxy silane, adamantyl triisopropoxy silane, phenyl trimethoxy silane, phenyl triethoxy silane, phenyl tripropoxy silane, phenyl triisopropoxy silane, benzyl trimethoxy silane, benzyl triethoxy silane, benzyl tripropoxy silane, benzyl triisopropoxy silane, anisyl trimethoxy silane, anisyl triethoxy silane, anisyl tripropoxy silane, anisyl triisopropoxy silane, tolyl trimethoxy silane, tolyl triethoxy silane, tolyl tripropoxy silane, tolyl triisopropoxy silane, phenethyl trimethoxy silane, phenethyl triethoxy silane, phenethyl tripropoxy silane, phenethyl triisopropoxy silane, benzoyloxymethyl trimethoxy silane, benzoyloxymethyl triethoxy silane, benzoyloxymethyl tripropoxy silane, benzoyloxymethyl tributoxy silane, benzoyloxypropyl trimethoxy silane, benzoyloxypropyl triethoxy silane, benzoyloxypropyl tripropoxy silane, benzoyloxypropyl tributoxy silane, naphthyl trimethoxy silane, naphthyl triethoxy silane, naphthyl tripropoxy silane, naphthyl triisopropoxy silane, etc.

Moreover, preferable examples of the silicon compound wherein a hydrogen atom(s) in the organic group represented by $R^1$, $R^2$, $R^3$, $R^4$, $R^5$ and $R^6$ is/are substituted by a halogen atom(s) are shown below.

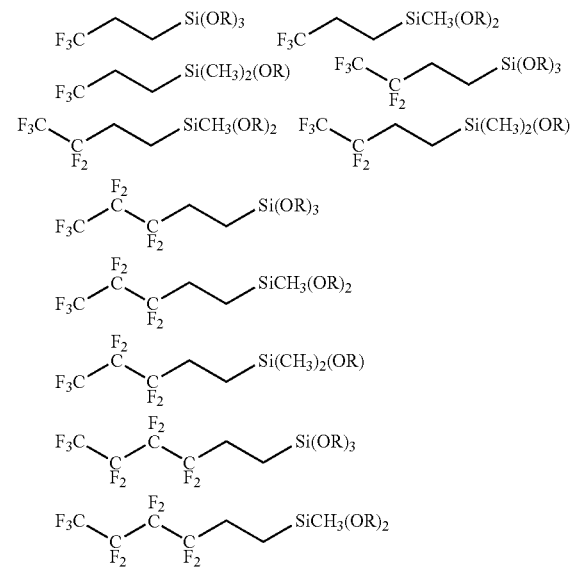

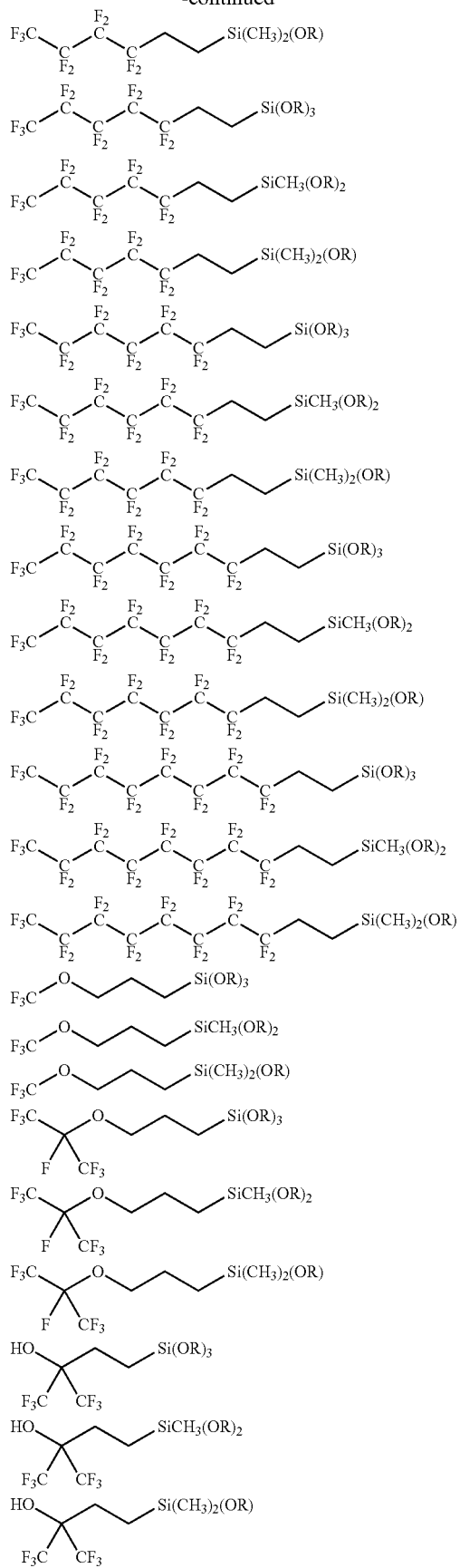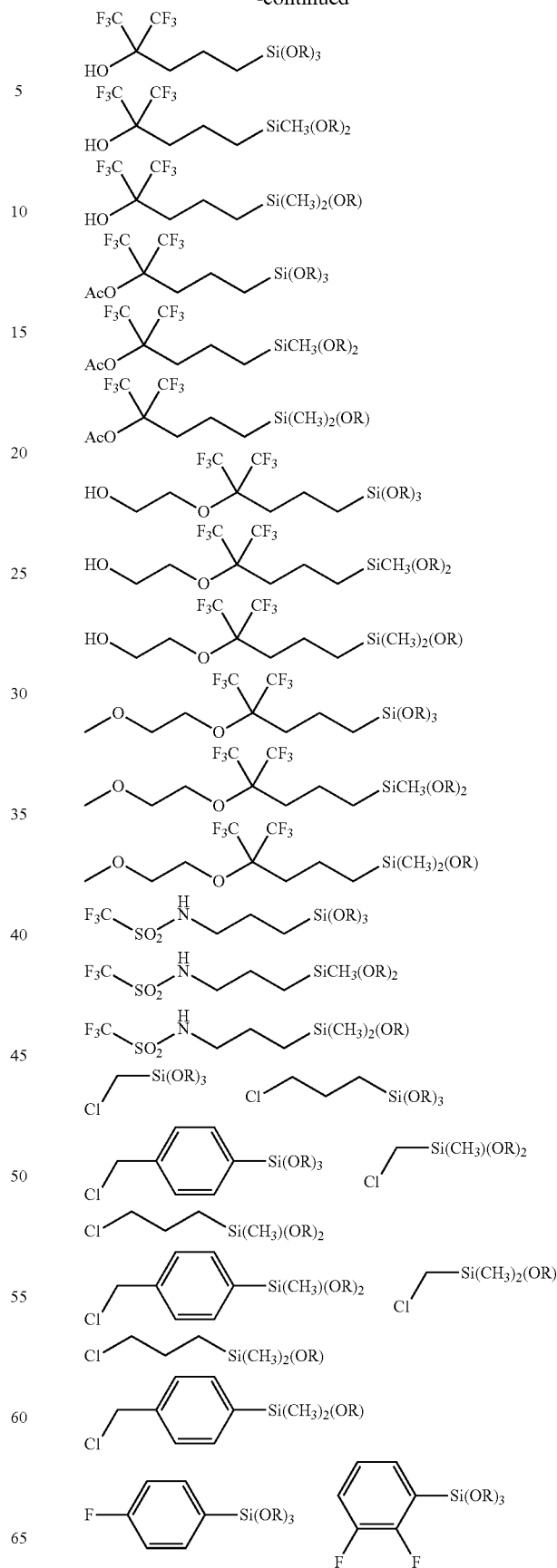

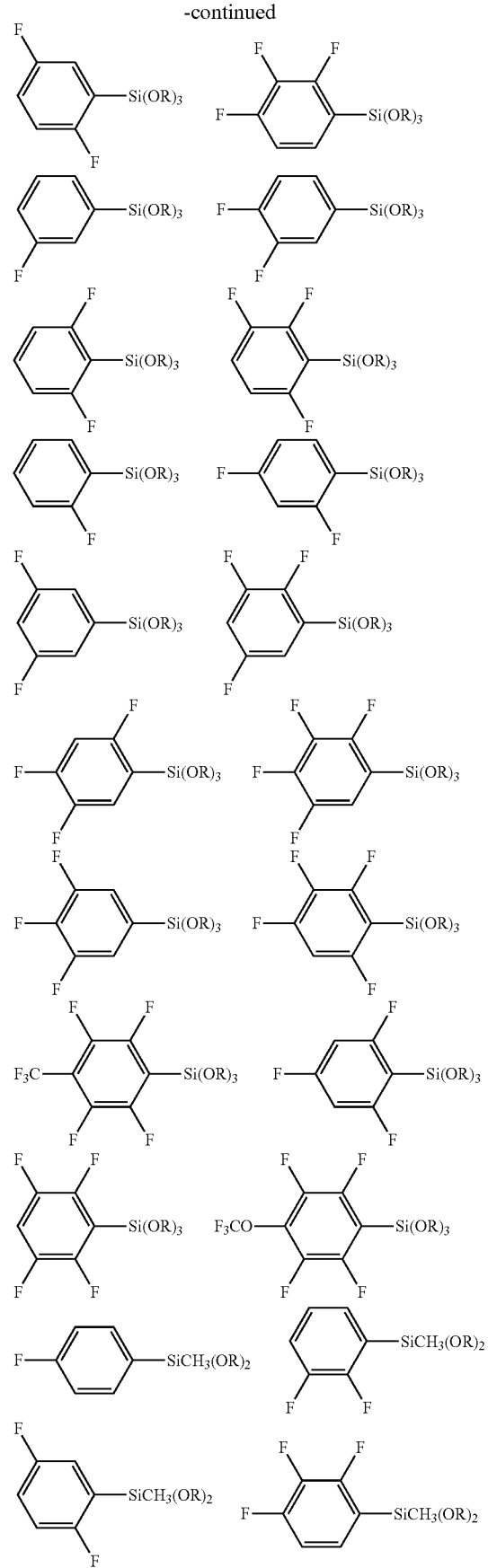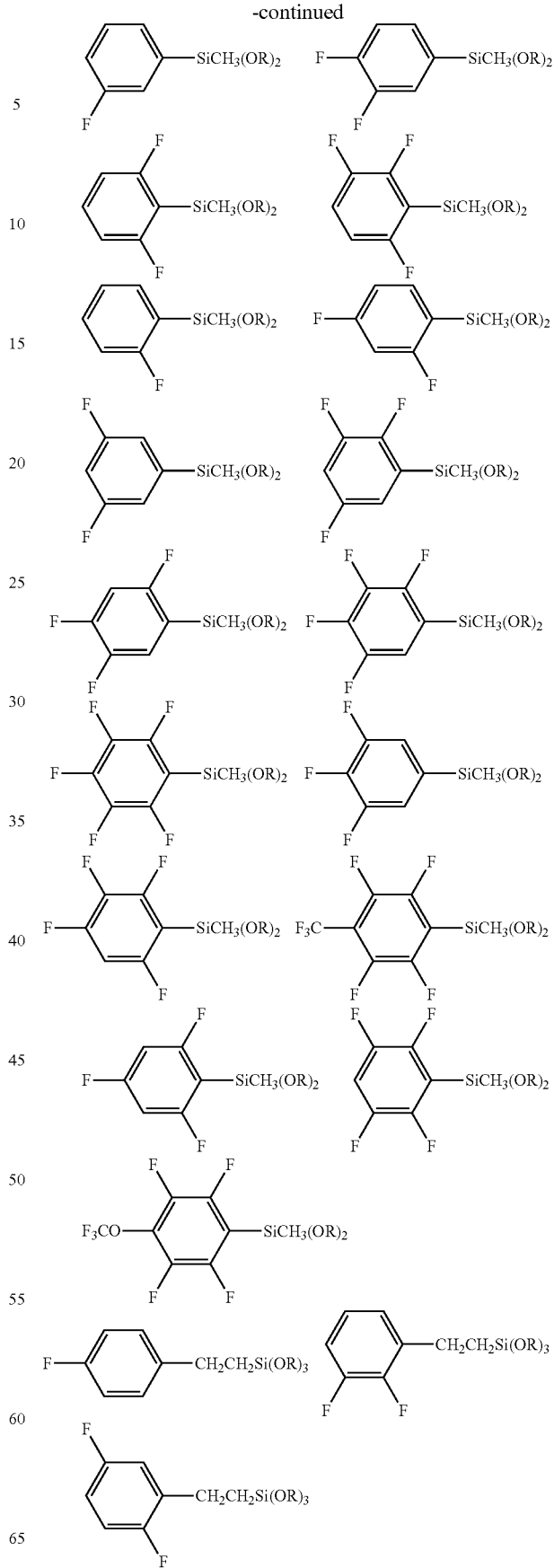

-continued
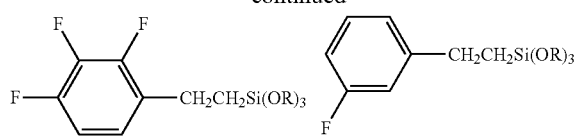
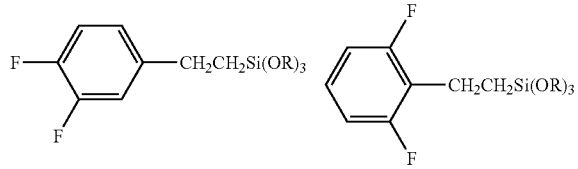
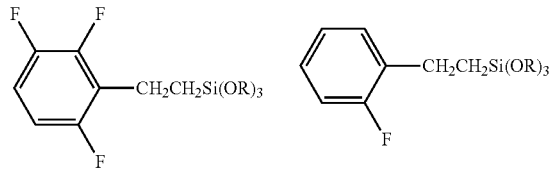
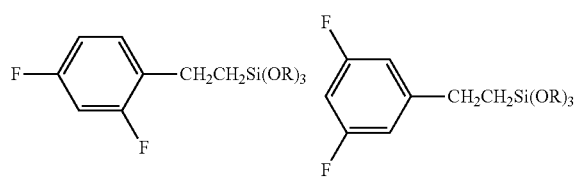
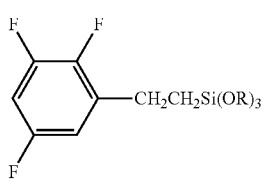
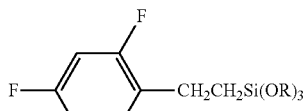
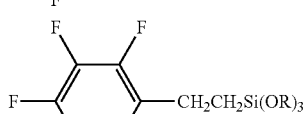
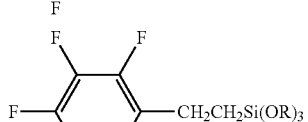
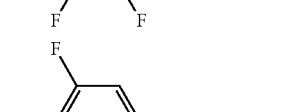
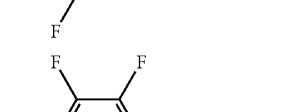
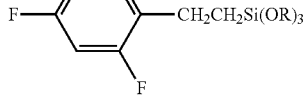
-continued
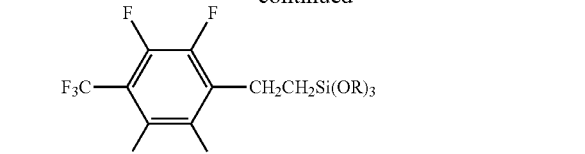
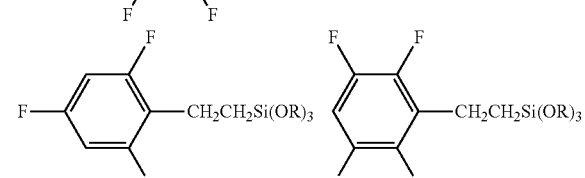
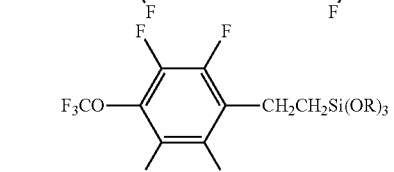
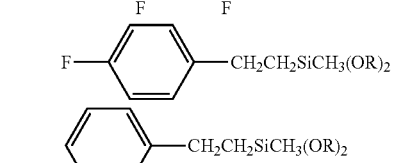
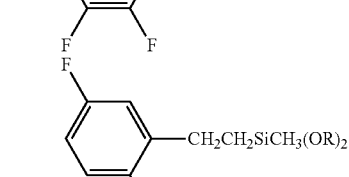
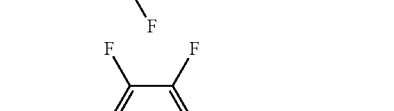
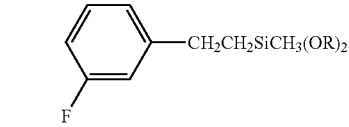
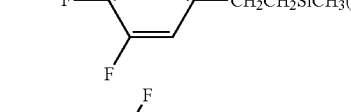
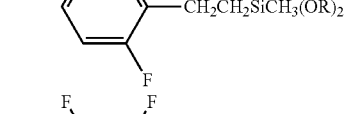
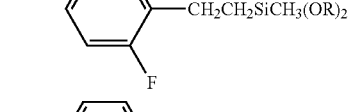
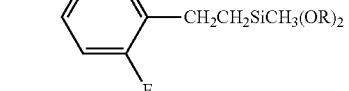

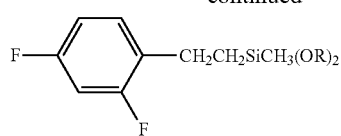
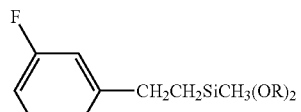
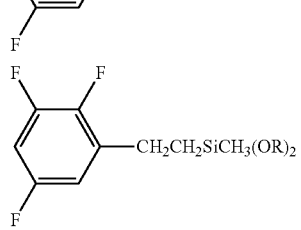
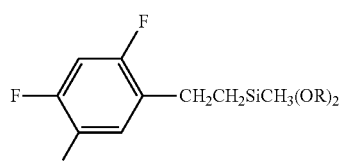
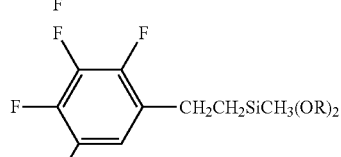
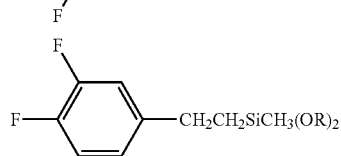
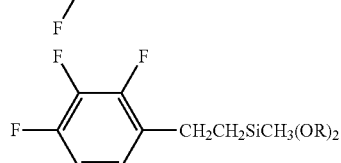
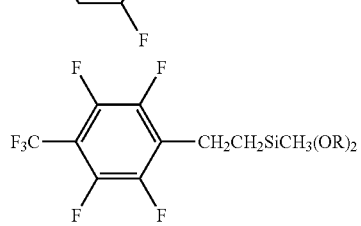
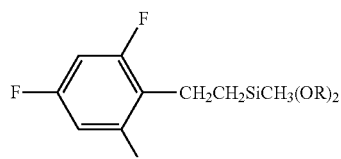
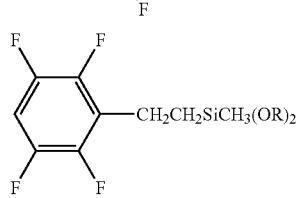
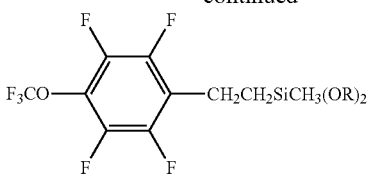
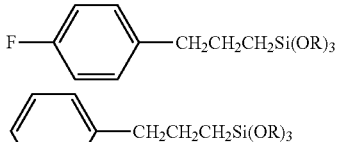
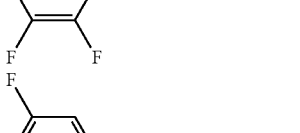
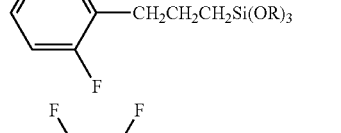
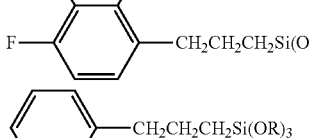
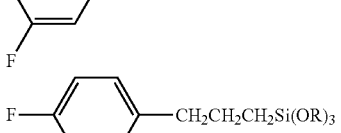
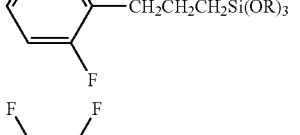
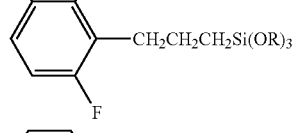
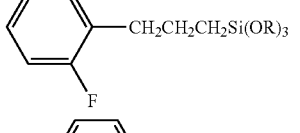
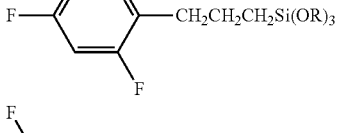
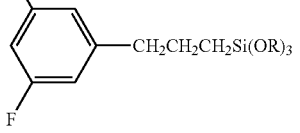

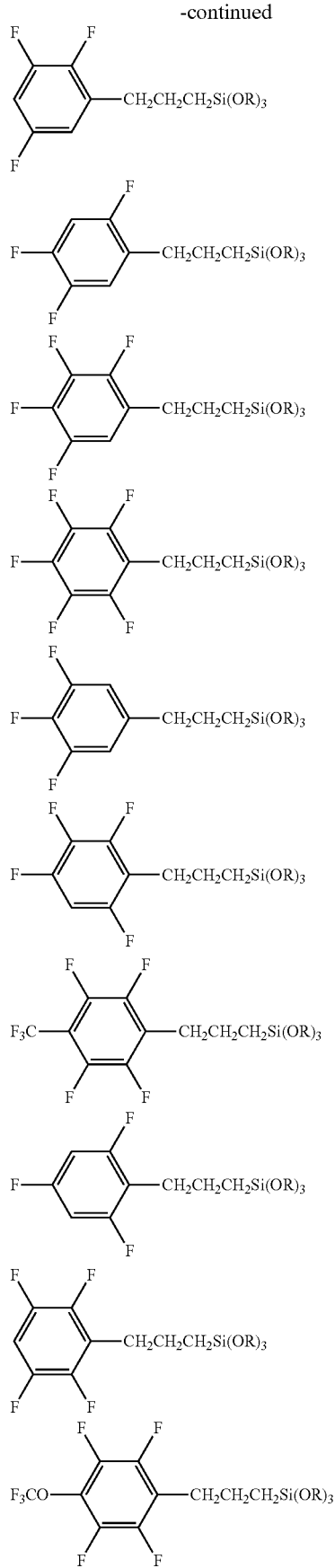
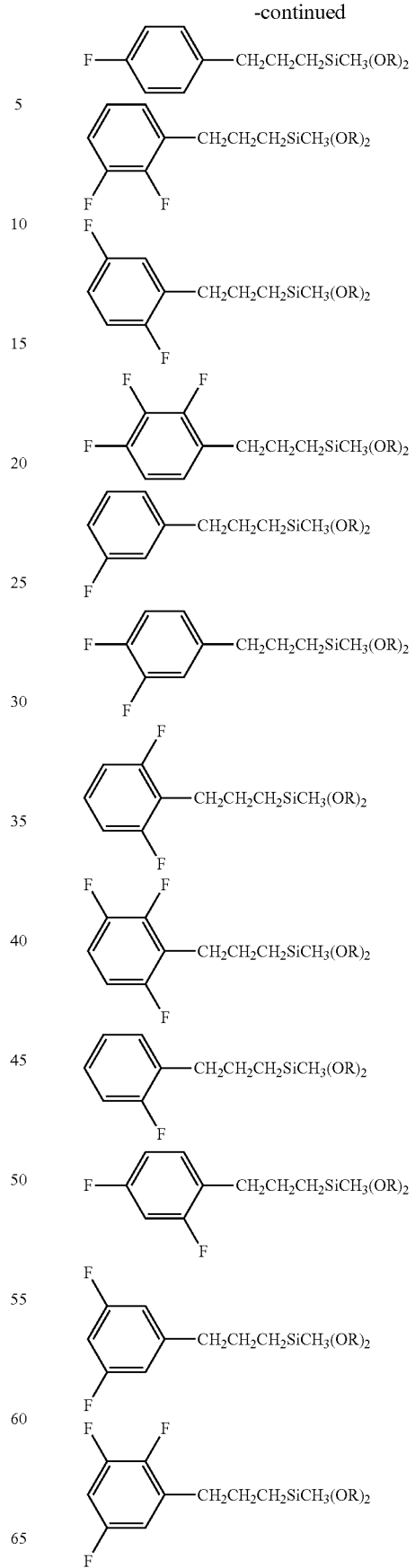

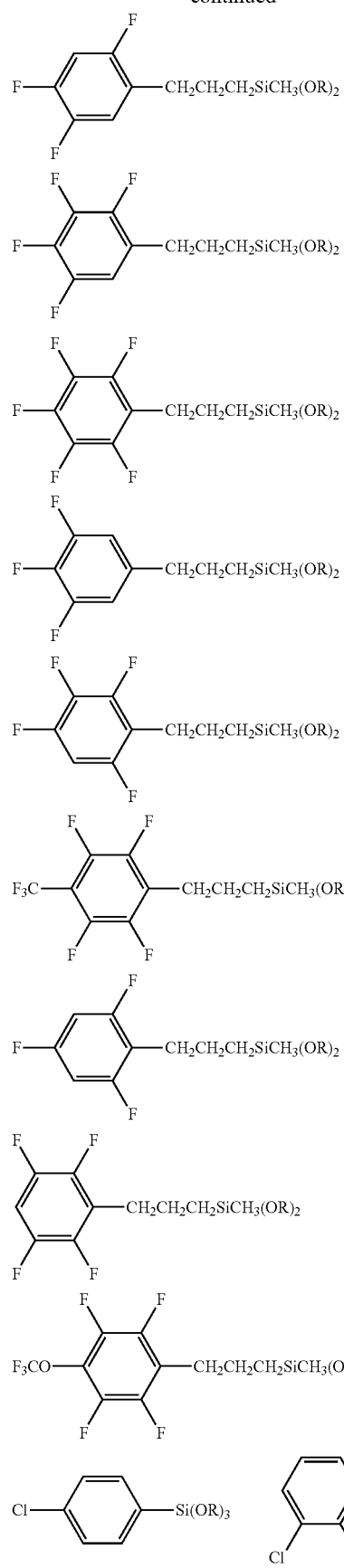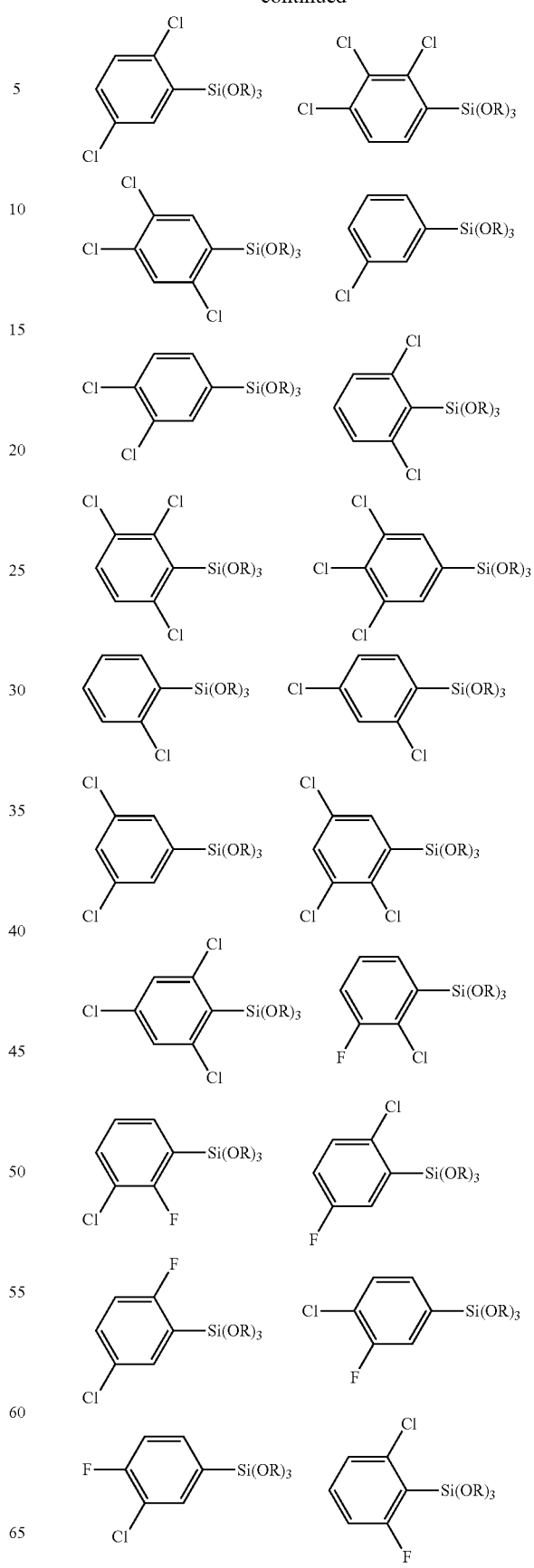

-continued
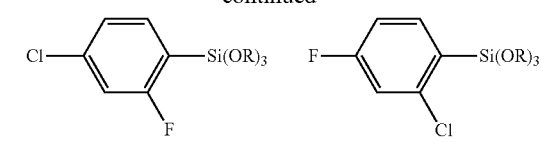
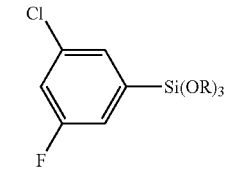
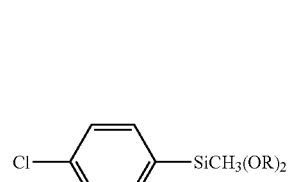
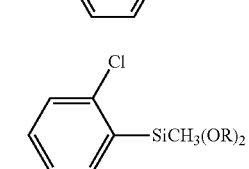
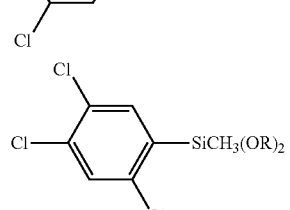
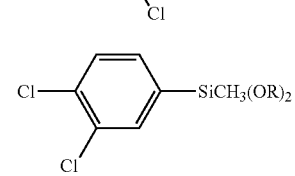
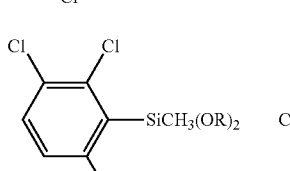
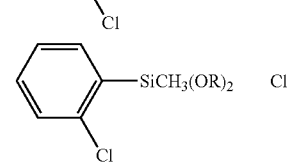
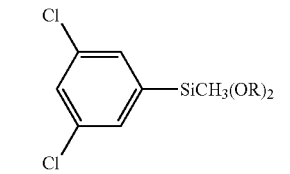
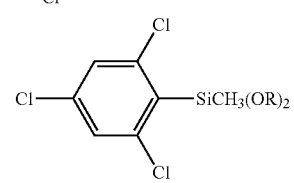
-continued
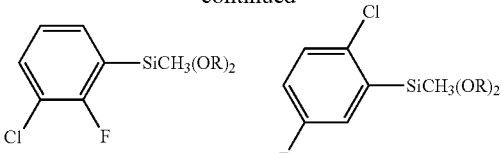
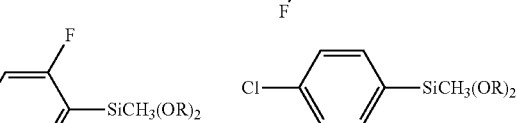
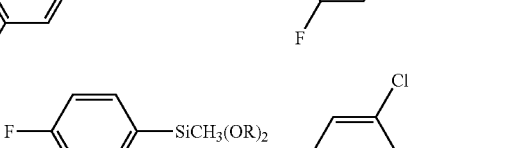
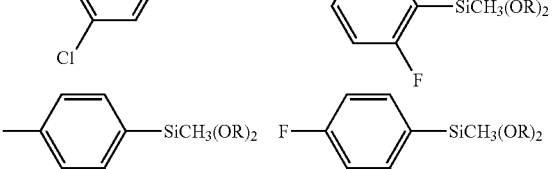
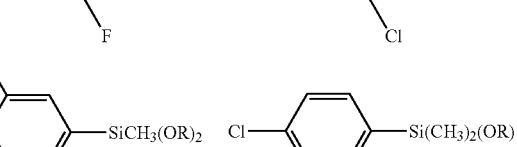
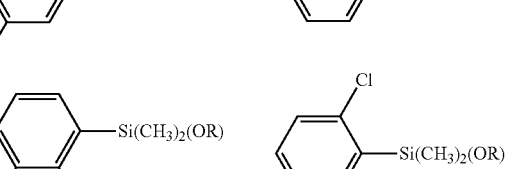
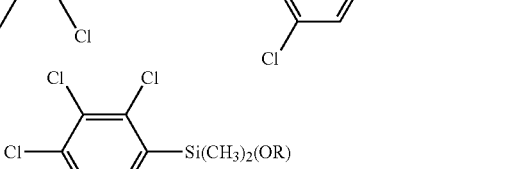
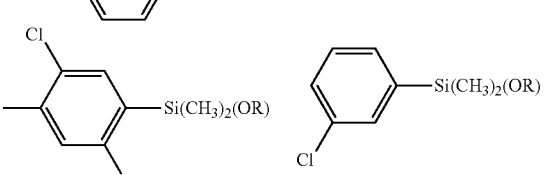
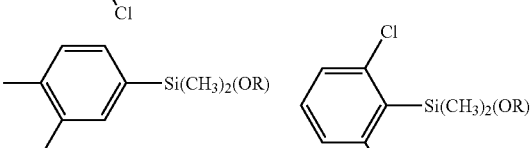
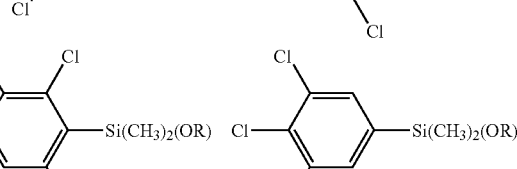
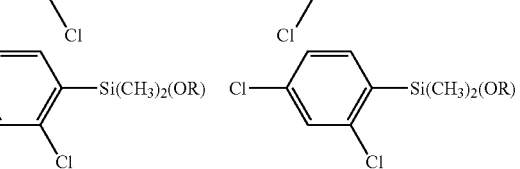

-continued
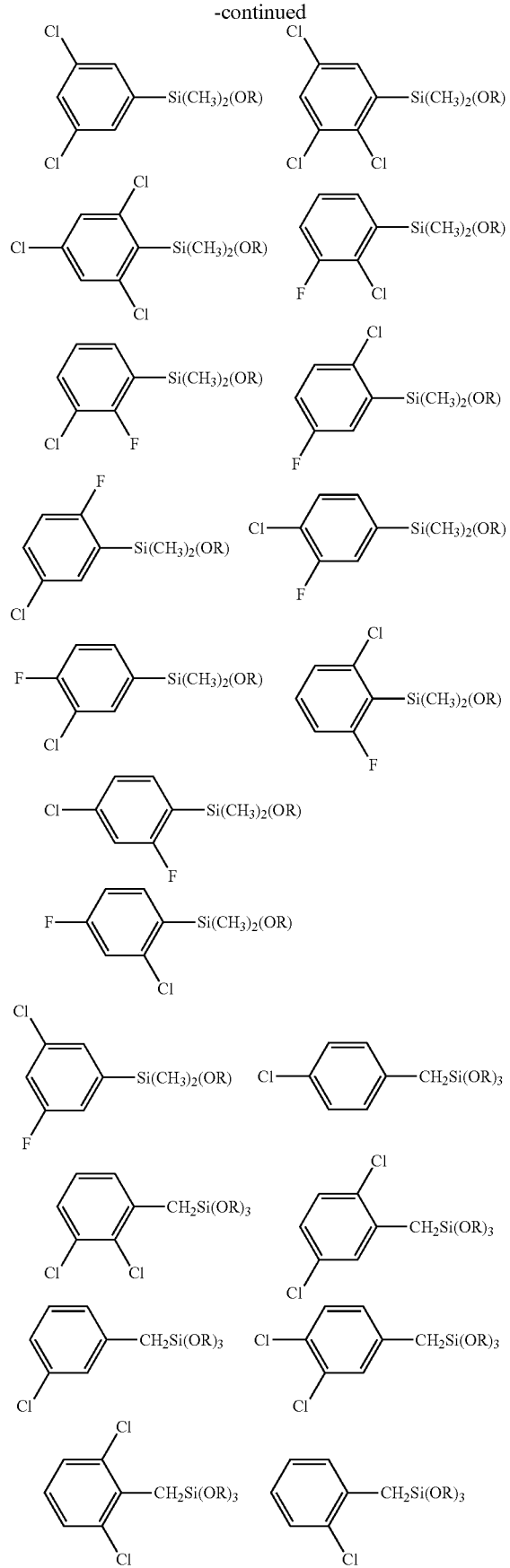
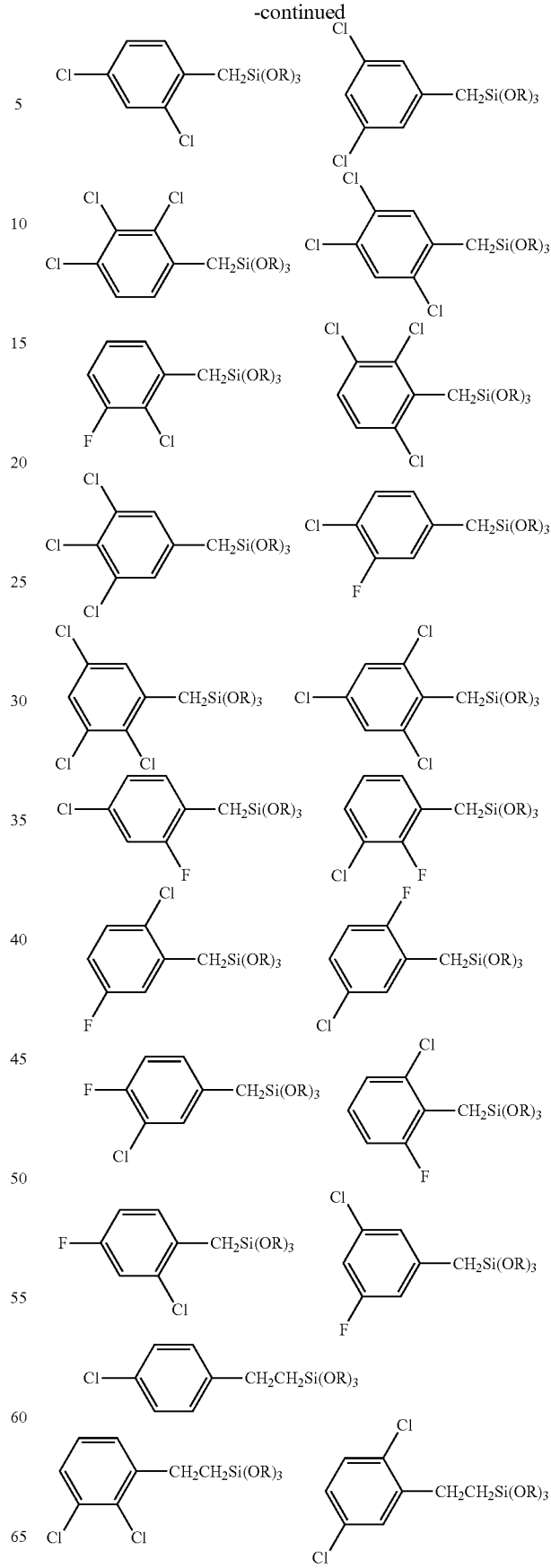

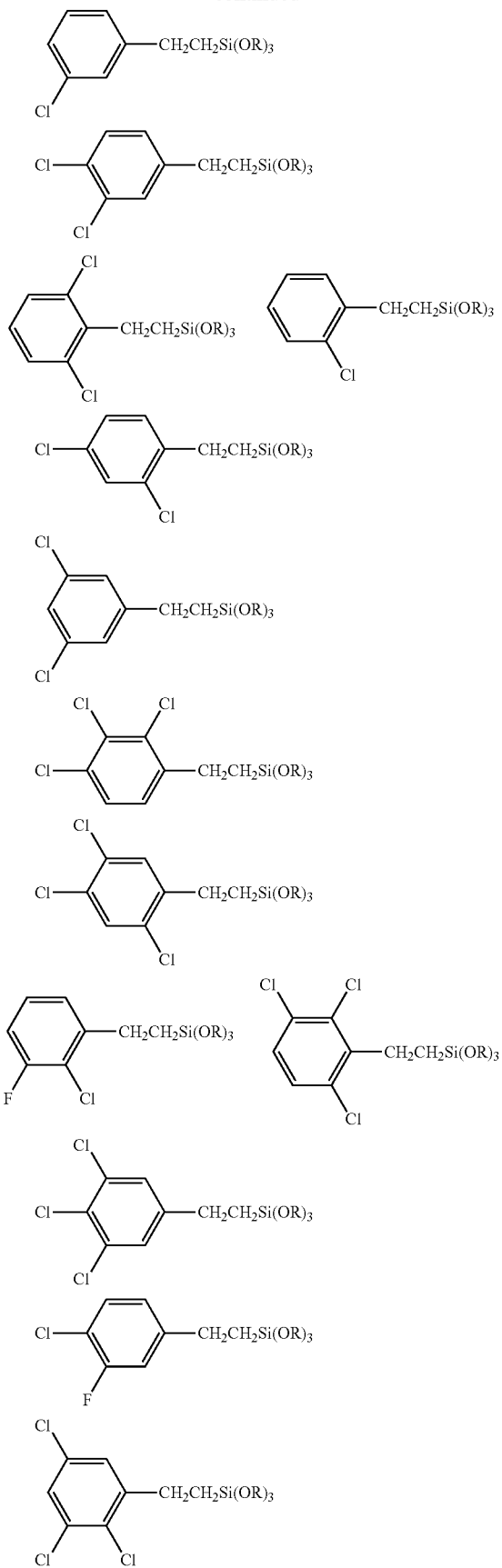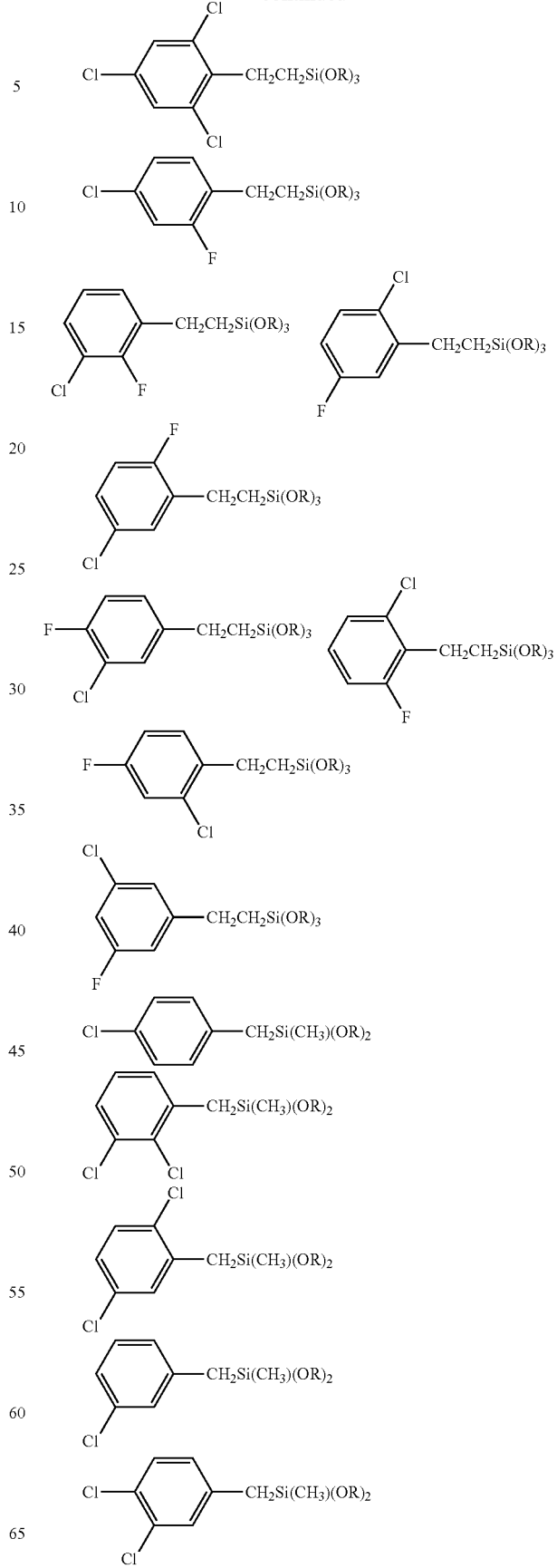

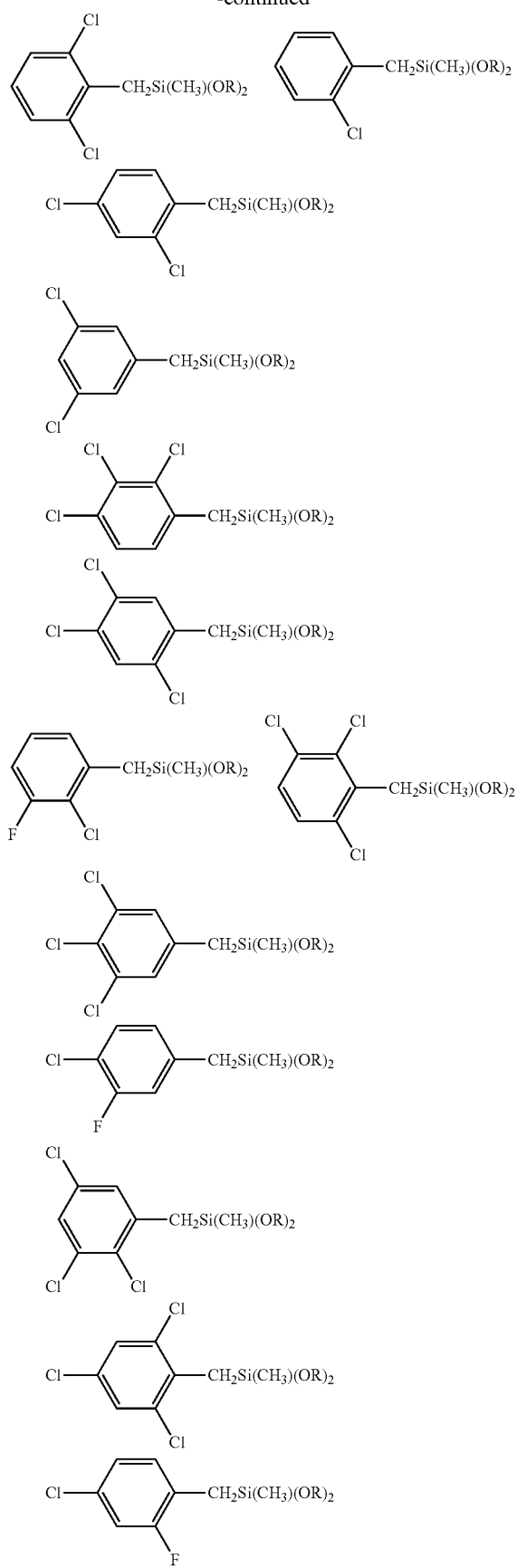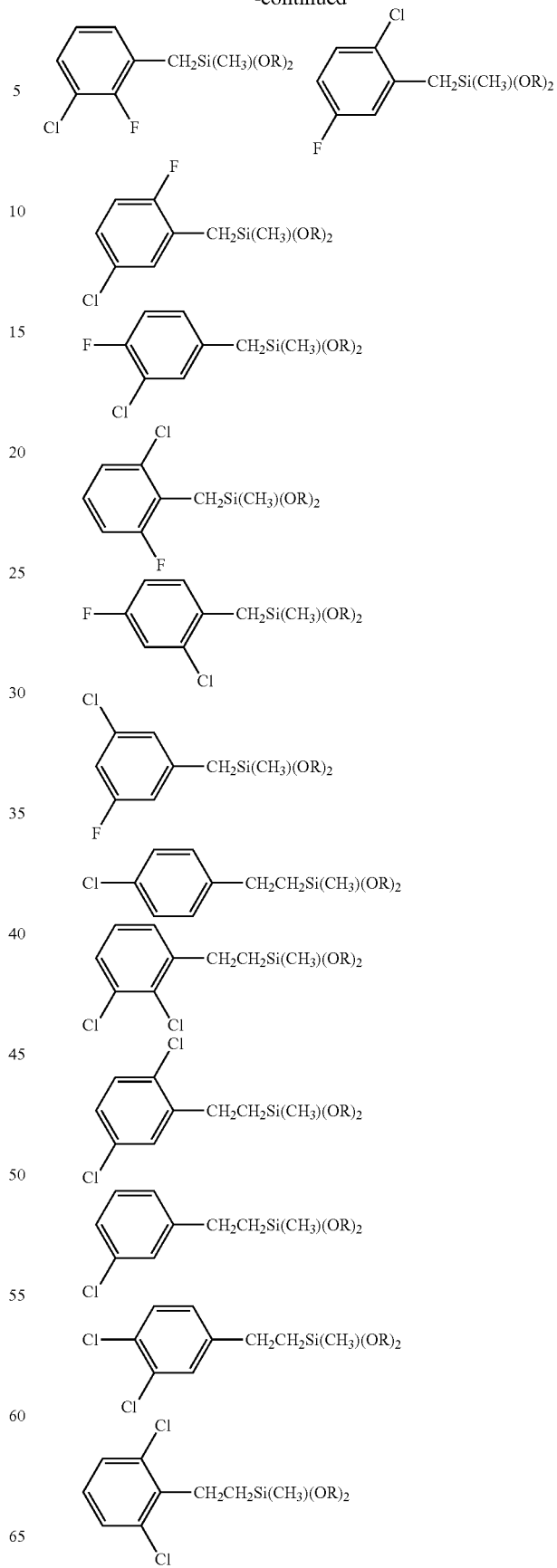

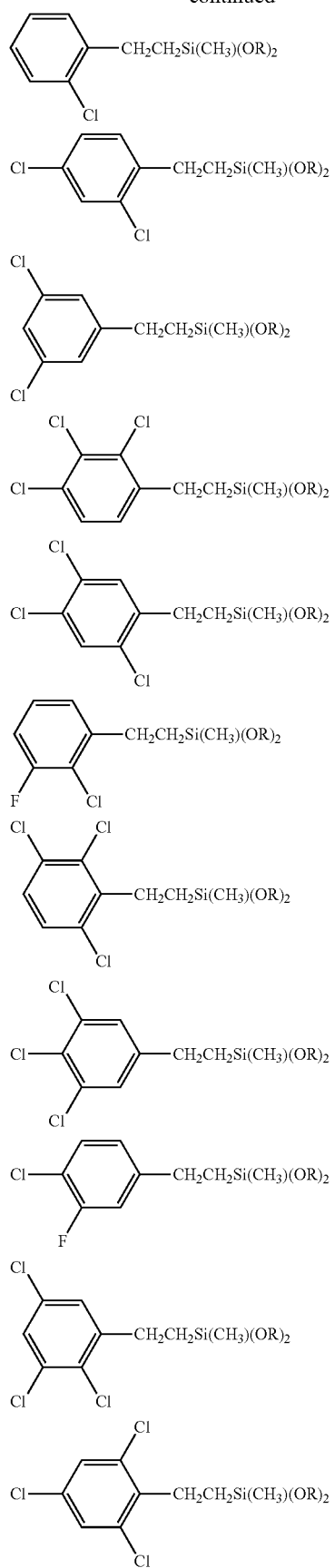
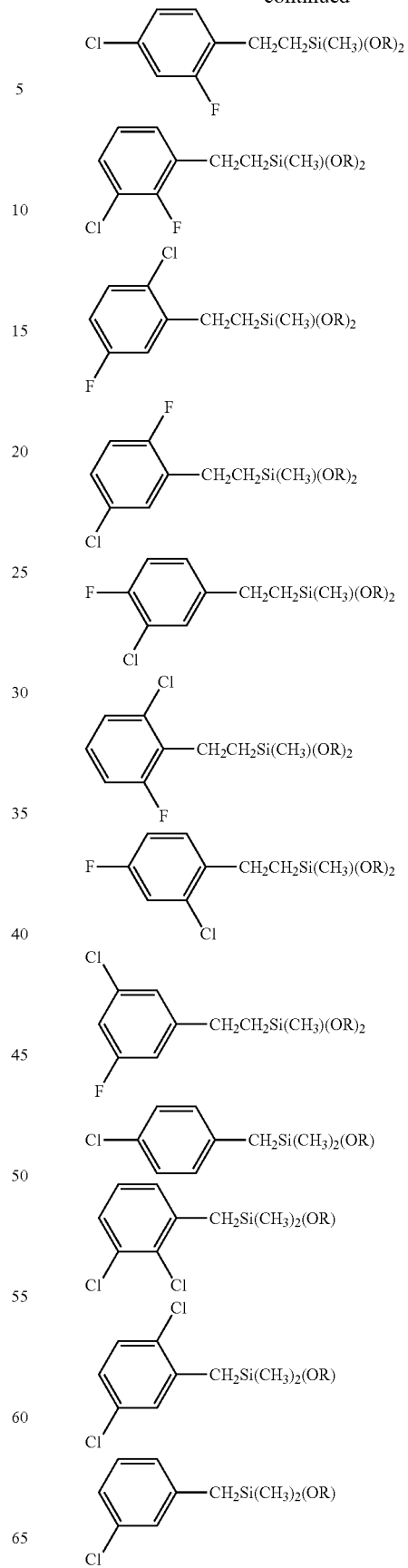

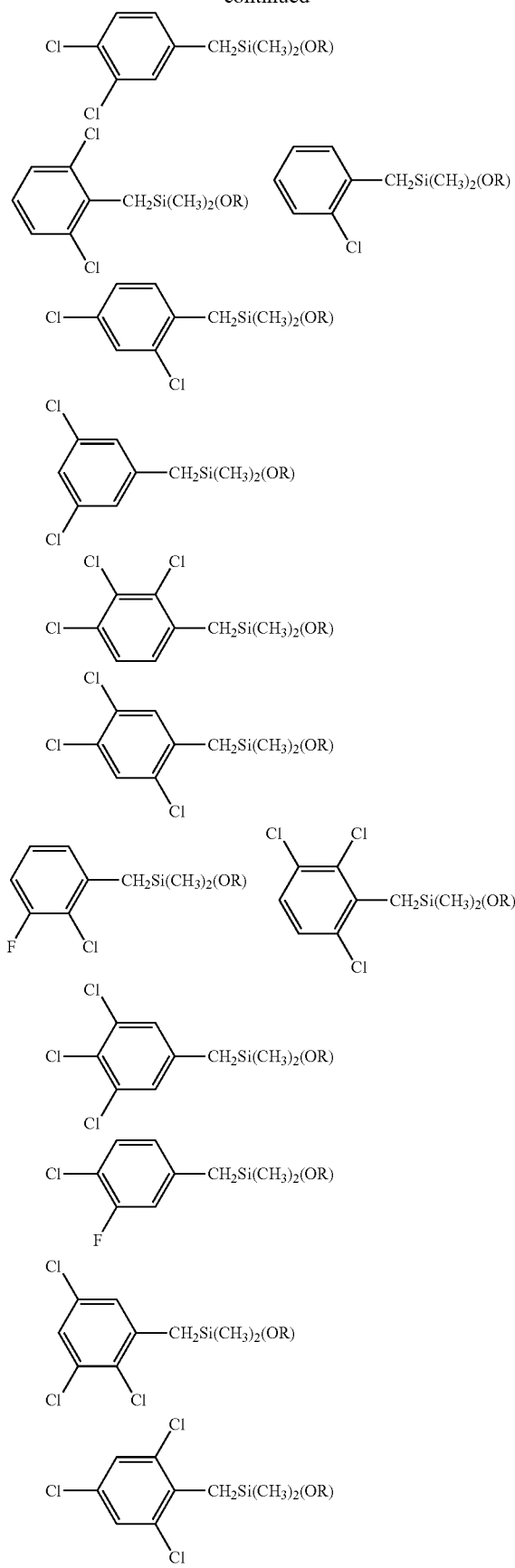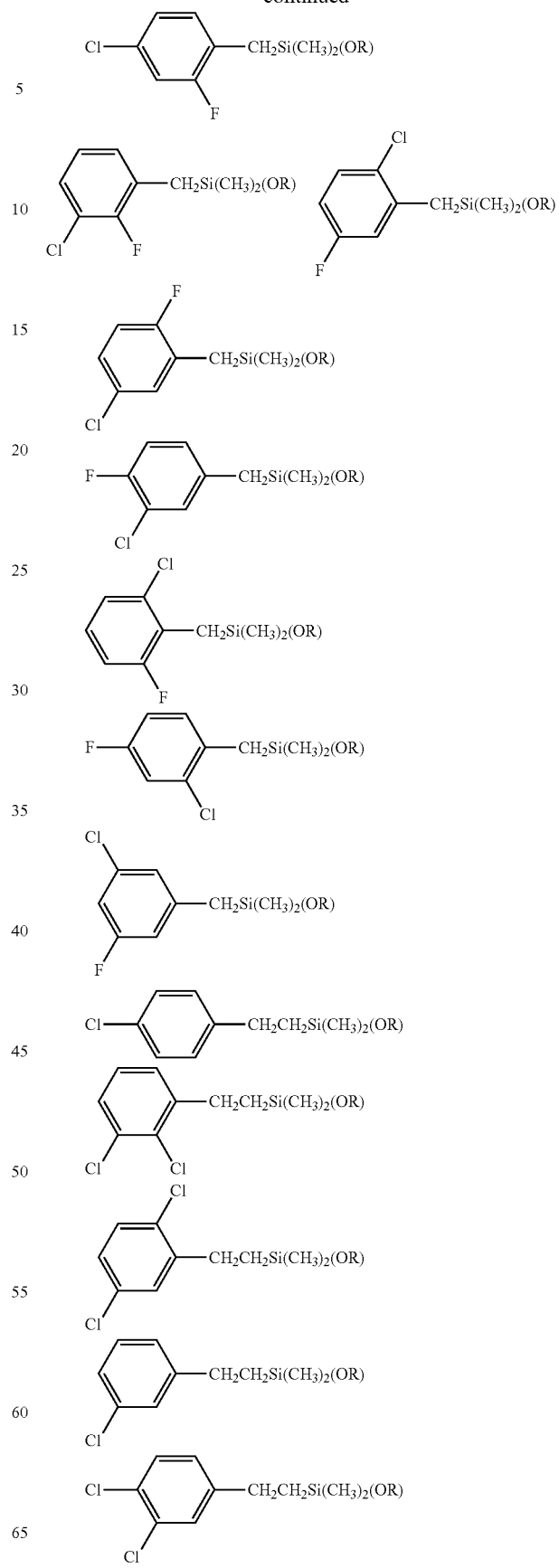

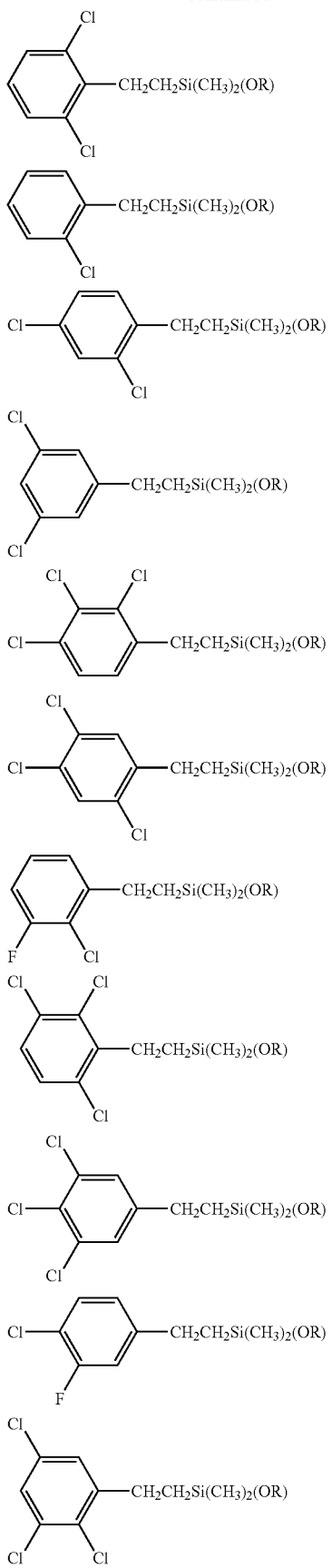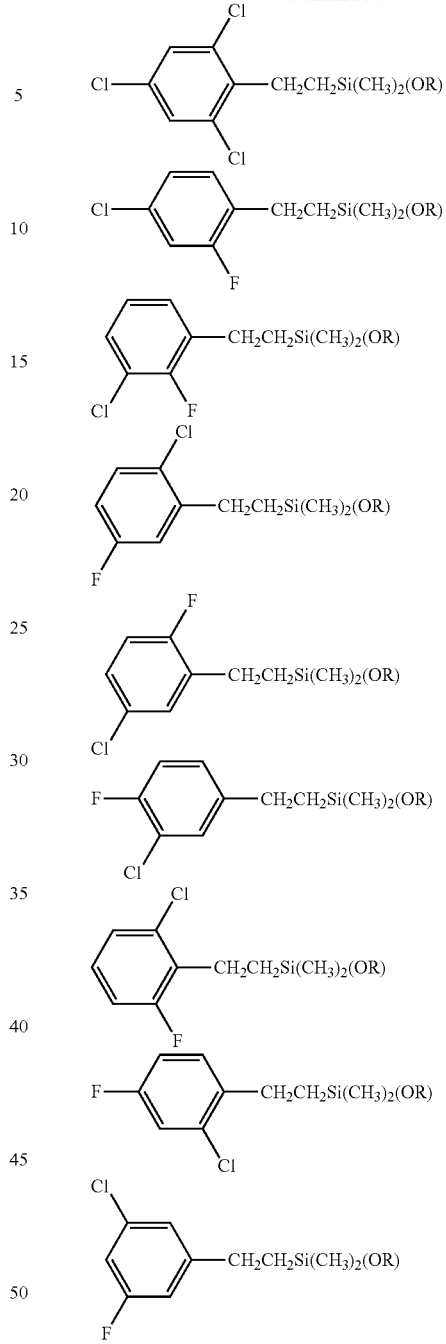

Thus, by introducing an organic group(s) substituted by a halogen atom(s), peeling property of the BPSG film in the wet etching process can be further improved.

The silicon compound which can be used as a starting material of Component (A) may be mentioned a material represented by the following general formula (A-1-4), $$Si(OR)_4 \qquad (A\text{-}1\text{-}4)$$

wherein, R represents a hydrocarbon group having 1 to 6 carbon atoms.

Preferable examples of the silicon compound represented by the general formula (A-1-4) include tetramethoxy silane, tetraethoxy silane, tetrapropoxy silane, tetraisopropoxy silane, etc.

Especially preferable examples of the silicon compound represented by the general formulae (A-1-1) to (A-1-4) include tetramethoxy silane, tetraethoxy silane, methyl trimethoxy silane, methyl triethoxy silane, ethyl trimethoxy silane, ethyl triethoxy silane, vinyl trimethoxy silane, vinyl triethoxy silane, propyl trimethoxy silane, propyl triethoxy silane, isopropyl trimethoxy silane, isopropyl triethoxy silane, butyl trimethoxy silane, butyl triethoxy silane, isobutyl trimethoxy silane, isobutyl triethoxy silane, allyl trimethoxy silane, allyl triethoxy silane, cyclopentyl trimethoxy silane, cyclopentyl triethoxy silane, cyclohexyl trimethoxy silane, cyclohexyl triethoxy silane, cyclohexenyl trimethoxy silane, cyclohexenyl triethoxy silane, phenyl trimethoxy silane, phenyl triethoxy silane, benzyl trimethoxy silane, benzyl triethoxy silane, tolyl trimethoxy silane, tolyl triethoxy silane, anisyl trimethoxy silane, anisyl triethoxy silane, phenethyl trimethoxy silane, phenethyl triethoxy silane, dimethyl dimethoxy silane, dimethyl diethoxy silane, diethyl dimethoxy silane, diethyl diethoxy silane, methyl ethyl dimethoxy silane, methyl ethyl diethoxy silane, dipropyl dimethoxy silane, dibutyl dimethoxy silane, methyl phenyl dimethoxy silane, methyl phenyl diethoxy silane, trimethyl methoxy silane, dimethyl ethyl methoxy silane, dimethyl phenyl methoxy silane, dimethyl benzyl methoxy silane, dimethyl phenethyl methoxy silane, etc.

Other example of the organic groups represented by the above $R^1$, $R^2$, $R^3$, $R^4$, $R^5$ and $R^6$ includes an organic group having one or more of a carbon-oxygen single bond and a carbon-oxygen double bond. Specifically, an organic group having one or more groups selected from the group consisting of an epoxy group, an ester group, an alkoxy group and a hydroxyl group may be mentioned. As illustrative example of this organic group, an organic group shown by the following general formula (4) can be mentioned.

$$\{U-Q_1-(S_1)_{v1}-Q_2-\}_u-(T)_{v2}-Q_3-(S_2)_{v3}-Q_4- \quad (4)$$

wherein, U represents a hydrogen atom, a hydroxyl group, epoxy ring:

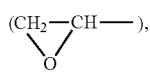

an alkoxy group having 1 to 4 carbon atoms, an alkylcarbonyloxy group having 1 to 6 carbon atoms, or an alkylcarbonyl group having 1 to 6 carbon atoms; each of $Q_1$, $Q_2$, $Q_3$, and $Q_4$ independently represent $—C_qH_{(2q-p)}U_p—$, wherein U has the same meaning as defined above, p represents an integer of 0 to 3, q represents an integer of 0 to 10 (however, q=0 means a single bond); u represents an integer of 0 to 3; each of $S_1$ and $S_2$ independently represent —O—, —CO—, —OCO—, —COO—, or —OCOO—. Each of v1, v2, and v3 independently represent 0 or 1. Concurrently with the above, T represents divalent group comprising an alicycle or an aromatic ring optionally containing a heteroatom, and illustrative examples of the alicycle or the aromatic ring T optionally containing a heteroatom such as an oxygen atom include those shown below. In T, a bonding site between $Q_2$ and $Q_3$ is not particularly restricted; and the site is appropriately selected by considering reactivity due to steric factors, availability of commercially reagents, and so on.

T = 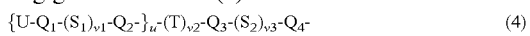

Preferable examples of the organic group having one or more of a carbon-oxygen single bond and a carbon-oxygen double bond in the general formula (4) include those shown below. Meanwhile, in the following formulae, (Si) is described to show the bonding sites to the Si.

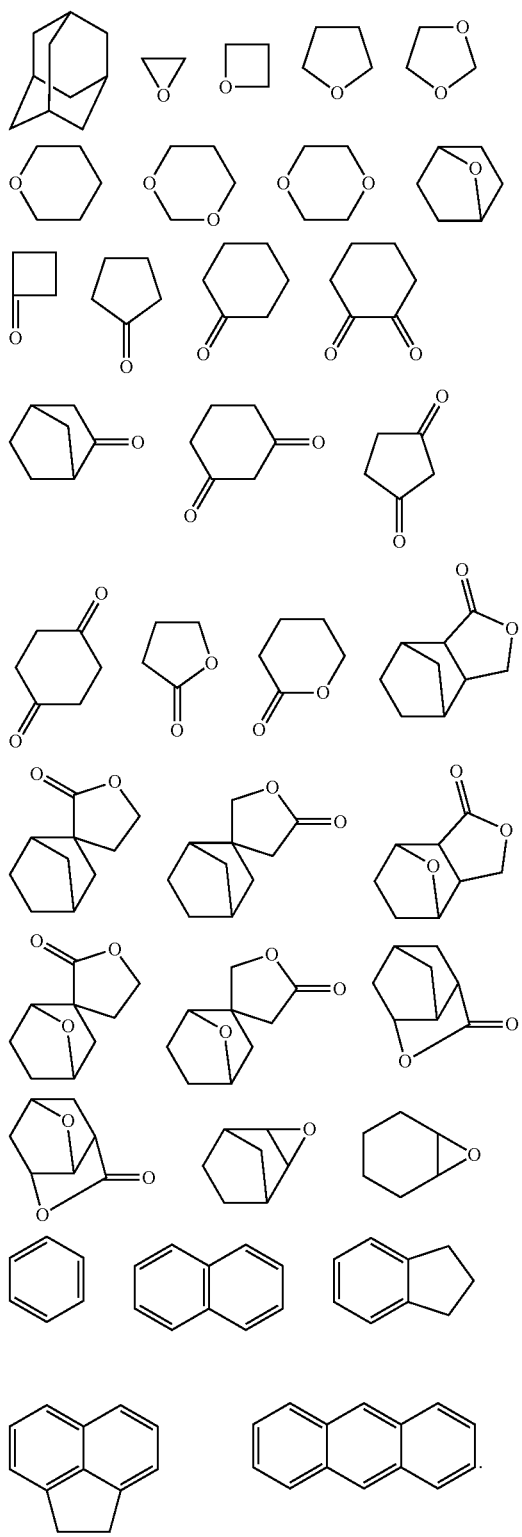

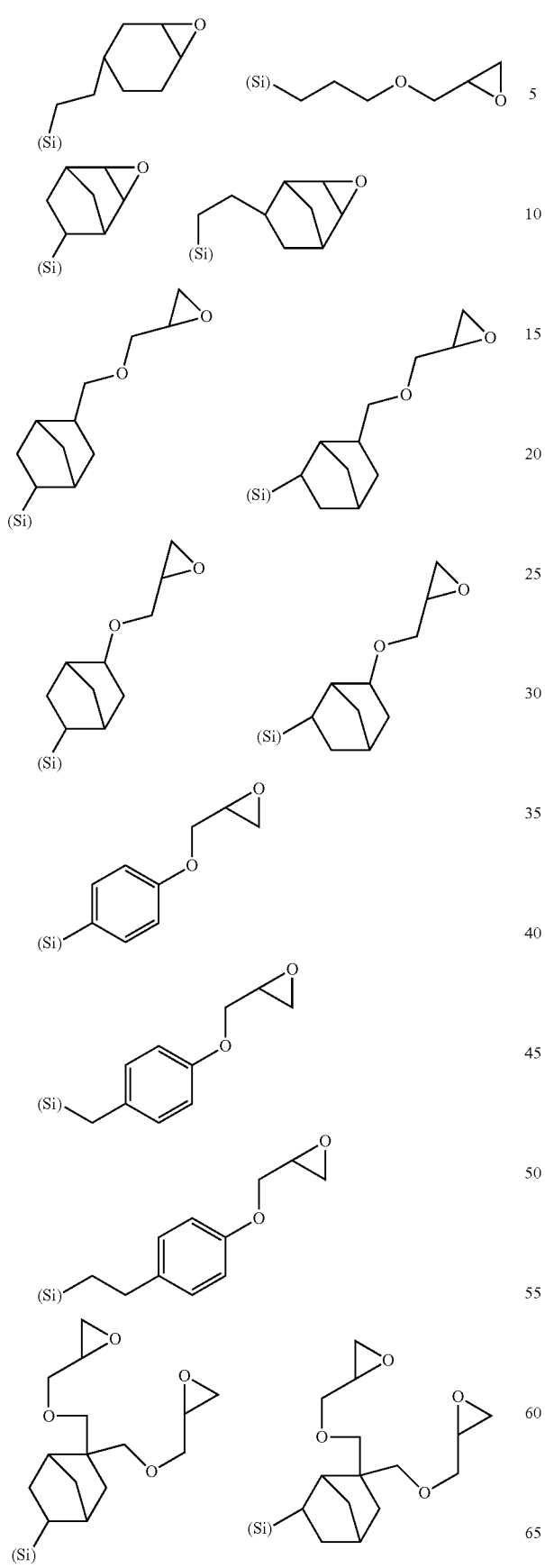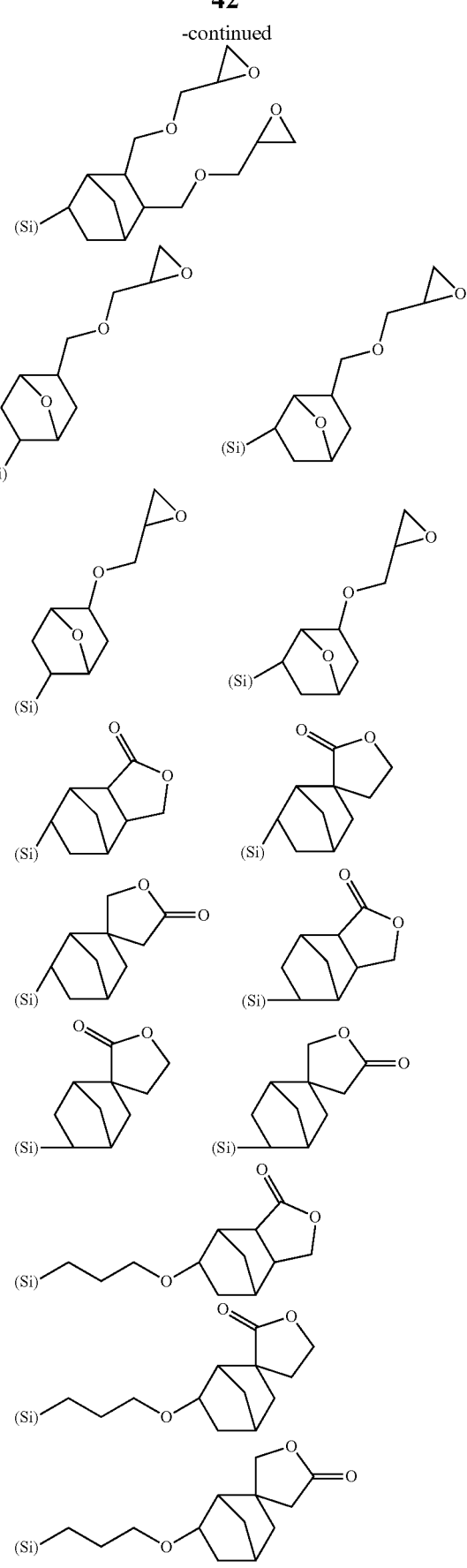
-continued

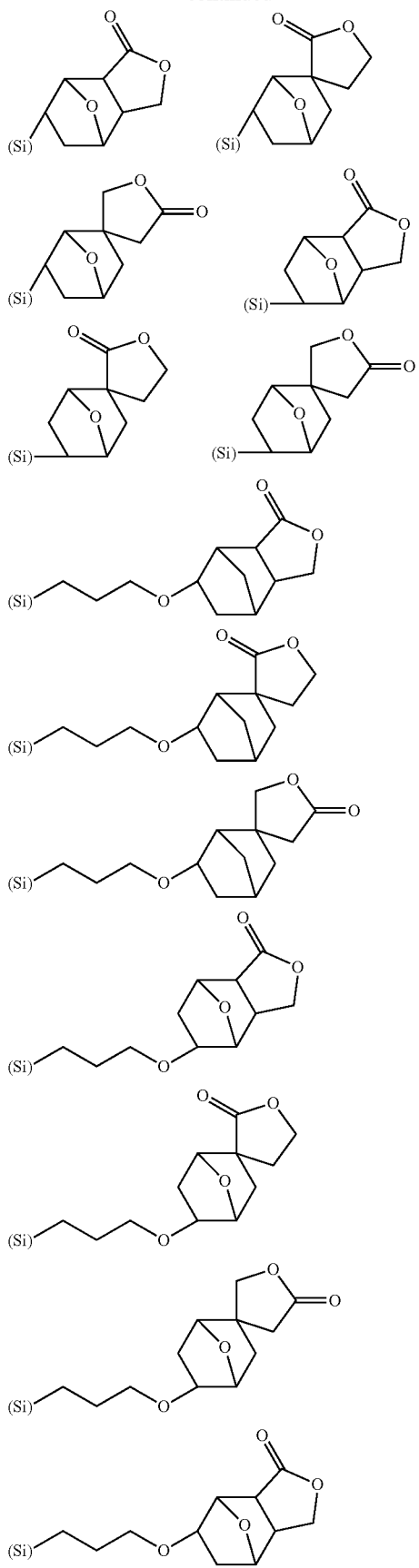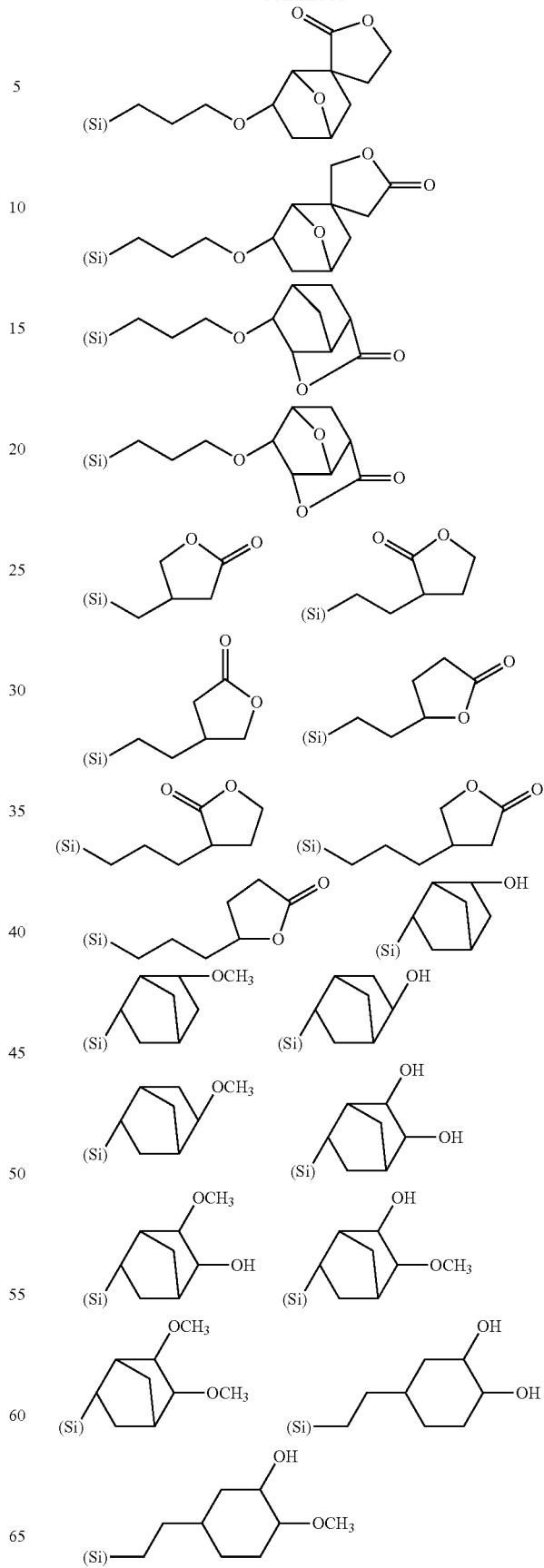

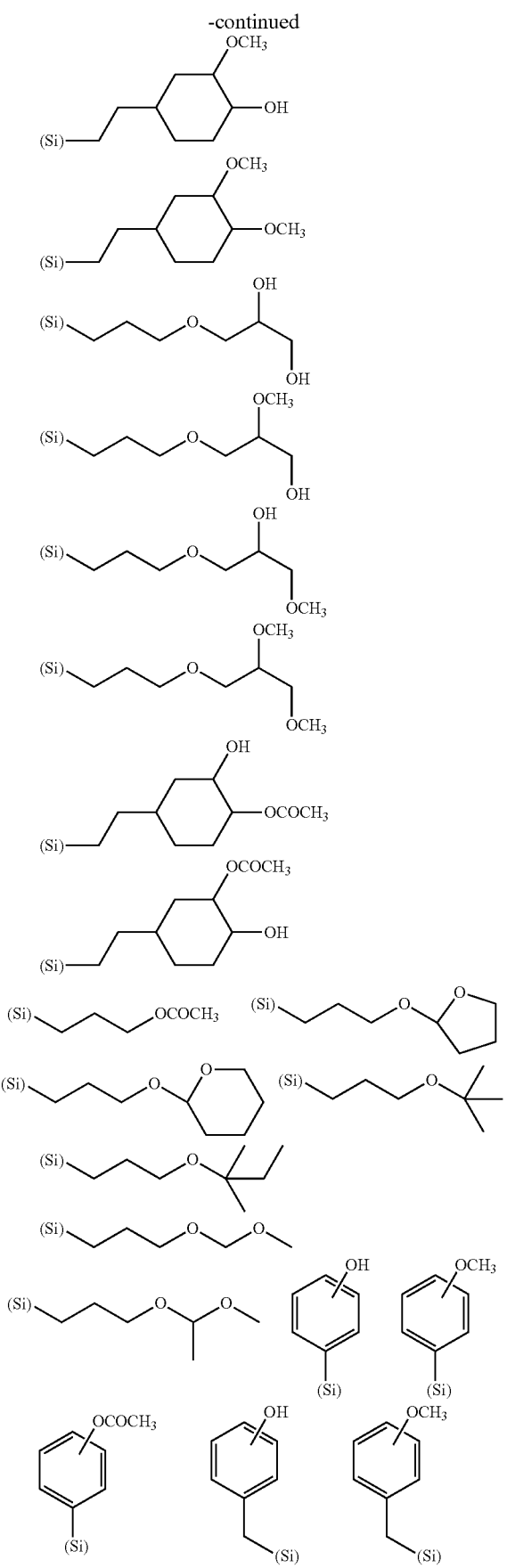
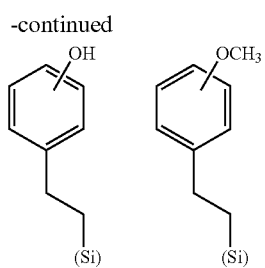
Further, as the organic groups represented by $R^1$, $R^2$, $R^3$, $R^4$, $R^5$ and $R^6$, an organic group having a Si—Si bond can be used. Groups shown below are the illustrative examples thereof.
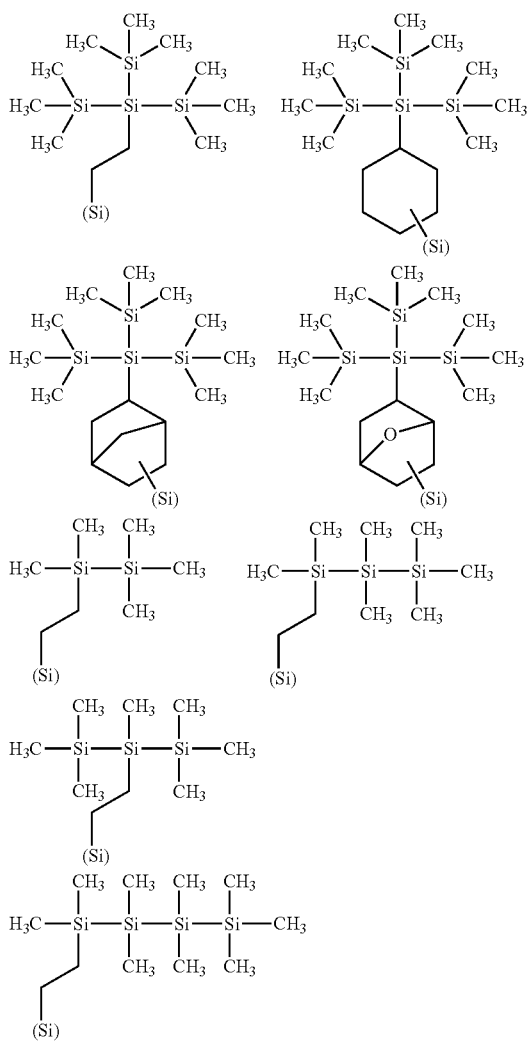

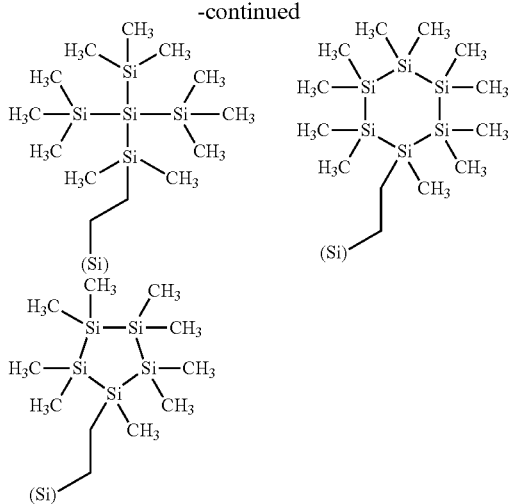

[Phosphorus Compound]

The phosphorus compound which can be used as a starting material of Component (A) may be mentioned a material represented by the following general formula (A-2-1), $$PX_3 \quad (A\text{-}2\text{-}1)$$

wherein, X represents a halogen atom, a hydroxyl group or an alkoxy group having 1 to 6 carbon atoms.

Preferable examples of the phosphorus compound represented by the general formula (A-2-1) include phosphorus trichloride, phosphorus tribromide, phosphorus acid, trimethyl phosphite, triethyl phosphite, tripropyl phosphite, etc.

The phosphorus compound which can be used as a starting material of Component (A) may be mentioned a material represented by the following general formula (A-2-2), $$POX_3 \quad (A\text{-}2\text{-}2)$$

wherein, X represents a halogen atom, a hydroxyl group or an alkoxy group having 1 to 6 carbon atoms.

Preferable examples of the phosphorus compound represented by the general formula (A-2-2) include phosphorus oxytrichloride, phosphorus oxytribromide, phosphoric acid, trimethyl phosphate, triethyl phosphate, tripropyl phosphate, etc.

The phosphorus compound which can be used as a starting material of Component (A) may be mentioned a material represented by the following general formulae (A-2-3) and (A-2-4), $$P_2O_5 \quad (A\text{-}2\text{-}3)$$

$$H(HPO_3)_aOH \quad (A\text{-}2\text{-}4)$$

wherein, "a" is an integer of 1 or more.

Diphosphorus pentaoxide represented by the general formula (A-2-3), and a polyphosphoric acid represented by the general formula (A-2-4) or a polyphosphate, etc., may be used as the phosphorus compound.

The phosphorus compound which can be used as a starting material of Component (A) may be mentioned a material represented by the following general formula (A-2-5), $$R^7PX_2 \quad (A\text{-}2\text{-}5)$$

wherein, $R^7$ represents a hydrogen atom or an organic group having 1 to 30 carbon atoms, wherein a hydrogen atom(s) in the organic group may be substituted by a halogen atom(s); X represents a halogen atom, a hydroxyl group or an alkoxy group having 1 to 6 carbon atoms.

Preferable examples of the phosphorus compound represented by the general formula (A-2-5) include $CH_3PCl_2$, $C_2H_5PCl_2$, $CH_3OPCl_2$, etc.

The phosphorus compound which can be used as a starting material of Component (A) may be mentioned a material represented by the following general formula (A-2-6), $$R^7POX_2 \quad (A\text{-}2\text{-}6)$$

wherein, $R^7$ represents a hydrogen atom or an organic group having 1 to 30 carbon atoms, wherein a hydrogen atom(s) in the organic group may be substituted by a halogen atom(s); X represents a halogen atom, a hydroxyl group or an alkoxy group having 1 to 6 carbon atoms.

Preferable examples of the phosphorus compound represented by the general formula (A-2-6) include $HPO(OCH_3)_2$, $HPO(OC_2H_5)_2$, $CH_3PO(OH)_2$, $CH_3PO(OCH_3)_2$, $CH_3POCl_2$, $C_6H_5PO(OH)_2$, $C_6H_5POCl_2$, $C_6H_5CH_2PO(OC_2H_5)_2$, etc.

[Boron Compound]

The boron compound which can be used as a starting material of Component (A) may be mentioned a material represented by the following general formula (A-3-1), $$BX_3 \quad (A\text{-}3\text{-}1)$$

wherein, X represents a halogen atom, a hydroxyl group or an alkoxy group having 1 to 6 carbon atoms.

Preferable examples of the boron compound represented by the general formula (A-3-1) include boron trichloride, boron trichloride, boric acid, trimethyl borate, triethyl borate, tripropyl borate, tributyl borate, triamyl borate, trihexyl borate, tricyclopentyl borate, tricyclohexyl borate, triallyl borate, triphenyl borate, ethyldimethyl borate, etc.

The boron compound which can be used as a starting material of Component (A) may be mentioned a material represented by the following general formula (A-3-2), $$B_2O_3 \quad (A\text{-}3\text{-}2)$$

Boron oxide represented by the general formula (A-3-2) may be used as the boron compound.

The boron compound which can be used as a starting material of Component (A) may be mentioned a material represented by the following general formula (A-3-3), $$R^8BX_2 \quad (A\text{-}3\text{-}3)$$

wherein, $R^8$ represents a hydrogen atom or an organic group having 1 to 30 carbon atoms, wherein a hydrogen atom(s) in the organic group may be substituted by a halogen atom(s); X represents a halogen atom, a hydroxyl group or an alkoxy group having 1 to 6 carbon atoms.

Preferable examples of the boron compound represented by the general formula (A-3-3) include $C_6H_5B(OH)_2$, $CH_3B(OC_3H_7)_2$, $CH_3B(OH)_2$, $C_6H_{11}B(OH)_2$, etc.

A mixture (i.e. monomer) containing one or more silicon compounds, one or more phosphorus compounds and one or more boron compounds mentioned above is subjected to hydrolysis, condensation, or hydrolysis condensation, whereby a compound (i.e. polymer) which becomes a base polymer of the composition for forming a coating type BPSG film can be synthesized.

The above-mentioned hydrolysis, condensation, or hydrolysis condensation reaction can be carried out using one or more kinds of compounds selected from inorganic acid, aliphatic sulfonic acid, and aromatic sulfonic acid as acid catalyst. Illustrative examples of the acid catalyst used include fluorinated acid, hydrochloric acid, hydrobromic acid, sulfuric acid, nitric acid, perchloric acid, phosphoric acid, methanesulfonic acid, benzenesulfonic acid, toluenesulfonic acid, etc. The catalyst is preferably used in the range of $1\times10^{-6}$ to 10 mol, more preferably $1\times10^{-5}$ to 5 mol, and much more preferably $1\times10^{-4}$ to 1 mol per 1 mol of monomers.

The amount of water to be added for obtaining a polymer from these monomers is preferably in the range of 0.01 to 100 mol, more preferably 0.05 to 50 mol, and much more preferably 0.1 to 30 mol per 1 mol of a hydrolysable substituent group bonded to monomers. If the amount is 100 mol or less, a reaction device does not become excessively large, therefore it is economical.

As an operation, a method in which monomers are added to a catalyst aqueous solution to start hydrolysis condensation reaction can be mentioned. In the method, organic solvent may be added to the catalyst aqueous solution, monomers may be diluted with the organic solvent, or both may be performed. The reaction temperature is preferably in the range of 0 to 100° C., and more preferably 5 to 80° C. A method in which the reaction temperature is maintained in the range of 5 to 80° C. when monomers are dropped, and then the mixture is aged in the range of 20 to 80° C., is preferable.

Preferable examples of the organic solvent that can be added to the catalyst aqueous solution or can dilute monomers include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxy propionate, ethyl 3-ethoxy propionate, tert-butyl acetate, tert-butyl propionate, propylene glycol mono-tert-butyl ether acetate, γ-butyrolactone and mixture thereof.

Among them, water-soluble solvent is preferable, and illustrative examples thereof include alcohols such as methanol, ethanol, 1-propanol, and 2-propanol; polyvalent alcohols such as ethylene glycol and propylene glycol; polyvalent alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether; acetone; acetonitrile; tetrahydrofuran, etc. Particularly preferable is solvent with a boiling point of 100° C. or less.

The amount of the organic solvent to be used is preferably in the range of 0 to 1,000 mL, and particularly preferably 0 to 500 mL, per 1 mol of monomers. If the amount of the organic solvent is 1,000 mL or less, a reaction vessel does not become excessively large, therefore it is economical.

Then, if necessary, neutralization reaction of the catalyst is carried out and alcohol produced by hydrolysis condensation reaction is removed under reduced pressure to obtain a reaction mixture aqueous solution. The amount of an alkaline substance to be used for neutralization is preferably 0.1 to 2 equivalent weight, with respect to acid used as the catalyst. The alkaline substance may be any substance so long as it shows basicity in water.

Subsequently, it is preferable that by-products such as alcohol produced by hydrolysis condensation reaction be removed from the reaction mixture. The temperature for heating the reaction mixture is preferably in the range of 0 to 100° C., more preferably 10 to 90° C., and much more preferably 15 to 80° C., though it is depending on the kind of the organic solvent added and the alcohol produced by reaction. Degree of vacuum is preferably an atmospheric pressure or less, more preferably 80 kPa or less in the absolute pressure, and much more preferably 50 kPa or less in the absolute pressure, though it is depending on the kinds of the organic solvent and the alcohol to be removed, of an exhausting equipment, and of a condensation equipment, as well as heating temperature. Although it is difficult to know exactly the amount of the alcohol removed, it is preferable that about 80% by mass or more of a produced alcohol and so forth be removed.

Next, the acid catalyst used in hydrolysis condensation may be removed from the reaction mixture. A method for removing acid catalyst may be to mix water and the polymer, and extract the polymer with organic solvent. As the organic solvent used, the one that can dissolve the polymer and achieve two-layer separation by mixing with water is preferable. Illustrative examples thereof include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxy propionate, ethyl 3-ethoxy propionate, tert-butyl acetate, tert-butyl propionate, propylene glycol mono-tert-butyl ether acetate, γ-butyrolactone, methyl isobutyl ketone, cyclopentyl methyl ether, etc., and mixture thereof.

Moreover, mixture of water-soluble organic solvent and slightly water-soluble organic solvent can be used. Preferable examples thereof include methanol+ethyl acetate mixture, ethanol+ethyl acetate mixture, 1-propanol+ethyl acetate mixture, 2-propanol+ethyl acetate mixture, butanediol monomethyl ether+ethyl acetate mixture, propylene glycol monomethyl ether+ethyl acetate mixture, ethylene glycol monomethyl ether+ethyl acetate mixture, butanediol monoethyl ether+ethyl acetate mixture, propylene glycol monoethyl ether+ethyl acetate mixture, ethylene glycol monoethyl ether+ethyl acetate mixture, butanediol monopropyl ether+ethyl acetate mixture, propylene glycol monopropyl ether+ethyl acetate mixture, ethylene glycol monopropyl ether+ethyl acetate mixture, methanol+methyl isobutyl ketone mixture, ethanol+methyl isobutyl ketone mixture, 1-propanol+methyl isobutyl ketone mixture, 2-propanol+methyl isobutyl ketone mixture, propylene glycol monomethyl ether+methyl isobutyl ketone mixture, ethylene glycol monomethyl ether+methyl isobutyl ketone mixture, propylene glycol monoethyl ether+methyl isobutyl ketone mixture, ethylene glycol monoethyl ether+methyl isobutyl ketone mixture, propylene glycol monopropyl ether+methyl isobutyl ketone mixture, ethylene glycol monopropyl ether+methyl isobutyl ketone mixture, methanol+cyclopentyl methyl ether mixture, ethanol+cyclopentyl methyl ether mixture, 1-propanol+cyclopentyl methyl ether mixture, 2-propanol+cyclopentyl methyl ether mixture, propylene glycol monomethyl ether+cyclopentyl methyl ether mixture, ethylene glycol monomethyl ether+cyclopentyl methyl ether mixture, propylene glycol monoethyl ether+cyclopentyl methyl ether mixture, ethylene glycol monoethyl ether+cyclopentyl methyl ether mixture, propylene glycol monopropyl ether+cyclopentyl methyl ether mixture, ethylene glycol monopropyl ether+cyclopentyl methyl ether mixture, methanol+propylene glycol methyl ether acetate mixture, ethanol+propylene glycol methyl ether acetate mixture, 1-propanol+propylene glycol methyl ether acetate mixture, 2-propanol+propylene glycol methyl ether acetate mixture, propylene glycol monomethyl ether+propylene glycol methyl ether acetate mixture, ethylene glycol monomethyl ether+propylene glycol methyl ether acetate mixture, propylene glycol monoethyl ether+propylene glycol methyl ether acetate mixture, ethylene glycol monoethyl ether+propylene glycol methyl ether acetate mixture, propylene glycol monopropyl ether+propylene glycol methyl ether acetate mixture, ethylene glycol monopropyl ether+propylene glycol methyl ether acetate mixture, etc., but are not restricted to combination of these mixtures.

The mixing ratio of the water-soluble organic solvent and the slightly water-soluble organic solvent is appropriately determined. The amount of the water-soluble organic solvent is preferably in the range of 0.1 to 1,000 parts by mass, more preferably 1 to 500 parts by mass, and much more preferably 2 to 100 parts by mass, based on 100 parts by mass of the slightly water-soluble organic solvent.

Subsequently, the reaction mixture may be washed with neutral water. The neutral water may be water called deionized water or ultrapure water. The amount of the water is preferably in the range of 0.01 to 100 L, more preferably 0.05 to 50 L, and much more preferably 0.1 to 5 L per 1 L of the polymer solution. The method for cleaning may be to charge both of polymer solution and water into the same container, agitate them and then settled to separate a water layer. Number of washing may be 1 time or more, and preferably 1 to about 5 times because washing of 10 times or more is not worth to have full effects thereof.

In this operation of water-washing, the number of washing and the amount of water for washing may be determined arbitrarily in view of effects of catalyst removal and fractionation because there is a case that a part of the polymer escapes into a water layer, thereby substantially the same effect as fractionation operation is obtained.

Other methods for removing acid catalyst include a method by ion-exchange resin, and a method for removing acid catalyst after neutralization with an epoxy compound such as ethylene oxide and propylene oxide. These methods can be selected arbitrarily according to the acid catalyst used in the reaction.

To any of the polymer solution which the acid catalyst remained therein and which the acid catalyst removed therefrom is added a final solvent, and then, the solvents therein are exchanged under reduced pressure to obtain a polymer solution. Temperature at the time of this solvent exchange operation is preferably in the range of 0 to 100° C., more preferably 10 to 90° C., and much more preferably 15 to 80° C., though it is depending on the kinds of the reaction solvent and of the extraction solvent to be removed. Degree of the vacuum in this operation is preferably an atmospheric pressure or less, more preferably 80 kPa or less in the absolute pressure, and much more preferably 50 kPa or less in the absolute pressure, though it is depending on the kinds of the extraction solvent to be removed, of an exhausting equipment, and of a condensation equipment, as well as heating temperature.

In this operation, sometimes the polymer may become unstable because of change of the solvent. This occurs due to compatibility of the polymer with the final solvent; and thus, in order to prevent this from occurring, a monovalent, divalent, or more polyvalent alcohol or ether compound having cyclic ether as a substituent may be added thereto as a stabilizer. The amount thereof to be added is preferably in the range of 0 to 25 parts by mass, more preferably 0 to 15 parts by mass, much more preferably 0 to 5 parts by mass, and 0.5 parts by mass or more when it is added, with respect to 100 parts by mass of the polymer contained in the solution before the solvent exchange. If necessary, a stabilizer may be added into the solution before the solvent exchange operation.

The concentration of the polymer is preferably in the range of 0.1 to 20% by mass. If the concentration is in such a range, a condensation reaction of the polymer does not occur; thereby the polymer does not change to the state that it cannot be dissolved into an organic solvent again. Further, when the concentration is in such a range, the amount of the solvent becomes appropriate, therefore it is economical.

Preferable examples of the final solvent added to the polymer include alcohol solvent, and particularly monoalkyl ether derivatives of ethylene glycol, diethylene glycol, triethylene glycol, propylene glycol, dipropylene glycol, butanediol, etc. Preferable examples thereof include butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, etc.

In addition, if these solvents are a main solvent, a non-alcoholic solvent may be added thereinto as an adjuvant solvent. Illustrative examples of this adjuvant solvent include acetone, tetrahydrofuran, toluene, hexane, ethyl acetate, cyclohexanone, methyl amyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxy propionate, ethyl 3-ethoxy propionate, tert-butyl acetate, tert-butyl propionate, propylene glycol mono-tert-butyl ether acetate, γ-butyrolactone, methyl isobutyl ketone, cyclopentyl methyl ether, etc.

As another operation, a method in which water or water-containing organic solvent is added to monomers or an organic solution of monomers to start hydrolysis reaction can be mentioned. The acid catalyst may be added to monomers or an organic solution of monomers, or added to water or water-containing organic solvent. The reaction temperature is preferably in the range of 0 to 100° C., and more preferably 10 to 80° C. A method for heating the mixture at 10 to 50° C. when water is dropped and then heating the mixture at 20 to 80° C. to age the mixture is preferable.

As the organic solvent, water-soluble solvent is preferable, and illustrative examples thereof include alcohols such as methanol, ethanol, 1-propanol, 2-propanol, 1-butanol, 2-butanol and 2-methyl-1-propanol; polyvalent alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate and propylene glycol monopropyl ether; acetone; acetonitrile; tetrahydrofuran, etc., and a mixture thereof.

The amount of the organic solvent to be used may be the same amount as above. A reaction mixture obtained is post-treated like the above-mentioned method to obtain a polymer.

The hydrolysis, condensation, or hydrolysis condensation for synthesizing the polymer can be also carried out using a base catalyst. Illustrative examples of the base catalyst used include methylamine, ethylamine, propylamine, butylamine, ethylenediamine, hexamethylene diamine, dimethylamine, diethylamine, ethylmethylamine, trimethylamine, triethylamine, tripropylamine, tributylamine, cyclohexylamine, dicyclohexylamine, monoethanolamine, diethanolamine, dimethyl monoethanolamine, monomethyl diethanolamine, triethanolamine, diazabicyclooctane, diazabicyclo cyclononene, diazabicycloundecene, hexamethylene tetraamine, aniline, N,N-dimethylaniline, pyridine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, calcium hydroxide, etc. The amount of the base catalyst to be used may be the same amount as the acid catalyst mentioned above.

The amount of water to be added for obtaining a polymer from these monomers is preferably in the range of 0.1 to 50 mol per 1 mol of a hydrolysable substituent group bonded to monomers. If the amount is 50 mol or less, a reaction device does not become excessively large, therefore it is economical.

The operation method of the reaction may be the same method as in the case of using the acid catalyst mentioned above.

As the organic solvent that can be added to the catalyst aqueous solution or can dilute the monomers, the same materials as in the case of using the acid catalyst are preferably used. Meanwhile, the amount of the organic solvent to be used is preferably 0 to 1,000 mL per 1 mol of the monomer. By using such an amount, a reaction vessel does not become excessively large, therefore it is economical.

Thereafter, if necessary, neutralization reaction of the catalyst is carried out and alcohol produced by hydrolysis condensation reaction is removed under reduced pressure to obtain a reaction mixture aqueous solution. The amount of an acid substance to be used for neutralization is preferably 0.1 to 2 equivalent weight, with respect to basic substance used as the catalyst. The acid substance may be any substance so long as it shows acidity in water.

Subsequently, it is preferable that by-products such as alcohol produced by hydrolysis condensation reaction be removed from the reaction mixture. The temperature for heating the reaction mixture and degree of vacuum may be the same temperature and degree of vacuum as in the case of using the acid catalyst mentioned above.

Next, the base catalyst used in hydrolysis condensation may be removed from the reaction mixture. The organic solvent to be used at the time of removing the base catalyst may be the same materials as in the case of using the acid catalyst mentioned above. Also, the base catalyst can be removed by using the same mixture of the water-soluble organic solvent and the slightly water-soluble organic solvent as in the case of using the acid catalyst mentioned above. Meanwhile, the mixing ratio of the water-soluble organic solvent and the slightly water-soluble organic solvent may be the same ratio as in the case of using the acid catalyst mentioned above.

Subsequently, the reaction mixture may be washed with neutral water. The washing method may be the same method as in the case of using the acid catalyst mentioned above.

A final solvent is added to the washed polymer, and solvent exchange operation is carried out under reduced pressure to obtain a polymer solution. Temperature and degree of vacuum of the solvent exchange operation may be the same temperature and degree of vacuum as in the case of using the acid catalyst mentioned above.

Also, at this time, a monovalent, divalent, or more polyvalent alcohol or ether compound having cyclic ether as a substituent may be added as a stabilizer similarly to the case where the acid catalyst is used. Further, the polymer solution is preferably made with a concentration of 0.1 to 20% by mass.

Preferable examples of the final solvent added to the polymer include alcohol solvent, and particularly monoalkyl ether derivatives of ethylene glycol, diethylene glycol, triethylene glycol, propylene glycol, dipropylene glycol, etc. Preferable examples thereof include propylene glycol monomethyl ether, ethylene glycol monomethyl ether, propylene glycol monoethyl ether, ethylene glycol monoethyl ether, propylene glycol monopropyl ether, ethylene glycol monopropyl ether, etc.

In addition, if these solvents are a main solvent, a non-alcoholic solvent may be added thereinto as an adjuvant solvent. As the adjuvant solvent, the same solvent as in the case of using the acid catalyst may be used.

As another operation, a method in which water or water-containing organic solvent is added to monomers or an organic solution of monomers to start hydrolysis reaction can be mentioned. The base catalyst may be added to monomers or an organic solution of monomers, or added to water or water-containing organic solvent. The reaction temperature is preferably in the range of 0 to 100° C., and more preferably 10 to 80° C. A method for heating the mixture at 10 to 50° C. when water is dropped and then heating the mixture at 20 to 80° C. to age the mixture is preferable.

As the organic solvent, water-soluble solvent is preferable, and illustrative examples thereof include alcohols such as methanol, ethanol, 1-propanol, 2-propanol, 1-butanol, 2-butanol and 2-methyl-1-propanol; polyvalent alcohol condensate derivatives such as propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate and propylene glycol monopropyl ether; acetone; acetonitrile; tetrahydrofuran, etc., and a mixture thereof.

The amount of the organic solvent to be used may be the same amount as above. A reaction mixture obtained is post-treated like the above-mentioned method to obtain a polymer.

The molecular weight of the polymer thus obtained can be adjusted not only by selecting monomers, but also controlling reaction conditions during polymerization. The molecular weight of the obtained polymer is not particularly restricted, but the weight average molecular weight of the polymer is preferably 100,000 or less, more preferably in the range of 200 to 50,000, and much more preferably 300 to 30,000. If the weight average molecular weight is 100,000 or less, generation of foreign matters and coating spots can be suppressed. Meanwhile, the above weight average molecular weight is obtained as data, in terms of polystyrene as a reference material, by means of gel-permeation chromatography (GPC) using refractive index (RI) detector as a detector and tetrahydrofuran as an eluent.

(B) Organic Compound Having Two or More Hydroxyl Groups or Carboxyl Groups Per One Molecule Component (B) contained in the composition for forming a coating type BPSG film used in the present invention is an organic compound having two or more hydroxyl groups or carboxyl groups per one molecule. Examples of the organic compound include compounds shown below.

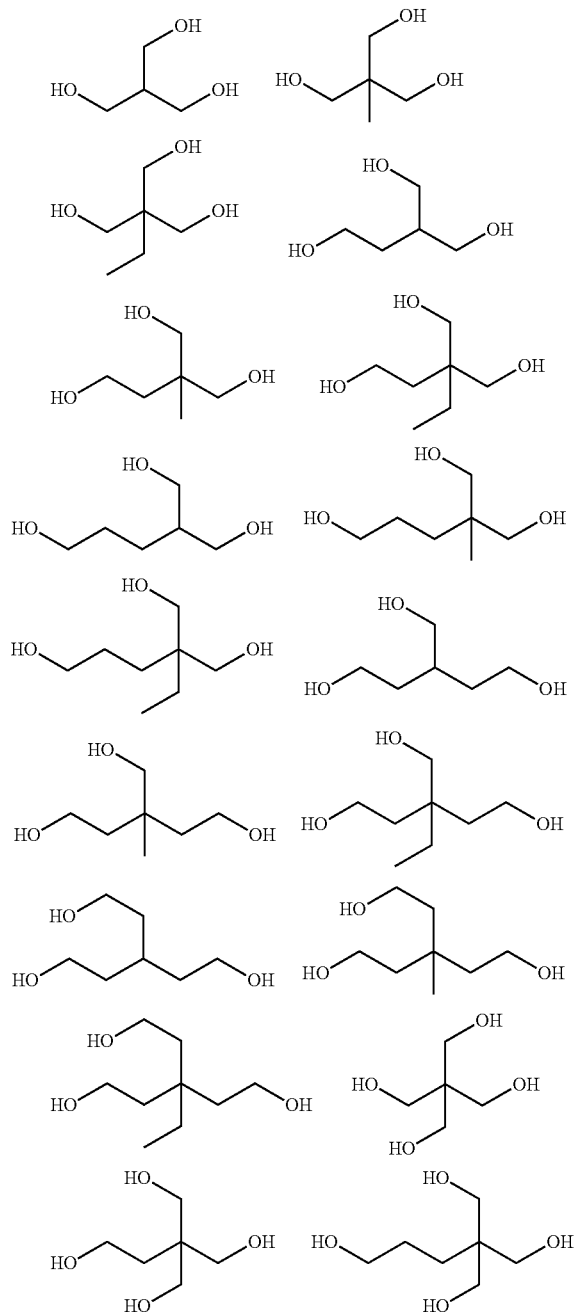

-continued

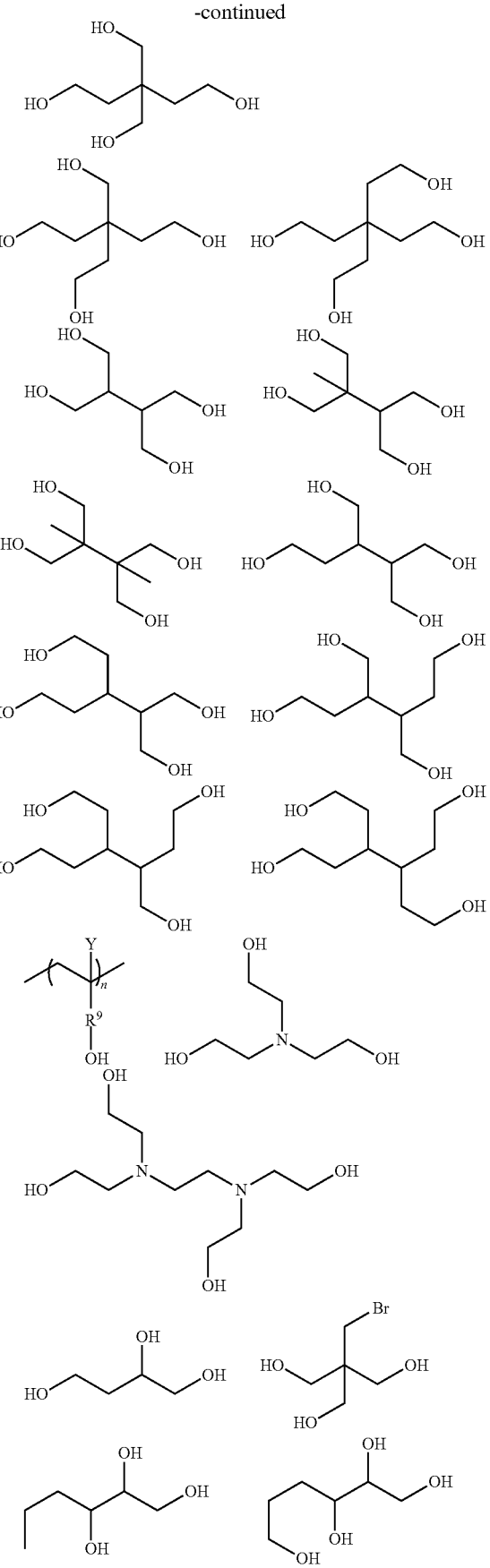

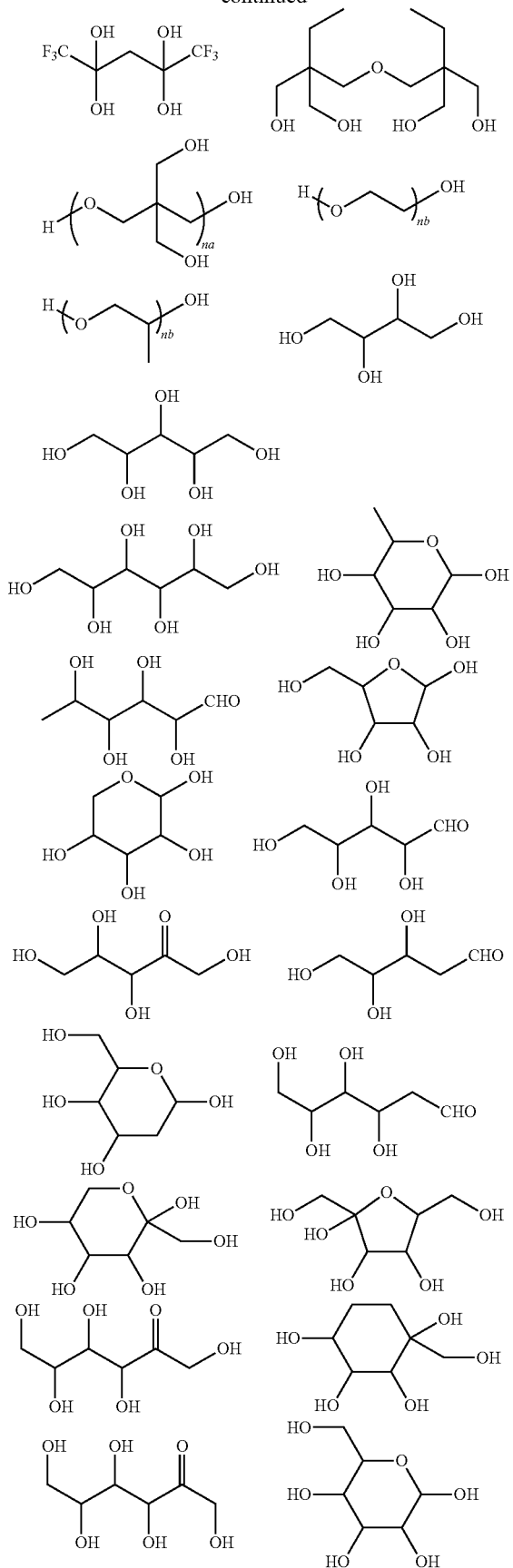
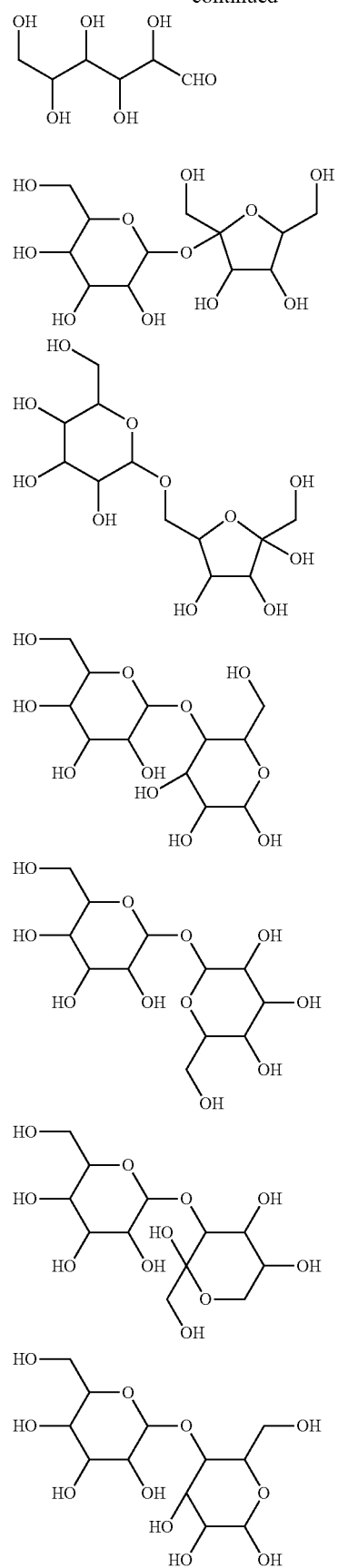

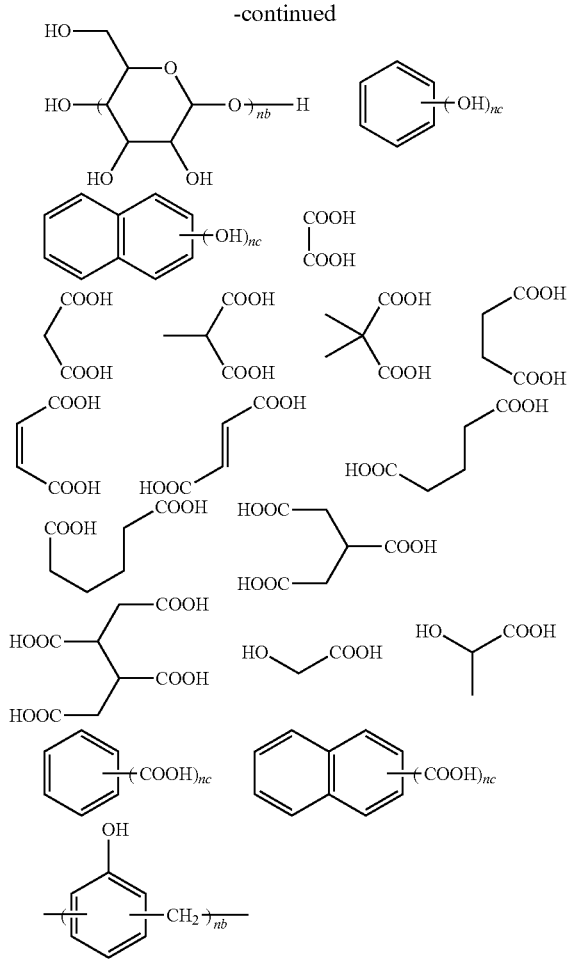

Y in the above structural formulae represents a hydrogen atom, a methyl group or a hydroxymethyl group, $R^9$ represents a methylene group, a carbonyl group or a phenylene group, and "n" is an integer of 3 or more and less than 100. "na" represents a natural number of 1 to 3, "nb" represents a natural number of 1 or more, and "nc" represents a natural number of 2 to 4. In the above structural formulae, an enantiomer and a diastereomer can exist, and each of the structural formulae mentioned above represents all of these stereoisomers. These stereoisomers may be used solely, or may be used as a mixture.

By adding such an organic compound, collapse of the BPSG film is promoted at the time of wet etching, whereby peeling becomes easy. The organic compound may be used one kind alone or two or more kinds in combination. The organic compound of Component (B) needs to be added with a content of 25 parts by mass or more, preferably in the range of 25 to 50 parts by mass, with respect to 100 parts by mass of the base polymer of Component (A). The above amount to be added enables the BPSG film to be easily removed by wet etching.

(C) Silicon-Containing Compound

The composition for forming a coating type BPSG film used in the patterning process of the present invention preferably further contains, in addition to the above-mentioned Component (A) and Component (B), one or more members selected from one or more silicon compounds represented by the following general formula (C-1), a hydrolysate, a condensate and a hydrolysis condensate thereof, as Component (C), $$R^{1C}{}_{c1}R^{2C}{}_{c2}R^{3C}{}_{c3}Si(OR^{0C})_{(4-c1-c2-c3)} \quad (C-1)$$

wherein, $R^{0C}$ represents a hydrocarbon group having 1 to 6 carbon atoms; $R^{1C}$, $R^{2C}$ and $R^{3C}$ each represent a hydrogen atom or an organic group having 1 to 30 carbon atoms; and c1, c2 and c3 are each 0 or 1, and satisfy $1 \leq c1+c2+c3 \leq 3$.

The silicon compound represented by the general formula (C-1) may be mentioned the same materials as the illustrative examples of the silicon compounds represented by the general formulae (A-1-1) to (A-1-3) among the above-mentioned Component (A).

Also, it is preferable that one or more of $R^{1C}$, $R^{2C}$ and $R^{3C}$ in the general formula (C-1) is/are an organic group(s) having a hydroxyl group or a carboxyl group each substituted by an acid-labile group.

Examples of the compound represented by the general formula (C-1) include those having the following structures whose silicon is bonded to two or three methoxy groups, ethoxy groups, propoxy groups or butoxy groups, as hydrolysable groups. Meanwhile, in the following structural formulae, (Si) is described to show the bonding sites to the Si.

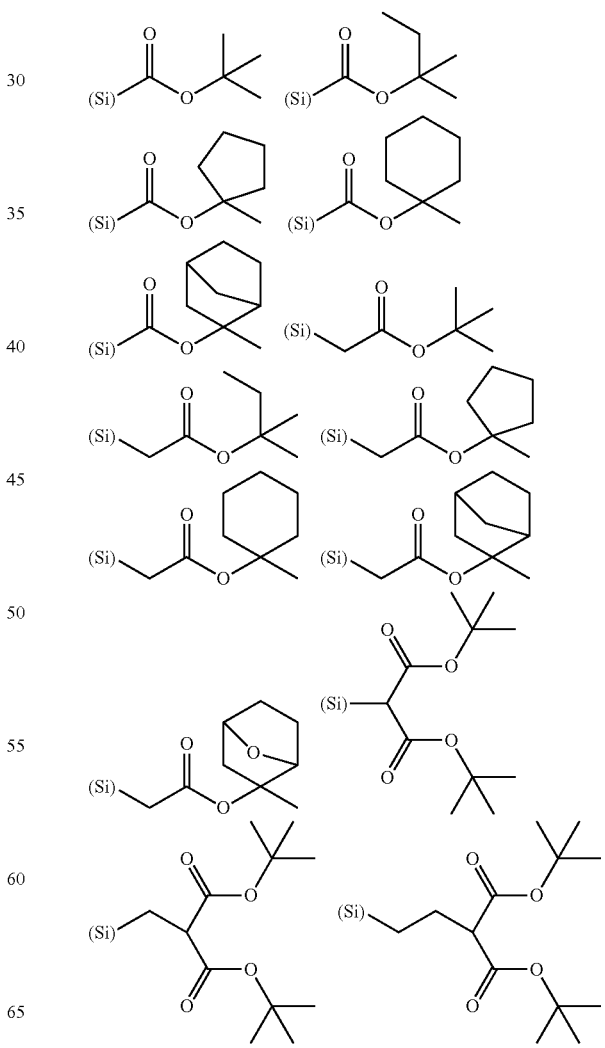

-continued
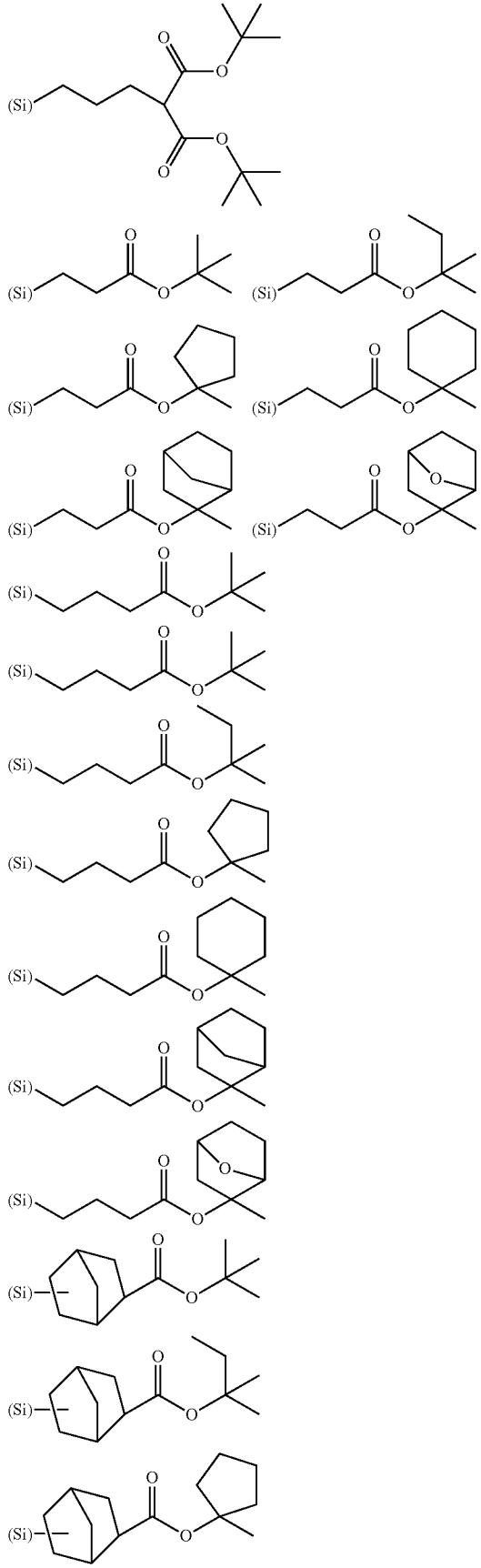
-continued
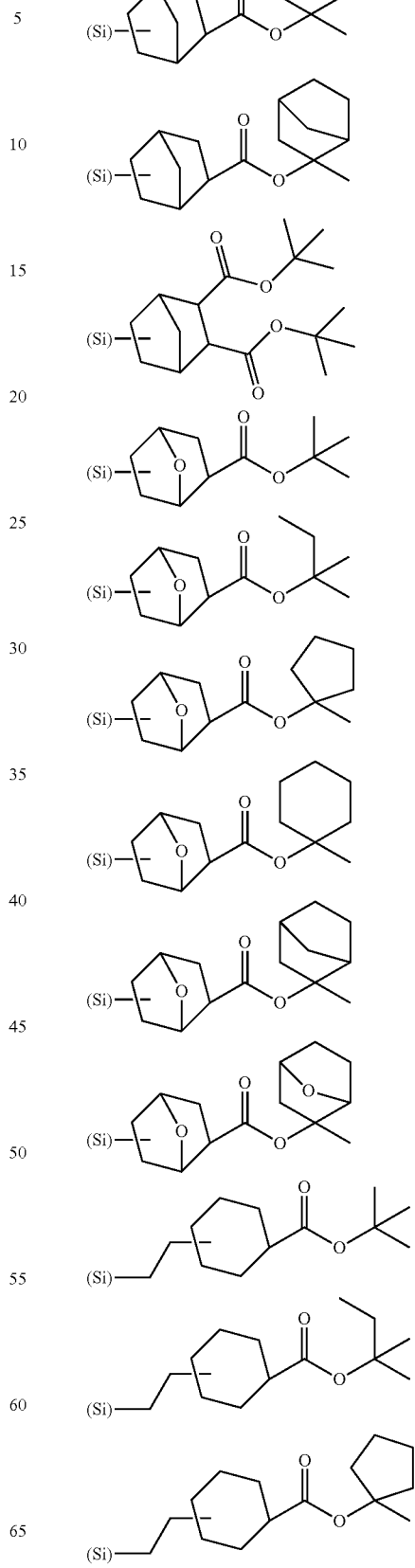

-continued
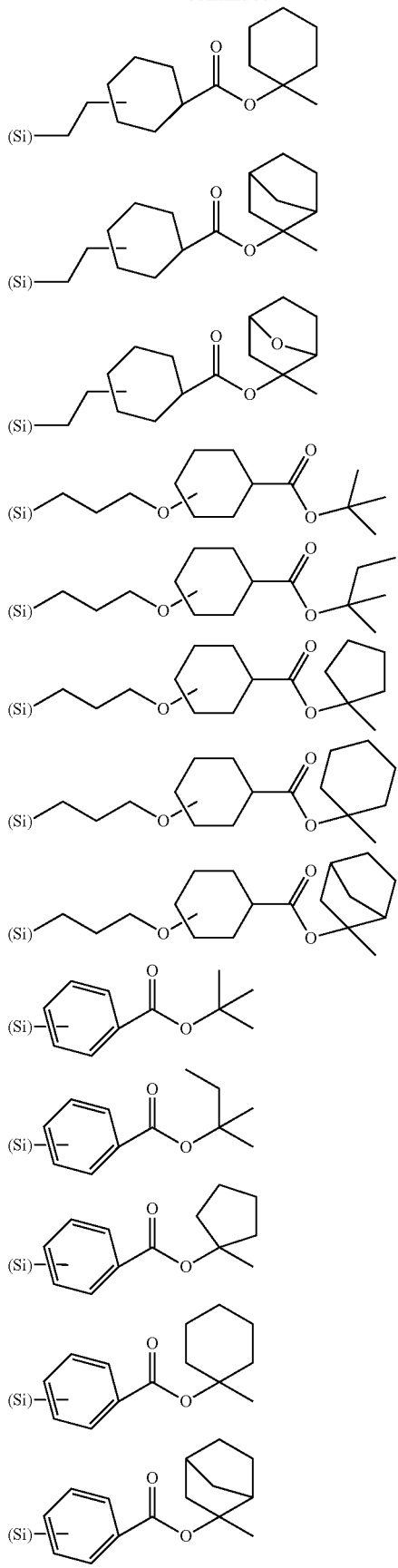
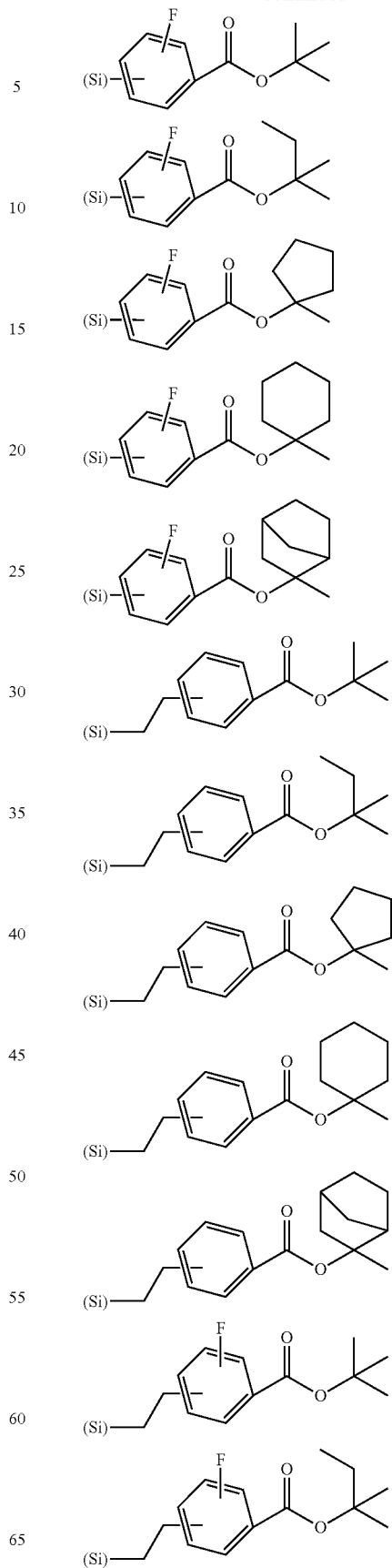

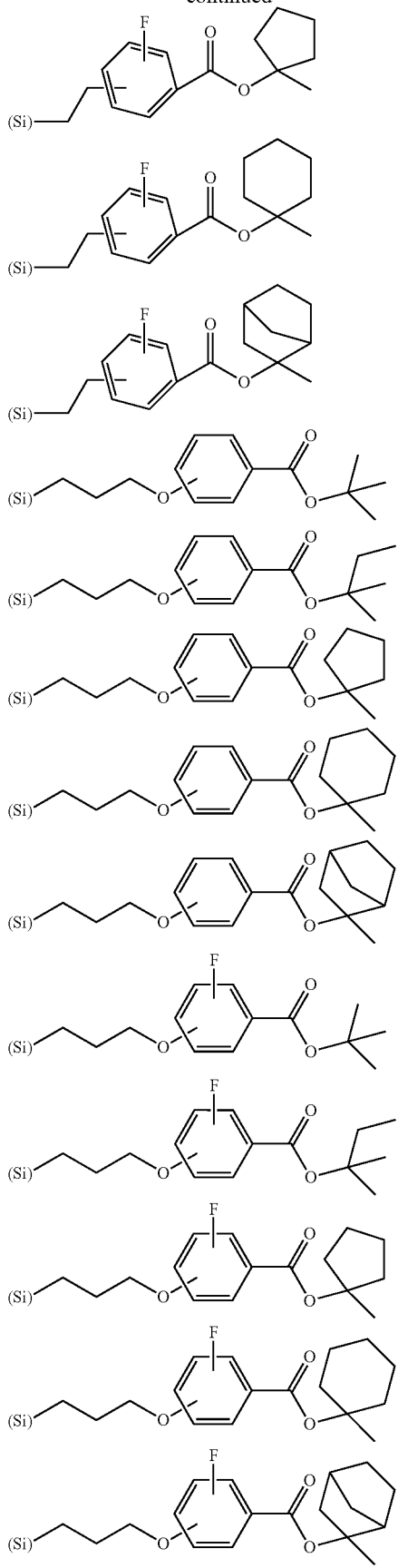
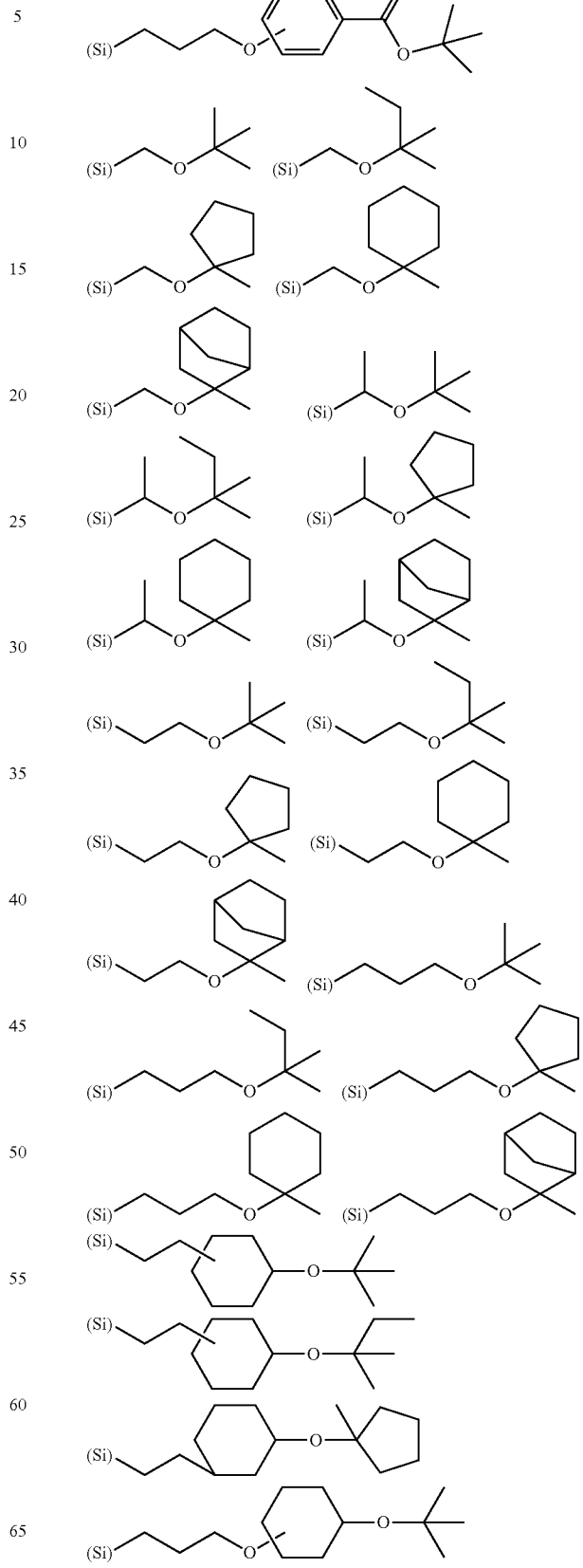

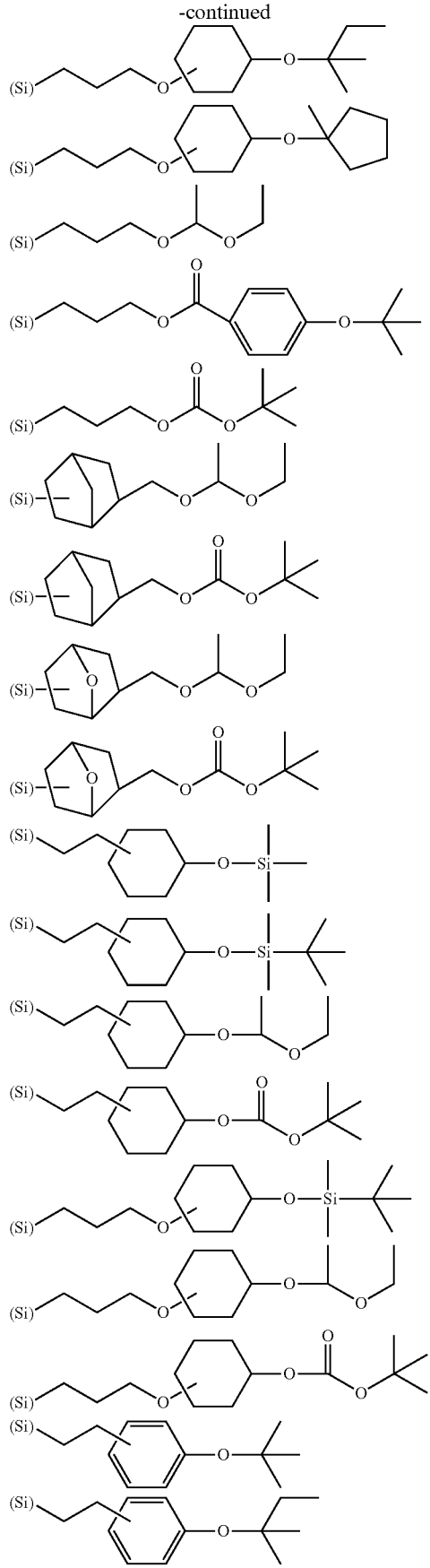
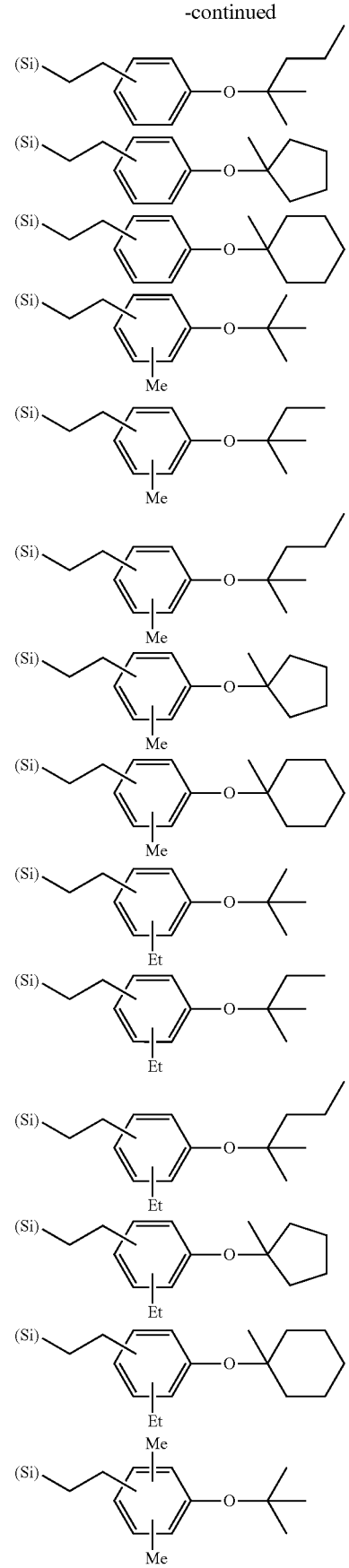

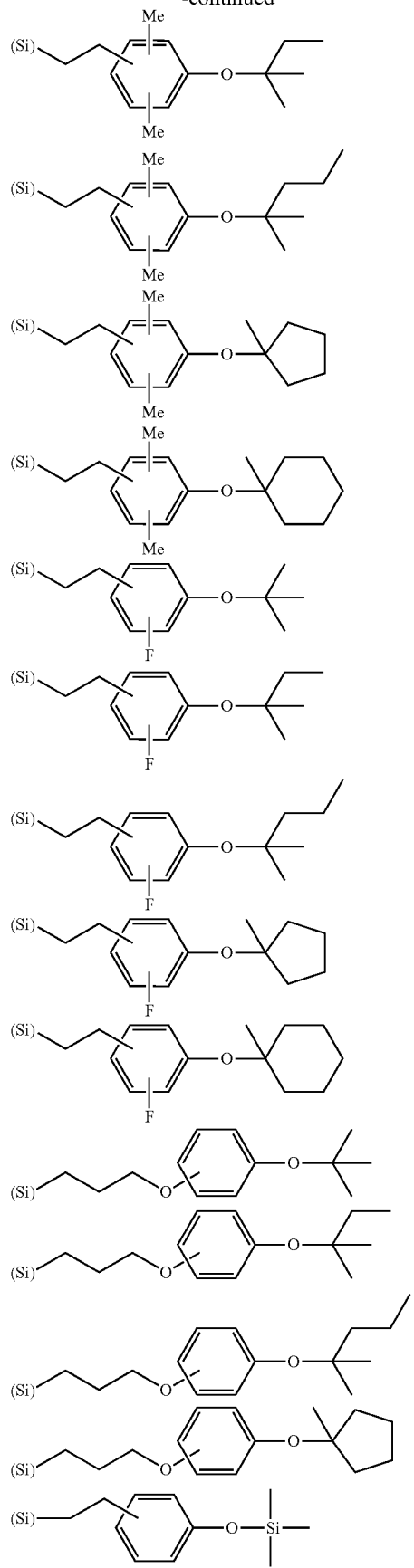
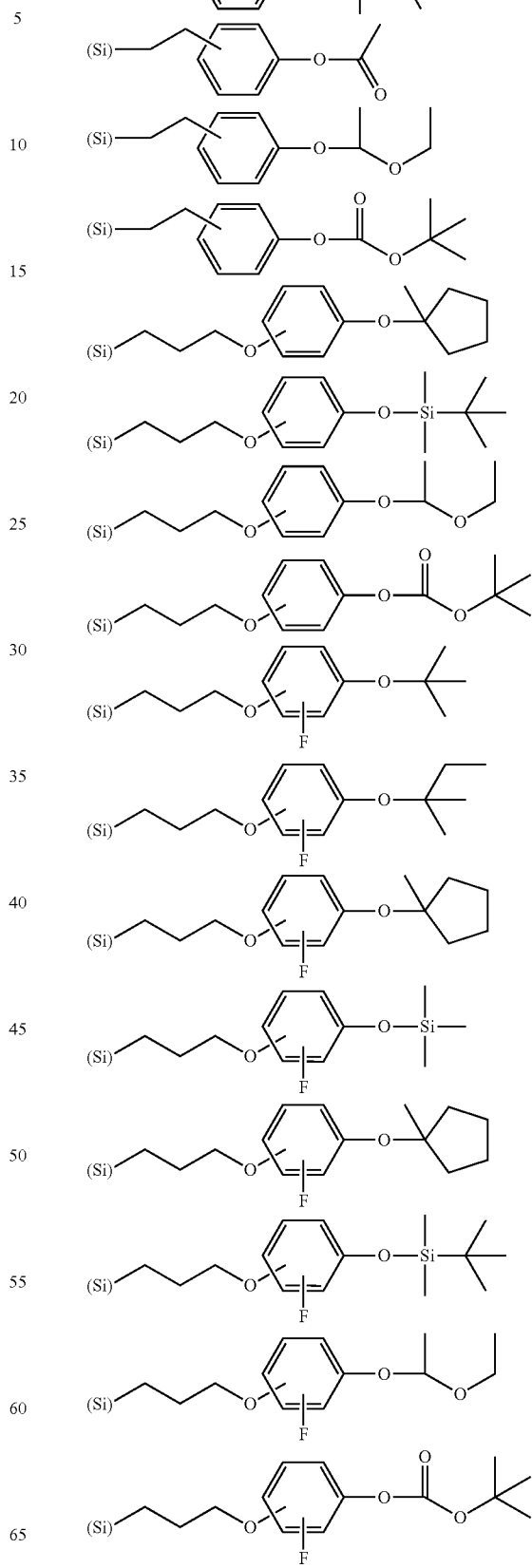

-continued
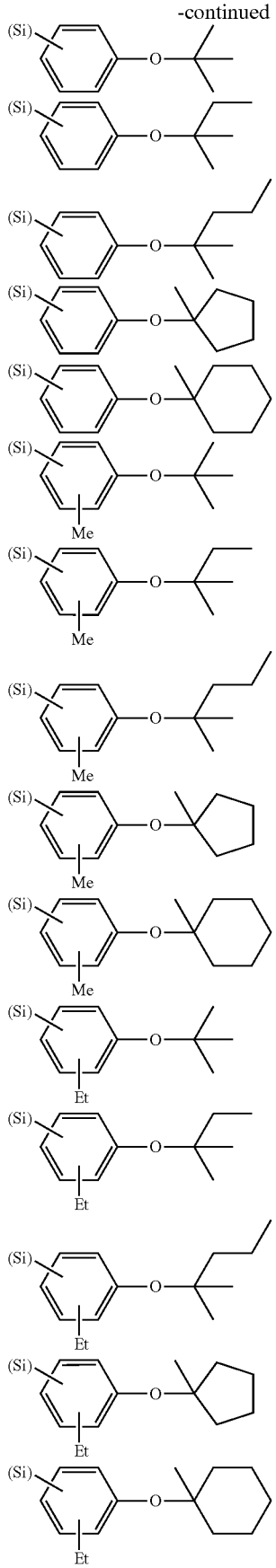
-continued
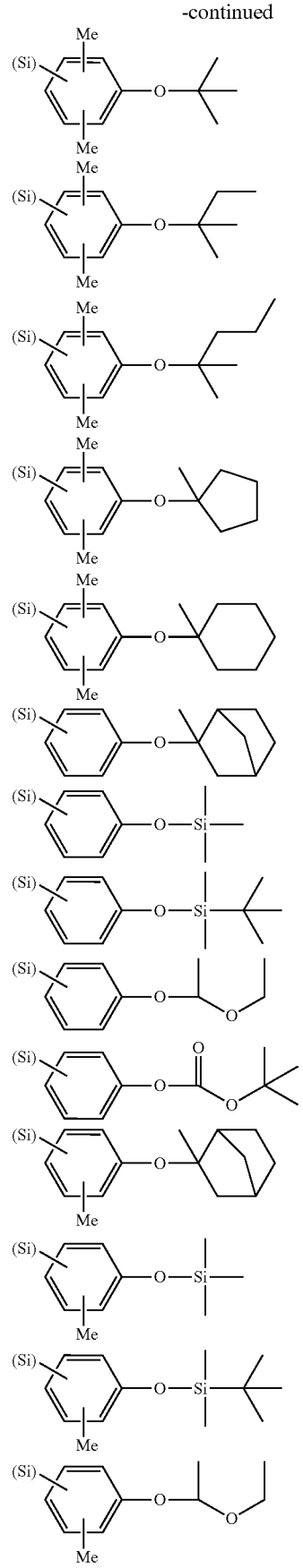

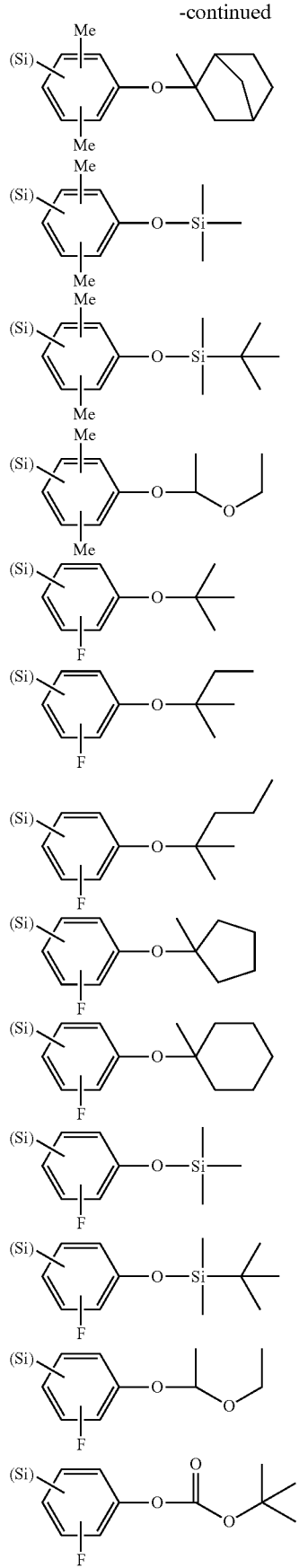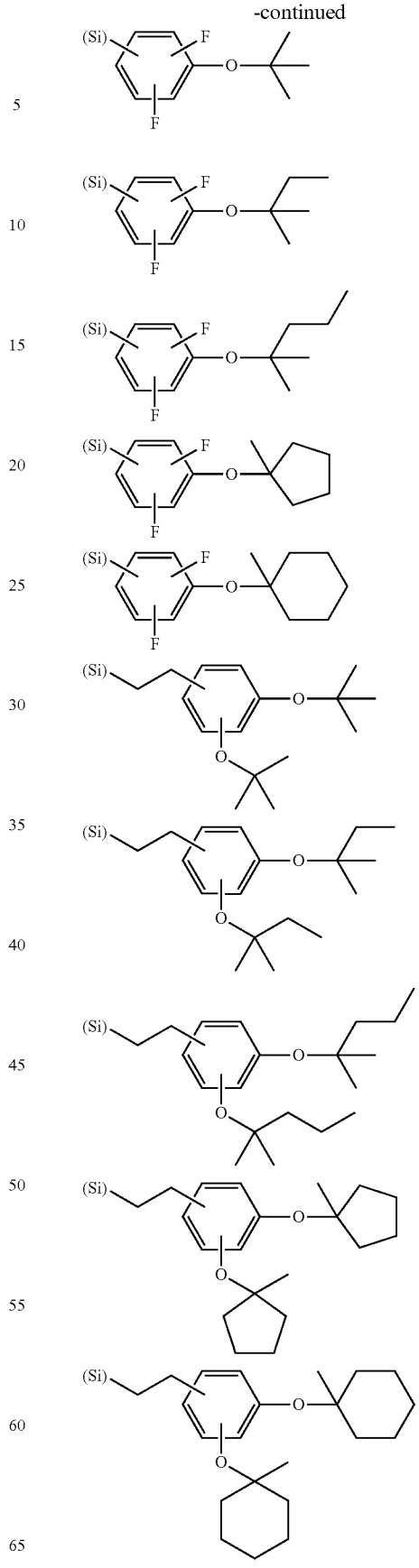

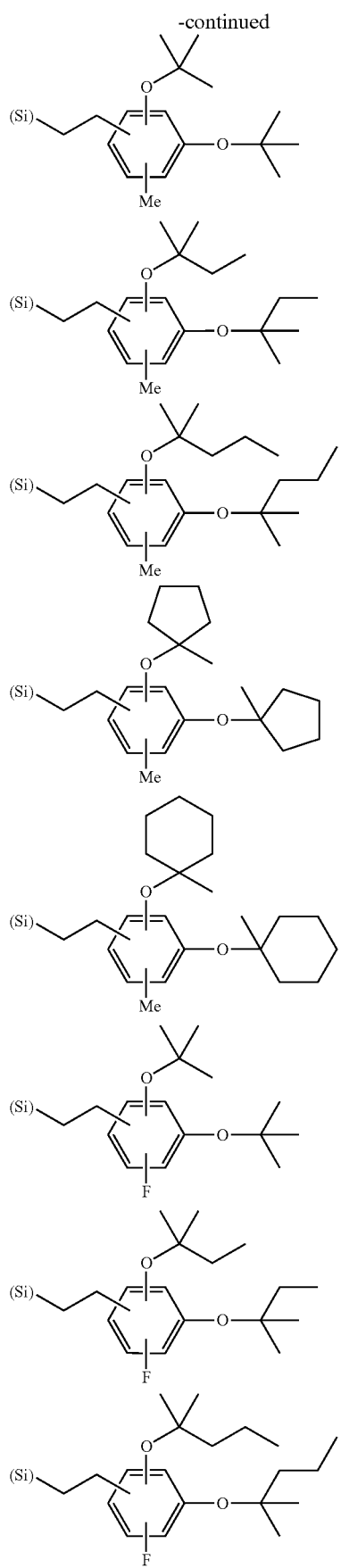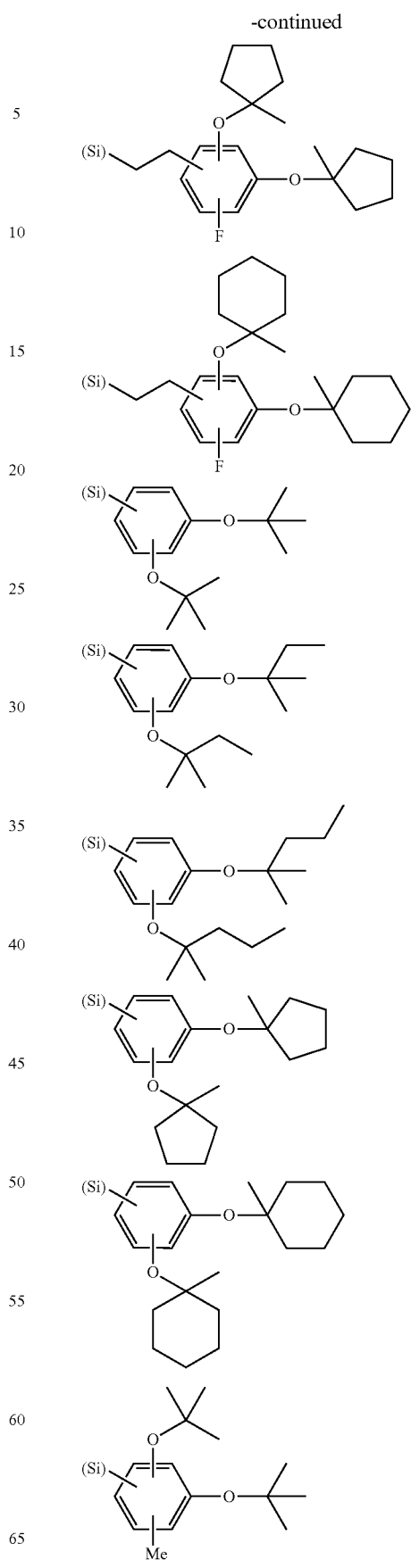

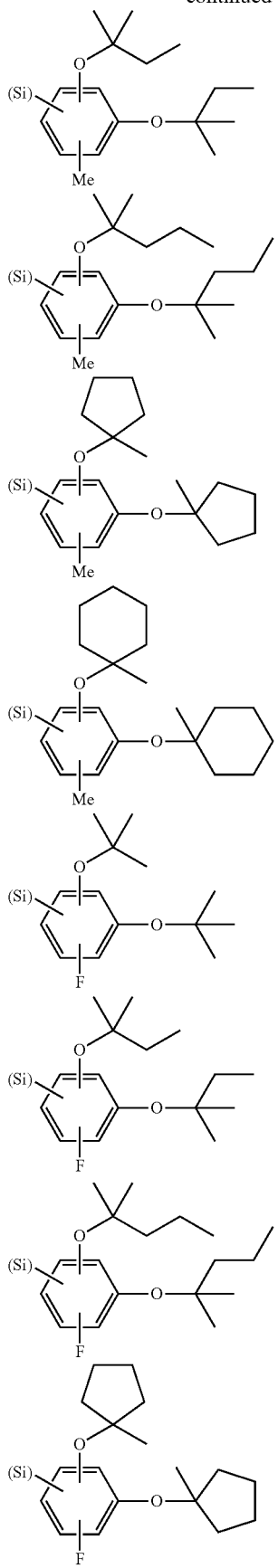

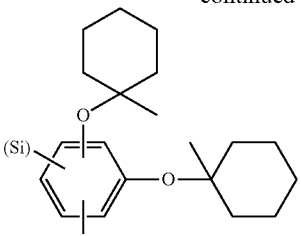

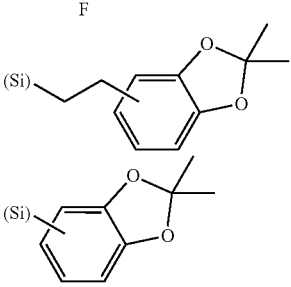

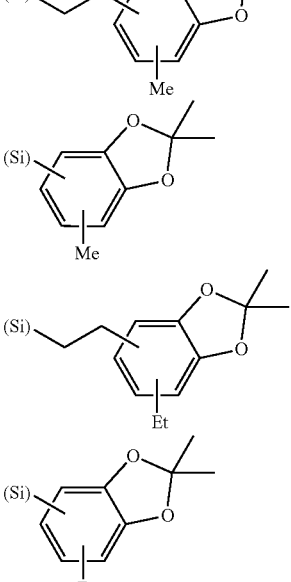

By using such Component (C) in addition to Component (A) and Component (B), a resist under layer film in which adhesiveness to the photoresist pattern is improved, and causing no collapse of the pattern even in fine pattern, can be obtained.

Further, Component (C) may include one or more members selected from one or more silicon compounds represented by the general formulae (A-1-1) to (A-1-4), one or more phosphorus compounds represented by the general formulae (A-2-1) to (A-2-6), and one or more boron compounds represented by the general formulae (A-3-1) to (A-3-3) each singly, a mixture thereof, a hydrolysate, a condensate and a hydrolysis condensate thereof.

Incidentally, hydrolysis, condensation or hydrolysis condensation reaction in Component (C) can be carried out in the same manner as in the hydrolysis, condensation or hydrolysis condensation reaction of Component (A) mentioned above.

[Other Additives]

A thermal crosslinking accelerator may be added to the composition for forming a coating type BPSG film used in the present invention. As the thermal crosslinking accelerator, those described in Japanese Patent Laid-Open Publication No. 2007-302873, a phosphoric acid salt compound and a boric acid salt compound can be mentioned. Examples of the phosphoric acid salt compound include an ammonium salt such as ammonium phosphate, tetramethylammonium phosphate and tetrabutylammonium phosphate; and a sulfonium salt such as triphenylsulfonium phosphate. Also, examples of the boric acid salt compound include an ammonium salt such as ammonium borate, tetramethylammonium borate and tetrabutylammonium borate; and a sulfonium salt such as triphenylsulfonium borate. The above-mentioned thermal crosslinking accelerator can be used one kind alone or two or more kinds in combination. Also, the amount of the thermal crosslinking accelerator to be added is preferably in the range of 0.01 to 50 parts by mass, and more preferably 0.1 to 40 parts by mass, based on 100 parts by mass of the polymer of Component (A).

To improve stability of the composition for forming a coating type BPSG film used in the present invention, a monovalent, divalent or more polyvalent organic acid having 1 to 30 carbon atoms may be added thereinto. Preferable examples of the organic acid include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, diethylmalonic acid, diethylmalonic acid, succinic acid, methylsuccinic acid, glutaric acid, adipic acid, itaconic acid, maleic acid, fumaric acid, citraconic acid, citric acid, etc. Especially, oxalic acid, maleic acid, formic acid, acetic acid, propionic acid, citric acid, and the like are preferable. To keep stability, mixture of two or more kinds of the organic acids may be used. The amount thereof to be added is preferably in the range of 0.001 to 25 parts by mass, more preferably 0.01 to 15 parts by mass, and much more preferably 0.1 to 5 parts by mass, based on 100 parts by mass of silicon which is contained in the composition. Alternatively, the organic acid may be added such that pH of the composition becomes preferably $0 \leq pH \leq 7$, more preferably $0.3 \leq pH \leq 6.5$, and much more preferably $0.5 \leq pH \leq 6$.

Also, a monovalent, divalent, or more polyvalent alcohol or ether compound having cyclic ether as a substituent may be added to the composition for forming a coating type BPSG film used in the present invention as a stabilizer. By adding the stabilizer, stability of the polymer can be improved. As the stabilizer, those described in the paragraphs (0180) to (0184) of Japanese Patent Laid-Open Publication No. 2009-126940 can be mentioned.

Water may be added to the composition for forming a coating type BPSG film used in the present invention. When water is added thereinto, the polymer is hydrated whereby improving a lithography performance. Water content in the solvent component of the composition for forming a coating type BPSG film is preferably more than 0% and less than 50% by mass, more preferably in the range of 0.3 to 30% by mass, and much more preferably 0.5 to 20% by mass. The amount of all solvents including water is preferably in the range of 100 to 100,000 parts by mass, and more preferably 200 to 50,000 parts by mass, based on 100 parts by mass of the polymer of Component (A). By adding in such an amount, lithography performance can be improved, and uniformity of the coated film does not tend to be deteriorated, thereby causing of eye holes can be suppressed.

A photo-acid generator may be added to the composition for forming a coating type BPSG film used in the present invention. As the photo-acid generator, those described in the paragraphs (0160) to (0179) of Japanese Patent Laid-Open Publication No. 2009-126940 can be mentioned.

A surfactant may be added to the composition for forming a coating type BPSG film used in the present invention, if necessary. As the surfactant, those described in the paragraph (0185) of Japanese Patent Laid-Open Publication No. 2009-126940 can be mentioned.

Also, a phosphoric acid or a boric acid may be added to the composition for forming a coating type BPSG film used in the present invention, if necessary.

In the step (II), the BPSG film is formed on the under layer film by using, for example, the composition for forming a coating type BPSG film as mentioned above. The BPSG film can be formed by the spin coating method, etc., as well as a later-explained resist upper layer film and so on. After spin coating, it is desired to be baked for evaporating the solvent, preventing from mixing with the resist upper layer film, and promoting the cross-linking reaction. The baking temperature is preferably in the range of 50 to 500° C., and the heating time is preferably in the range of 10 to 300 seconds. Particularly preferable temperature range is 400° C. or less for reducing heat damage to the devices, though it is depending on the structure of the devices to be fabricated.

Such a BPSG film shows good adhesiveness to the resist upper layer film pattern, so that no collapse of the pattern is caused even if a fine pattern is formed. Moreover, the BPSG film shows high etching selectivity to both of the resist upper layer film pattern formed over the BPSG film and the under layer film (i.e. the organic under layer film or the CVD hard mask) formed under the BPSG film. Therefore, the resist upper layer film pattern can be transferred to the under layer film by dry etching without generating a difference in size conversion by optimizing the combination of the under layer film. Moreover, the BPSG film can be easily removed by SC1 even if the BPSG film has been modified by the dry etching process of the under layer film.

<(III) Step of Forming a Resist Upper Layer Film on the BPSG Film>

In the patterning process of the present invention, next, as step (III), a resist upper layer film is formed on the BPSG film formed in the step (II).

[Resist Upper Layer Film]

The composition for forming a resist upper layer film may be appropriately selected depending on the method for forming the pattern with the resist upper layer film. For example, when lithography using light with a wavelength of 300 nm or less or EUV light is carried out, a chemically amplified photoresist film material may be used as the composition for forming a resist upper layer film. Such a photoresist film material may be exemplified by a material, in which a photoresist film is formed and exposed, and then, the exposed portion is dissolved by using an alkaline developer to form a positive pattern, or the unexposed portion is dissolved by using a developer consisting of an organic solvent to form a negative pattern.

Also, when the lithography is carried out by using an ArF excimer laser light as the light with a wavelength of 300 nm or less, any material can be used as the composition for forming a resist upper layer film so long as it is a usual resist composition for ArF excimer laser light. As such a resist composition for the ArF excimer laser light, many candidates have been well-known. When the well-known resins are roughly classified, there are a poly(meth)acrylic series, a COMA (Cyclo Olefin Maleic Anhydride) series, a COMA-(meth)acrylic hybrid series, an ROMP (Ring Opening Metathesis Polymerization) series, a polynorbonene series, etc. Among them, the resist composition using the poly (meth)acryl series resin assures etching resistance thereof by introducing an alicyclic skeleton at the side chain, so that its resolution performance is excellent as compared with that of the other series resin, whereby it can be preferably used.

The resist upper layer film can be formed by the spin coating method, etc., similar to the formation of the BPSG film mentioned above.

<(IV) Step of Forming a Pattern to the Resist Upper Layer Film>

In the patterning process of the present invention, next, as step (IV), a pattern is formed to the resist upper layer film formed in the step (III). The pattern formation of the resist upper layer film is preferably carried out by any of a lithography method using light with a wavelength of 300 nm or less or EUV light, an electron beam direct drawing method, a directed self-assembly method and a nano-imprinting lithography method. By using these methods, a fine pattern can be formed to the resist upper layer film.

<(V) Step of Transferring the Pattern to the BPSG Film>

In the patterning process of the present invention, next, as step (V), the pattern is transferred to the BPSG film by dry etching using the resist upper layer film having the pattern formed in the step (IV) as a mask. The dry etching is not particularly limited, but preferably carried out by using CF type gas such as $CF_4$ and $CHF_3$ as an etching gas.

<(VI) Step of Transferring the Pattern to the Under Layer Film>

In the patterning process of the present invention, next, as step (VI), the pattern is transferred to the under layer film by dry etching using a gas including $N_2$, $H_2$ or both and the BPSG film having the pattern formed in the step (V) as a mask.

In the dry etching process of the step (VI), a gas including $N_2$, $H_2$ or both is used. The damage to the substrate to be processed can be suppressed by using such a gas. The dry etching rate can be adjusted by appropriately determining $N_2$ ratio. Therefore, $N_2$ ratio may be adjusted such that a desired under layer film pattern is obtained. When both of $N_2$ and $H_2$ are used, the ratio of $N_2$ to $H_2$ is preferably in the range of 1:10 to 10:1, and more preferably 1:5 to 5:1.

By the step (VI), the under layer film pattern, i.e. the mask pattern for processing the substrate to be processed is formed. In this step, however, a residue of the BPSG film still remains on the formed under layer film pattern, as described above. If the substrate to be processed in this state is processed, yield of device production is lowered. Accordingly, in the patterning process of the present invention, wet etching (cleaning) of step (VII) is performed after forming the under layer film pattern to remove the residue of the BPSG film.

<(VII) Step of Removing a Residue of the BPSG Film Remaining on the Under Layer Film Having the Formed Pattern>

In the patterning process of the present invention, next, as step (VII), a residue of the BPSG film remaining on the under layer film having the formed pattern is removed by wet etching using an ammonia aqueous solution containing hydrogen peroxide.

In the wet etching of the step (VII), an ammonia aqueous solution containing hydrogen peroxide, which is called as SC (Standard Clean) 1 and has been generally used in the semiconductor manufacturing process, is used as a peeling solution which does not cause damage to the substrate to be processed and the under layer film. In general, if a silicon-containing resist under layer film is used as a mask to process an under layer film just under the same by dry etching, the silicon-containing resist under layer film is modified by the dry etching, thereby the wet-etching rate of the silicon-containing resist under layer film is lowered. By contrast, the BPSG film used in the present invention can be easily removed by SC1 even if it has been modified by the dry etching process, because the BPSG film has a high wet etching rate with respect to SC1.

The ratio of $NH_4OH:H_2O_2:H_2O$ may be any ratio, and appropriately selected so as not to cause damage to the substrate to be processed and the under layer film which are used in the patterning process of the present invention. The preferable ratio of $NH_4OH:H_2O_2:H_2O$ is in the range of 0.1-10:0.1-10:3-100. Also, the wet etching may be carried out only by preparing a peeling solution usually at 0° C. to 90° C., preferably at 5° C. to 70° C., and dipping the substrate to be treated. Alternatively, the BPSG film can be easily removed by the conventional manner such as spraying a peeling solution onto a surface of the wafer, and coating a peeling solution while rotating the wafer.

In this manner, the residue of the BPSG film can be easily removed by wet etching without causing damage to the substrate to be processed and the under layer film (i.e. the organic under layer film or the CVD hard mask).

Moreover, in the wet etching of the step (VII), the residue of the BPSG film on the under layer film having the formed pattern (the under layer film pattern) is preferably removed such that a silicon content on the under layer film pattern is 5 atomic percent or less when X-ray photoelectron spectroscopy (XPS) is performed on the under layer film pattern.

Here, the silicon content on a fine pattern that is to be processed for actual semiconductor apparatus manufacture cannot be measured by XPS in fact. Therefore, samples having an under layer film which has enough surface area to be subjected to XPS analysis are separately prepared to evaluate the silicon content. More specifically, the silicon content may be evaluated by preparing a wafer subjected to the steps of: forming an under layer film, a BPSG film and a resist upper layer film on the wafer sequentially; forming a pattern to the resist upper layer film; transferring the pattern to the BPSG film and the under layer film; and performing wet etching; by the same procedures as in the patterning process of the present invention, and then by performing XPS analysis with respect to the wafer thus prepared. Alternatively, a wafer may be prepared by forming an under layer film and a BPSG film on the wafer sequentially, and performing dry etching for processing the under layer film and subsequent wet etching to perform XPS analysis with respect to the wafer thus prepared.

On the under layer film, the residual amount of the BPSG film can be accurately evaluated because silicon derived from the substrate (wafer) is not detected thereon. Thus, by performing XPS analysis in such a manner, the cleaning degree of the mask pattern after wet etching using SC1 can be evaluated according to the actual semiconductor manufacturing process, thereby one can determine whether a subsequent processing of the substrate to be processed can be performed. In addition, by adjusting the wet etching conditions such that the silicon content after wet etching is 5 atomic percent or less as measured by XPS analysis, the residue of the BPSG film can be removed more efficiently and reliably.

Here, the phrase "the silicon content on the under layer film is 5 atomic percent or less" means that the number of silicon atoms is 5% or less based on the number of all atoms contained in the under layer film and the residue of the BPSG film of the sample. That is, the less silicon content detected, the less residue of the BPSG film remains. Accordingly, wet etching of the step (VII) is preferably performed such that the silicon content is 5 atomic percent or less, more preferably 3 atomic percent or less, and much more preferably 1 atomic percent or less, as measured by XPS analysis.

By removing the residue of the BPSG film by wet etching as mentioned above, the under layer film pattern on which the residue of the BPSG film is sufficiently removed can be obtained. Such an under layer film pattern can be preferably used as a mask pattern for processing the substrate to be processed. When a substrate to be processed is processed by using the mask pattern formed by the patterning process of the present invention, it is preferably processed by dry etching using an etching gas such as $N_2/H_2$ mixed gas, but not particular restricted thereto.

As mentioned above, the patterning process of the present invention can form a fine mask pattern (i.e. an under layer film pattern) on the substrate to be processed by the multi-layer resist method using the BPSG film as the resist under layer film. Moreover, since the BPSG film shows good adhesiveness to the resist upper layer film pattern, no collapse of the pattern is caused even if a fine pattern is formed. Moreover, the BPSG film shows high dry etching selectivity to both of the resist upper layer film pattern formed over the BPSG film and the under layer film (i.e. the organic under layer film or the CVD hard mask) formed under the BPSG film, so that the resist upper layer film pattern can be transferred to the under layer film by dry etching without generating a difference in size conversion. Moreover, by using the above-mentioned BPSG film as the resist under layer film, the residue of the BPSG film on the under layer film pattern can be easily removed by wet etching using an ammonia aqueous solution containing hydrogen peroxide, which does not cause damage to the substrate to be processed and the under layer film. Therefore, the under layer film pattern after wet etching can be made clean enough to process the substrate to be processed, whereby yield of device production can be improved. Furthermore, using a gas including $N_2$, $H_2$ or both in dry etching for transferring the pattern to the under layer film, can suppress damage to the substrate to be processed.

EXAMPLES

Hereinafter, the present invention will be specifically described with reference to Synthesis Examples, Examples and Comparative Examples, but it is not restricted thereto. "%" in the following Examples represents "% by mass" and the molecular weight is measured by GPC.

Synthesis of Component (A)

Synthesis Example (A1)

To a mixture comprising 120 g of methanol, 1 g of 70% nitric acid and 60 g of deionized water was added a mixture comprising 5.0 g of phenyl trimethoxy silane [Monomer 100], 17.0 g of methyl trimethoxy silane [Monomer 101], 45.7 g of tetramethoxy silane [Monomer 102], 6.3 g of tributyl phosphate [Monomer 112] and 2.6 g of trimethyl borate [Monomer 115], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 270 g (polymer concentration: 12%) of a PGEE solution containing the base polymer (A1). When the molecular weight of the product in terms of the polystyrene was measured, then it was Mw=2,500.

Synthesis Examples (A2) and (A3)

Synthesis Examples (A2) and (A3) were conducted by using monomers shown in the following Table 1 under the same conditions as in Synthesis Example (A1) to prepare PGEE solutions of the base polymers (A2) and (A3), respectively.

Synthesis Example (A4)

To a mixture comprising 120 g of methanol, 3.0 g of 85% phosphoric acid aqueous solution (equivalent to 2.5 g of phosphoric acid [Monomer 113]), 1 g of 70% nitric acid and 60 g of deionized water was added a mixture comprising 5.0 g of phenyl trimethoxy silane [Monomer 100], 10.2 g of methyl trimethoxy silane [Monomer 101], 53.3 g of tetramethoxy silane [Monomer 102] and 2.6 g of trimethyl borate [Monomer 115], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 290 g (polymer concentration: 11%) of a PGEE solution containing the base polymer (A4). When the molecular weight of the product in terms of the polystyrene was measured, then it was Mw=3,000.

Synthesis Example (A5)

To a mixture comprising 120 g of methanol, 1.5 g of boric acid [Monomer 116], 1 g of 70% nitric acid and 60 g of deionized water was added a mixture comprising 5.0 g of phenyl trimethoxy silane [Monomer 100], 17.0 g of methyl trimethoxy silane [Monomer 101], 45.7 g of tetramethoxy silane [Monomer 102] and 6.3 g of tributyl phosphate [Monomer 112], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 290 g (polymer concentration: 11%) of a PGEE solution containing the base polymer (A5). When the molecular weight of the product in terms of the polystyrene was measured, then it was Mw=2,700.

Synthesis Example (A6)

To a mixture comprising 120 g of methanol, 3.0 g of 85% phosphoric acid aqueous solution (equivalent to 2.5 g of phosphoric acid [Monomer 113]), 1.5 g of boric acid [Monomer 116], 1 g of 70% nitric acid and 60 g of deionized water was added a mixture comprising 5.0 g of phenyl trimethoxy silane [Monomer 100], 17.0 g of methyl trimethoxy silane [Monomer 101] and 45.7 g of tetramethoxy silane [Monomer 102], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 300 g (polymer concentration: 11%) of a PGEE solution containing the base polymer (A6). When the molecular weight of the product in terms of the polystyrene was measured, then it was Mw=3,100.

Synthesis Example (A7)

To a mixture comprising 120 g of methanol, 3.0 g of 85% phosphoric acid aqueous solution (equivalent to 2.5 g of phosphoric acid [Monomer 113]), 1.5 g of boric acid [Monomer 116], 1 g of 70% nitric acid and 60 g of deionized water was added a mixture comprising 5.8 g of 4-methoxyphenyl trimethoxy silane [Monomer 105] and 64.7 g of tetramethoxy silane [Monomer 102], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 310 g (polymer concentration: 11%) of a PGEE solution containing the base polymer (A7). When the molecular weight of the product in terms of the polystyrene was measured, then it was Mw=3,000.

Synthesis Example (A8)

To a mixture comprising 120 g of methanol, 3.0 g of 85% phosphoric acid aqueous solution (equivalent to 2.5 g of phosphoric acid [Monomer 113]), 1.5 g of boric acid [Monomer 116], 1 g of 70% nitric acid and 60 g of deionized water was added a mixture comprising 5.0 g of phenyl trimethoxy silane [Monomer 100], 13.6 g of methyl trimethoxy silane [Monomer 101], 9.3 g of 4-acetoxy-4,4-bistrifluoromethylbutyl trimethoxy silane [Monomer 106] and 45.7 g of tetramethoxy silane [Monomer 102], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 300 g (polymer concentration: 11%) of a PGEE solution containing the base polymer (A8). When the molecular weight of the product in terms of the polystyrene was measured, then it was Mw=2,700.

Synthesis Example (A9)

To a mixture comprising 120 g of methanol, 3.0 g of 85% phosphoric acid aqueous solution (equivalent to 2.5 g of phosphoric acid [Monomer 113]), 1.5 g of boric acid [Monomer 116], 1 g of 70% nitric acid and 60 g of deionized water was added a mixture comprising 5.0 g of phenyl trimethoxy silane [Monomer 100] and 64.7 g of tetramethoxy silane [Monomer 102], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 270 g (polymer concentration: 12%) of a PGEE solution containing the base polymer (A9). When the molecular weight of the product in terms of the polystyrene was measured, then it was Mw=2,800.

Synthesis Example (A10)

To a mixture comprising 120 g of methanol, 2.1 g of phosphonic acid [Monomer 111], 1 g of 70% nitric acid and 60 g of deionized water was added a mixture comprising 68.5 g of tetramethoxy silane [Monomer 102] and 2.6 g of trimethyl borate [Monomer 115], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 290 g (polymer concentration: 11%) of a PGEE solution containing the base polymer (A10). When the molecular weight of the product in terms of the polystyrene was measured, then it was Mw=3,100.

Synthesis Example (A11)

To a mixture comprising 120 g of ethanol, 1 g of 70% nitric acid and 60 g of deionized water was added a mixture comprising 72.9 g of tetraethoxy silane [Monomer 103], 9.3 g of 4-hydroxy-4,4-bistrifluoromethylbutyl triethoxy silane [Monomer 107], 7.5 g of triethoxysilyl methyl benzoate [Monomer 108], 6.7 g of trimethyl borate [Monomer 115] and 2.7 g of tributyl phosphate [Monomer 112], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 270 g (polymer concentration: 12%) of a PGEE solution containing the base polymer (A11). When the molecular weight of the product in terms of the polystyrene was measured, then it was Mw=3,000.

Synthesis Example (A12)

To a mixture comprising 120 g of methanol, 3.0 g of 85% phosphoric acid aqueous solution (equivalent to 2.5 g of phosphoric acid [Monomer 113]), 1 g of 70% nitric acid and 60 g of deionized water was added a mixture comprising 52.7 g of tetramethoxy silane [Monomer 102], 0.5 g of methyl trimethoxy silane [Monomer 101], 5.0 g of phenyl trimethoxy silane [Monomer 100] and 10.4 g of trimethyl borate [Monomer 115], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 300 g (polymer concentration: 10%) of a PGEE solution containing the base polymer (A12). When the molecular weight of the product in terms of the polystyrene was measured, then it was Mw=2,800.

Synthesis Example (A13)

To a mixture comprising 120 g of methanol, 3.0 g of 85% phosphoric acid aqueous solution (equivalent to 2.5 g of phosphoric acid [Monomer 113]), 1 g of 70% nitric acid and 60 g of deionized water was added a mixture comprising 5.4 g of 4-fluorophenyl trimethoxy silane [Monomer 104] and 68.5 g of tetramethoxy silane [Monomer 102], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 270 g (polymer concentration: 12%) of a PGEE solution containing the base polymer (A13). When the molecular weight of the product in terms of the polystyrene was measured, then it was Mw=3,400.

Synthesis Example (A14)

To a mixture comprising 120 g of methanol, 1 g of 70% nitric acid and 60 g of deionized water was added a mixture comprising 5.0 g of phenyl trimethoxy silane [Monomer 100], 2.6 g of trimethyl borate [Monomer 115] and 68.5 g of tetramethoxy silane [Monomer 102], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 260 g (polymer concentration: 12%) of a PGEE solution containing the base polymer (A14). When the molecular weight of the product in terms of the polystyrene was measured, then it was Mw=2,700.

Synthesis Example (A15)

To a mixture comprising 120 g of methanol, 1 g of 70% nitric acid and 60 g of deionized water was added a mixture comprising 49.5 g of tetramethoxy silane [Monomer 102], 20.4 g of methyl trimethoxy silane [Monomer 101] and 5.0 g of phenyl trimethoxy silane [Monomer 100], and the resulting mixture was maintained at 40° C. for 12 hours to carry out hydrolysis condensation. After completion of the reaction, 300 g of PGEE was added to the resulting mixture, and ethyl acetate and water were distilled off under reduced pressure to obtain 260 g (polymer concentration: 10%) of a PGEE solution containing the base polymer (A15). When the molecular weight of the product in terms of the polystyrene was measured, then it was Mw=2,500.

In the following, formulation amounts of Synthesis Examples (A1) to (A15) are summarized in Table 1.

TABLE 1

| Synthesis Examples | Materials for reaction | Mw | Total content of the boron containing unit and the phosphorus containing unit |
|---|---|---|---|
| A1 | [Monomer 100]: 5.0 g, [Monomer 101]: 17.0 g, [Monomer 102]: 45.7 g, [Monomer 112]: 6.3 g, [Monomer 115]: 2.6 g | 2,500 | 10 mol % |
| A2 | [Monomer 100]: 5.0 g, [Monomer 101]: 17.0 g, [Monomer 102]: 45.7 g, [Monomer 110]: 4.0 g, [Monomer 115]: 2.6 g | 3,200 | 10 mol % |
| A3 | [Monomer 101]: 17.0 g, [Monomer 102]: 49.5 g, [Monomer 112]: 6.3 g, [Monomer 114]: 3.0 g | 3,000 | 10 mol % |
| A4 | [Monomer 100]: 5.0 g, [Monomer 101]: 10.2 g, [Monomer 102]: 53.3 g, [Monomer 113]: 2.5 g, [Monomer 115]: 2.6 g | 3,000 | 10 mol % |
| A5 | [Monomer 100]: 5.0 g, [Monomer 101]: 17.0 g, [Monomer 102]: 45.7 g, [Monomer 112]: 6.3 g, [Monomer 116]: 1.5 g | 2,700 | 10 mol % |
| A6 | [Monomer 100]: 5.0 g, [Monomer 101]: 17.0 g, [Monomer 102]: 45.7 g, [Monomer 113]: 2.5 g, [Monomer 116]: 1.5 g | 3,100 | 10 mol % |
| A7 | [Monomer 105]: 5.8 g, [Monomer 102]: 64.7 g, [Monomer 113]: 2.5 g, [Monomer 116]: 1.5 g | 3,000 | 10 mol % |
| A8 | [Monomer 100]: 5.0 g, [Monomer 101]: 13.6 g, [Monomer 102]: 45.7 g, [Monomer 106]: 9.3 g, [Monomer 113]: 2.5 g, [Monomer 116]: 1.5 g | 2,700 | 10 mol % |
| A9 | [Monomer 100]: 5.0 g, [Monomer 102]: 64.7 g, [Monomer 113]: 2.5 g, [Monomer 116]: 1.5 g | 2,800 | 10 mol % |
| A10 | [Monomer 102]: 68.5 g, [Monomer 111]: 2.1 g, [Monomer 115]: 2.6 g | 3,100 | 10 mol % |
| A11 | [Monomer 103]: 72.9 g, [Monomer 107]: 9.3 g, [Monomer 108]: 7.5 g, [Monomer 112]: 2.7 g, [Monomer 115]: 6.7 g | 3,000 | 16 mol % |
| A12 | [Monomer 102]: 52.7 g, [Monomer 101]: 0.5 g, [Monomer 100]: 5.0 g, [Monomer 113]: 2.5 g, [Monomer 115]: 10.4 g | 2,800 | 25 mol % |
| A13 | [Monomer 104]: 5.4 g, [Monomer 102]: 68.5 g, [Monomer 113]: 2.5 g | 3,400 | 5 mol % (no boron containing unit) |
| A14 | [Monomer 100]: 5.0 g, [Monomer 102]: 68.5 g, [Monomer 115]: 2.6 g | 2,700 | 5 mol % (no phosphorus containing unit) |
| A15 | [Monomer 102]: 49.5 g, [Monomer 101]: 20.4 g, [Monomer 100]: 5.0 g | 2,500 | — (neither boron containing unit nor phosphorus containing unit) |

PhSi(OCH$_3$)$_3$ [Monomer 100]
CH$_3$Si(OCH$_3$)$_3$ [Monomer 101]
Si(OCH$_3$)$_4$ [Monomer 102]
Si(OC$_2$H$_5$)$_4$ [Monomer 103]

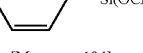

[Monomer 104]

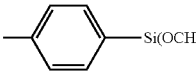

[Monomer 105]

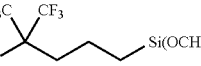

[Monomer 106]

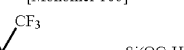

[Monomer 107]

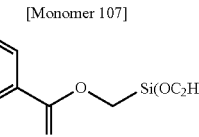

[Monomer 108]
PhPO(OH)$_2$ [Monomer 110]
H$_3$PO$_3$ [Monomer 111]
PO(OC$_4$H$_9$)$_3$ [Monomer 112]
H$_3$PO$_4$ [Monomer 113]
PhB(OH)$_2$ [Monomer 114]
B(OCH$_3$)$_3$ [Monomer 115]
H$_3$BO$_3$ [Monomer 116]

Synthesis of Component (C)

Synthesis Example (C1)

To a mixture comprising 120 g of methanol, 1 g of methanesulfonic acid and 60 g of deionized water was added a mixture comprising 34.1 g of methyl trimethoxy silane [Monomer 101] and 26.0 g of trimethyl borate [Monomer 115], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 300 g (polymer concentration: 13%) of a PGEE solution containing the silicon-containing compound (C1). When the molecular weight of the product in terms of the polystyrene was measured, then it was Mw=3,200.

Synthesis Example (C2)

To a mixture comprising 120 g of methanol, 1 g of methanesulfonic acid and 60 g of deionized water was added a mixture comprising 9.9 g of phenyl trimethoxy silane [Monomer 100], 54.5 g of methyl trimethoxy silane [Monomer 101] and 12.5 g of tributyl phosphate [Monomer 112], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 310 g (polymer concentration: 11.9%) of a PGEE solution containing the silicon-containing compound (C2). When the molecular weight of the product in terms of the polystyrene was measured, then it was Mw=3,500.

Synthesis Example (C3)

To a mixture comprising 120 g of methanol, 1 g of methanesulfonic acid and 60 g of deionized water was added a mixture comprising 61.3 g of methyl trimethoxy silane [Monomer 101] and 7.6 g of tetramethoxy silane [Monomer 102], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 300 g (polymer concentration: 11.1%) of a PGEE solution containing the silicon-containing compound (C3). When the molecular weight of the product in terms of the polystyrene was measured, then it was Mw=3,500.

Synthesis Example (C4)

To a mixture comprising 120 g of methanol, 1 g of methanesulfonic acid and 60 g of deionized water was added a mixture comprising 34.1 g of methyl trimethoxy silane [Monomer 101] and 67.6 g of 4-tert-butoxyphenyl trimethoxy silane [Monomer 120], and the resulting mixture was maintained at 40° C. for 12 hours to carry out hydrolysis condensation. After completion of the reaction, 500 g of PGEE was added to the resulting mixture, and a by-produced alcohol and excess water were distilled off under reduced pressure to obtain 570 g (polymer concentration: 11.7%) of a PGEE solution containing the silicon-containing compound (C4). When the molecular weight of the product in terms of the polystyrene was measured, then it was Mw=2,700.

Synthesis Examples (C5) to (C7)

Synthesis Examples (C5) to (C7) were conducted by using monomers shown in the following Table 2 under the same conditions as in Synthesis Example (C4) to prepare PGEE solutions of the silicon-containing compounds (C5) to (C7), respectively.

In the following, formulation amounts of Synthesis Examples (C1) to (C7) are summarized in Table 2.

TABLE 2

| Synthesis Examples | Materials for reaction | Mw |
|---|---|---|
| C1 | [Monomer 101]: 34.1 g, [Monomer 115]: 26.0 g | 3,200 |
| C2 | [Monomer 100]: 9.9 g, [Monomer 101]: 54.5 g, [Monomer 112]: 12.5 g | 3,500 |
| C3 | [Monomer 101]: 61.3 g, [Monomer 102]: 7.6 g | 3,500 |
| C4 | [Monomer 101]: 34.1 g, [Monomer 120]: 67.6 g | 2,700 |
| C5 | [Monomer 101]: 34.1 g, [Monomer 121]: 83.1 g | 3,300 |
| C6 | [Monomer 101]: 34.1 g, [Monomer 122]: 74.6 g | 2,500 |
| C7 | [Monomer 102]: 22.8 g, [Monomer 123]: 96.7 g | 2,800 |

In the following, structural formulae of the compounds to be used in Synthesis Examples (C1) to (C7) are shown.

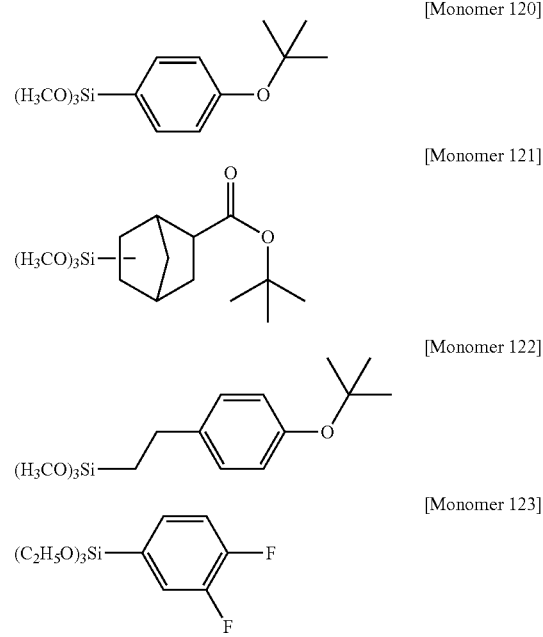

Examples and Comparative Examples

The base polymers (A1) to (A15) obtained in the above Synthesis Examples as Component (A), the organic compounds as Component (B), the silicon-containing compounds (C1) to (C7) obtained in the above Synthesis Examples as Component (C), additives, and the solvents were mixed with the ratios shown in Table 3, and the respective mixtures were filtered through 0.1 μm of a filter made of a fluorine resin to prepare the respective compositions for forming a coating type BPSG film which were named Sols. 1 to 12 and the respective composition solutions for forming a coating type silicon-containing film which were named Sols. 13 to 15 respectively.

TABLE 3

| No. | Component (A) (Parts by mass) | Component (B) (Parts by mass) | Component (C) (Parts by mass) | Additives | | Organic acid (Parts by mass) | Solvent (Parts by mass) | Content of Component (B) based on 100 parts by mass of Component (A) |
| --- | --- | --- | --- | --- | --- | --- | --- | --- |
| | | | | Thermal crosslinking accelerator (Parts by mass) | Photo-acid generator (Parts by mass) | | | |
| Sol. 1 | A1 (4.0) | PEOL (0.4) | — | TPSH$_2$PO$_4$ (0.02) | — | Maleic acid (0.04) | PGEE/water (310/55) | 10 parts by mass |
| Sol. 2 | A2 (4.0) | PEOL (0.4) | — | TPSH$_2$BO$_3$ (0.02) | — | Oxalic acid (0.04) | PGEE/water (310/55) | 10 parts by mass |
| Sol. 3 | A3 (4.0) | PEOL (0.4) | — | TPSMA (0.04) | — | Maleic acid (0.04) | PGEE/water (310/55) | 10 parts by mass |
| Sol. 4 | A4 (4.0) | TAEOH (0.4) | — | TPSNO$_3$ (0.04) | — | Oxalic acid (0.04) | PGEE/water (310/55) | 10 parts by mass |
| Sol. 5 | A5 (4.0) | TMOL (0.4) | C1 (0.2) | QMANO$_3$ (0.02) | — | Oxalic acid (0.04) | PGEE/water (310/55) | 10 parts by mass |
| Sol. 6 | A6 (4.0) | TMOL (0.4) | C2 (0.1) | TPSMA (0.04) | — | Maleic acid (0.04) | PGEE/water (310/55) | 10 parts by mass |
| Sol. 7 | A7 (3.6) | SORBOL (0.4) | C3 (0.4) | TPSMA (0.04) | — | Maleic acid (0.04) | PGEE/water (310/55) | 11 parts by mass |
| Sol. 8 | A8 (3.6) | XYTOL (0.4) | C4 (0.4) | TPSMA (0.04) | TPSNf (0.04) | Maleic acid (0.04) | PGEE/water (310/55) | 11 parts by mass |
| Sol. 9 | A9 (3.6) | XYTOL (1.0) | C5 (0.4) | TPSNO$_3$ (0.04) | — | Maleic acid (0.04) | PGEE/water (310/55) | 28 parts by mass |
| Sol. 10 | A10 (3.8) | XYTOL (1.0) | C6 (0.2) | TPSMA (0.02) | — | Maleic acid (0.04) | PGEE/water (310/55) | 26 parts by mass |
| Sol. 11 | A11 (4.0) | SORBOL (1.0) | C7 (0.2) | TPSNO$_3$ (0.04) | — | Maleic acid (0.04) | PGEE/water (310/55) | 25 parts by mass |
| Sol. 12 | A12 (4.0) | SORBOL (1.0) | C7 (0.2) | TPSNO$_3$ (0.02) | — | Maleic acid (0.04) | PGEE/water (310/65) | 25 parts by mass |
| Sol. 13 | A13 (3.8) | XYTOL (0.4) | C6 (0.2) | TPSNO$_3$ (0.04) | — | Maleic acid (0.04) | PGEE/water (310/55) | 11 parts by mass |
| Sol. 14 | A14 (3.8) | XYTOL (0.4) | C6 (0.2) | TPSNO$_3$ (0.02) | — | Maleic acid (0.04) | PGEE/water (310/55) | 11 parts by mass |
| Sol. 15 | A15 (4.0) | — | — | TPSNO$_3$ (0.04) | — | Maleic acid (0.04) | PGEE/water (240/45) | — |

Component (B) used are as follows:
PEOL: Pentaerythritol
TAEOH: Triethanolamine
TMOL: Trimethylolethane
SORBOL: Sorbitol
XYTOL: Xylitol
Additives used are as follows:
TPSH$_2$PO$_4$: Mono(triphenylsulfonium) phosphate
TPSH$_2$BO$_3$: Mono(triphenylsulfonium) borate
TPSMA: Mono(triphenylsulfonium) maleate
TPSNO$_3$: Triphenylsulfonium nitrate
QMANO$_3$: Tetramethylammonium nitrate
TPSNf: Triphenylsulfonium nonafluorobutanesulfonate

[Coating Film Wet Etching Test]

A spin-on carbon film ODL-50 (Carbon content: 80% by mass) available from Shin-Etsu Chemical Co., Ltd., was formed on a silicon wafer with a film thickness of 200 nm as the organic under layer film. Sols. 1 to 12, which were the compositions for forming a coating type BPSG film, and Sols. 13 to 15, which were the compositions for forming a silicon-containing film, were each coated thereon, and heated at 220° C. for 60 seconds to form BPSG films, Films 1 to 12, and silicon-containing films, Films 13 to 15, each having a film thickness of 35 nm.

The substrates thus obtained were subjected to dry etching under the following dry etching conditions by using an etching device Telius manufactured by Tokyo Electron Ltd. Then, the substrate were dipped in a 1% aqueous hydrogen peroxide containing 0.6% ammonia (SC1) at 50° C. to perform wet etching, and the upper part of each organic under layer film of the obtained wafers was subjected to XPS analysis by K-ALPHA manufactured by Thermo Fisher Scientific K.K., to measure the silicon content after wet etching. Furthermore, ashing was performed under the following ashing conditions with respect to a wafer obtained by sequentially performing the steps to wet etching under the same conditions as above to observe the residue on the wafer by an electron microscope (CG4000) manufactured by Hitachi High-Technologies Corporation. The results are shown in Table 4.

(Dry Etching Conditions)

| Chamber pressure | 2.7 Pa |
| --- | --- |
| RF power | 1,000 W |
| N$_2$ gas flow amount | 500 mL/min |
| H$_2$ gas flow amount | 30 mL/min |
| Treatment time | 60 sec |

(Ashing Conditions)

| Chamber pressure | 2.7 Pa |
| --- | --- |
| RF power | 1,000 W |
| N$_2$ gas flow amount | 500 mL/min |
| H$_2$ gas flow amount | 30 mL/min |
| Treatment time | 180 sec |

TABLE 4

| Examples | BPSG film | SC1 Dipping time (min) | Silicon content after wet etching (atomic percent) | The residue after ashing |
|---|---|---|---|---|
| Example 1-1 | Film 9 | 10 | 4.2 | None |
| Example 1-2 | Film 10 | 10 | 4.0 | None |
| Example 1-3 | Film 11 | 5 | 2.8 | None |
| Example 1-4 | Film 11 | 10 | 1.0 | None |
| Example 1-5 | Film 12 | 5 | 2.3 | None |
| Example 1-6 | Film 12 | 10 | 0.9 | None |
| Comparative Example 1-1 | Film 1 | 10 | 6.1 | Present |
| Comparative Example 1-2 | Film 2 | 10 | 7.2 | Present |
| Comparative Example 1-3 | Film 3 | 10 | 6.5 | Present |
| Comparative Example 1-4 | Film 4 | 10 | 6.3 | Present |
| Comparative Example 1-5 | Film 5 | 10 | 5.9 | Present |
| Comparative Example 1-6 | Film 6 | 10 | 7.4 | Present |
| Comparative Example 1-7 | Film 7 | 10 | 6.7 | Present |
| Comparative Example 1-8 | Film 8 | 10 | 6.2 | Present |
| Comparative Example 1-9 | Film 13 | 10 | 15.3 | Present |
| Comparative Example 1-10 | Film 14 | 10 | 16.0 | Present |
| Comparative Example 1-11 | Film 15 | 10 | 25.2 | Present |

As shown in the above Table 4, in examples which used Film 13 having no boron containing unit (Comparative Example 1-9), Film 14 having no phosphorus containing unit (Comparative Example 1-10) and Film 15 having neither boron containing unit nor phosphorus containing unit (Comparative Example 1-11), a large amount of silicon remained after wet etching by SC1, thus it could be clarified that these silicon-containing films were hardly removed by SC1 after dry etching with $N_2/H_2$ mixed gas. On the other hand, in examples which used Films 1 to 12, each of which has been formed from the compositions for forming a coating type BPSG film named Sols. 1 to 12 (Comparative Examples 1-1 to 1-8 and Examples 1-1 to 1-6), the silicon contents after wet etching were less than those of Films 13 to 15, thus it could be clarified that these BPSG films can be easily removed by SC1 even after the under layer film has been processed by dry etching with $N_2/H_2$ mixed gas.

In examples using Films 1 to 8 (Comparative Examples 1-1 to 1-8), although the silicon content after wet etching was reduced compared with examples using Films 13 to 15 (Comparative Examples 1-9 to 1-11) as mentioned above, it exceeded 5 atomic percent, and the residue was observed after ashing. Accordingly, it could be clarified that in examples using Films 1 to 8, the residue of the BPSG film cannot be sufficiently removed by wet etching using SC1. On the other hand, in examples using Films 9 to 12 (Examples 1-1 to 1-6) which include the base polymer having a boron containing unit and a phosphorus containing unit with a total content of 10 mol % or more (Component (A)) and the organic compound having two or more hydroxyl groups per one molecule (Component (B)) with a content of 25 parts by mass of the Component (B) with respect to 100 parts by mass of the Component (A), the silicon content after wet etching was 5 atomic percent or less, and the residue was not detected after subsequent ashing. Accordingly, it could be clarified that in examples using Films 9 to 12, the residue of the BPSG film can be sufficiently removed by wet etching using SC1. Moreover, the above results suggest when the silicon content after wet etching is 5 atomic percent or less, no residue remains because silicon is removed as silane by ashing with $N_2/H_2$ mixed gas.

[Patterning Test by Positive Development]

A spin-on carbon film ODL-50 (Carbon content: 80% by mass) available from Shin-Etsu Chemical Co., Ltd., was formed on a silicon wafer with a film thickness of 200 nm as the organic under layer film. The compositions for forming a coating type BPSG film, Sols. 9 to 12, were each coated thereon and heated at 220° C. for 60 seconds to form BPSG films, Films 9 to 12, with a film thickness of 35 nm, respectively.

Subsequently, the ArF resist solution for positive development (PR-1) described in the following Table 5 was coated on the BPSG film, and baked at 110° C. for 60 seconds to form a photoresist film having a film thickness of 100 nm. Further, the liquid immersion top coat solution (TC-1) described in the following Table 6 was coated on the photoresist film and baked at 90° C. for 60 seconds to form a top coat with a film thickness of 50 nm.

Next, these were exposed by an ArF liquid immersion exposure apparatus (NSR-S610C manufactured by Nikon Corporation, NA: 1.30, σ: 0.98/0.65, 35° polarized dipole illumination, 6% halftone phase shift mask), baked at 100° C. for 60 seconds (PEB), and developed by a 2.38% by mass tetramethylammonium hydroxide (TMAH) aqueous solution for 30 seconds to obtain 160 nm 1:1 positive line and space pattern.

A cross-sectional shape of the pattern of the thus obtained substrate was observed by an electron microscope (S-9380) manufactured by Hitachi Ltd., and collapse of the pattern of the same was observed by an electron microscope (CG4000) manufactured by Hitachi High-Technologies Corporation.

The composition of the ArF resist solution for positive development (PR-1) to be used for the above-mentioned patterning test by positive development is shown in the following Table 5.

TABLE 5

| No. | Polymer (Parts by mass) | Acid generator (Parts by mass) | Base (Parts by mass) | Solvent (Parts by mass) |
|---|---|---|---|---|
| PR-1 | ArF resist polymer 1 (100) | PAG1 (7.0) | Quencher (1.0) | PGMEA (2,500) |

The following are molecular weight, dispersity and the structural formula of the ArF resist polymer 1 shown in the above Table 5.

ArF resist polymer 1: Molecular weight (Mw)=7,800

Dispersity (Mw/Mn)=1.78

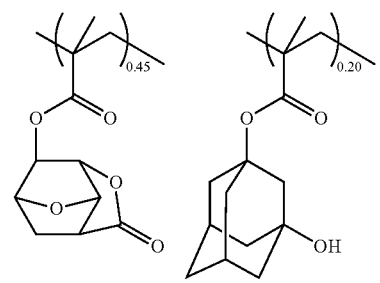

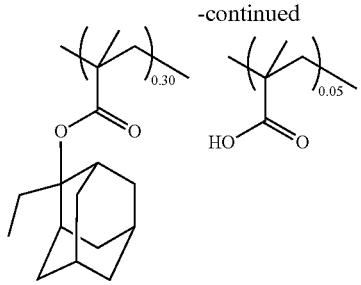

The following is the structural formula of the acid generator: PAG1 shown in the above Table 5.

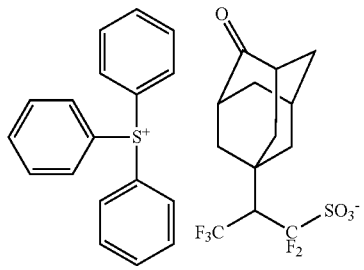

The following is the structural formula of the base: Quencher shown in the above Table 5.

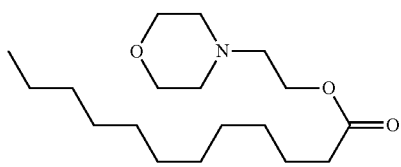 [SMILES: CCCCCCCCCCCC(=O)OCCN1CCOCC1]

Also, PGMEA denotes propylene glycol monomethyl ether acetate.

The composition of the liquid immersion top coat solution (TC-1) to be used in the above-mentioned patterning test by positive development is shown in the following Table 6.

TABLE 6

| | Polymer (Parts by mass) | Organic solvent (Parts by mass) |
|---|---|---|
| TC-1 | Top coat polymer (100) | Diisoamyl ether (2700) 2-methyl-1-butanol (270) |

The following are molecular weight, dispersity and structural formula of the top coat polymer shown in the above Table 6.

Top coat polymer: Molecular weight (Mw)=8,800
 Dispersity (Mw/Mn)=1.69

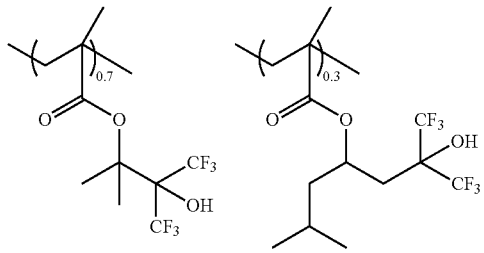

The results of observing the cross-sectional shape of the pattern and collapse of the pattern obtained by the above-mentioned patterning test by positive development are shown in the following Table 7.

TABLE 7

| Examples | BPSG film | Film forming property | Cross-sectional pattern shape after development | Collapse of the pattern |
|---|---|---|---|---|
| Example 2-1 | Film 9 | good | Vertical shape | None |
| Example 2-2 | Film 10 | good | Vertical shape | None |
| Example 2-3 | Film 11 | good | Vertical shape | None |
| Example 2-4 | Film 12 | good | Vertical shape | None |

As shown in the above Table 7, in the positive development, the substrate using the BPSG film, Films 9 to 12, as the resist under layer film can provide a resist upper layer film pattern whose cross-section is a vertical shape without causing collapse of the pattern. Also, such a BPSG film was excellent in film forming property.

As described above, the BPSG film used in the present invention can be easily and sufficiently wet etched by SC1 which does not cause damage to the substrate to be processed and the under layer film even after the dry etching process of the under layer film. Moreover, the cleaning effect due to wet etching by SC1 can be evaluated by XPS analysis, and thereby one can judge whether the mask pattern is clean enough to process the substrate after wet etching. Moreover, the BPSG film having the boron containing unit and the phosphorus containing unit with the certain ratio shows good adhesiveness to the resist upper layer film pattern formed thereon, and no collapse of the pattern is caused, thereby enabling a fine pattern formation. As described above, it could be clarified that the patterning process of the present invention is useful for the production of a cutting-edge semiconductor apparatus.

It must be noted here that the present invention is not limited to the embodiments as described above. The foregoing embodiments are mere examples; any form having substantially the same composition as the technical concept described in claims of the present invention and showing similar effects is included in the technical scope of the present invention.

What is claimed is:
1. A patterning process of forming a mask pattern on a substrate to be processed for use in processing the substrate to be processed, comprising the steps of:
   (I) forming an under layer film consisting of an organic under layer film or a CVD hard mask on the substrate to be processed;
   (II) forming a BPSG film on the under layer film by using a composition for forming a coating type BPSG film including a base polymer and an organic compound with a content of 25 parts by mass or more of the organic compound with respect to 100 parts by mass of the base polymer, the base polymer having a silicon containing unit, a boron containing unit and a phosphorus containing unit with a total content of the boron containing unit and the phosphorus containing unit being 10 mol % or more, the organic compound having two or more hydroxyl groups or carboxyl groups per one molecule;
   (III) forming a resist upper layer film on the BPSG film;
   (IV) forming a pattern to the resist upper layer film;

(V) transferring the pattern to the BPSG film by dry etching using the resist upper layer film having the formed pattern as a mask;

(VI) transferring the pattern to the under layer film by dry etching using a gas including $N_2$, $H_2$ or both and the BPSG film having the formed pattern as a mask; and (VII) removing a residue of the BPSG film remaining on the under layer film having the formed pattern by wet etching using an ammonia aqueous solution containing hydrogen peroxide; to form a mask pattern for use in processing the substrate to be processed.

2. The patterning process according to claim 1, wherein, in the step (VII), the residue of the BPSG film remaining on the under layer film having the formed pattern is removed such that a silicon content on the under layer film is 5 atomic percent or less when X-ray photoelectron spectroscopy is performed on the under layer film.

3. The patterning process according to claim 1, wherein the substrate to be processed is a material in which any of a metal film, an amorphous metal film, a metal carbide film, a metal oxide film, a metal nitride film, a metal oxycarbide film and a metal oxynitride film is formed on a semiconductor apparatus substrate on which a part or whole of semiconductor circuits has/have been formed, as a layer to be processed.

4. The patterning process according to claim 2, wherein the substrate to be processed is a material in which any of a metal film, an amorphous metal film, a metal carbide film, a metal oxide film, a metal nitride film, a metal oxycarbide film and a metal oxynitride film is formed on a semiconductor apparatus substrate on which a part or whole of semiconductor circuits has/have been formed, as a layer to be processed.

5. The patterning process according to claim 3, wherein the metal constitutes the substrate to be processed comprises silicon, titanium, tungsten, hafnium, zirconium, chromium, germanium, copper, aluminum, indium, gallium, arsenic, palladium, iron, tantalum, iridium, molybdenum, or an alloy thereof.

6. The patterning process according to claim 4, wherein the metal constitutes the substrate to be processed comprises silicon, titanium, tungsten, hafnium, zirconium, chromium, germanium, copper, aluminum, indium, gallium, arsenic, palladium, iron, tantalum, iridium, molybdenum, or an alloy thereof.

7. The patterning process according to claim 1, wherein the pattern formation of the resist upper layer film is carried out by any of a lithography method using light with a wavelength of 300 nm or less or EUV light, an electron beam direct drawing method, a directed self-assembly method and a nano-imprinting lithography method.

8. The patterning process according to claim 2, wherein the pattern formation of the resist upper layer film is carried out by any of a lithography method using light with a wavelength of 300 nm or less or EUV light, an electron beam direct drawing method, a directed self-assembly method and a nano-imprinting lithography method.

9. The patterning process according to claim 3, wherein the pattern formation of the resist upper layer film is carried out by any of a lithography method using light with a wavelength of 300 nm or less or EUV light, an electron beam direct drawing method, a directed self-assembly method and a nano-imprinting lithography method.

10. The patterning process according to claim 4, wherein the pattern formation of the resist upper layer film is carried out by any of a lithography method using light with a wavelength of 300 nm or less or EUV light, an electron beam direct drawing method, a directed self-assembly method and a nano-imprinting lithography method.

11. The patterning process according to claim 5, wherein the pattern formation of the resist upper layer film is carried out by any of a lithography method using light with a wavelength of 300 nm or less or EUV light, an electron beam direct drawing method, a directed self-assembly method and a nano-imprinting lithography method.

12. The patterning process according to claim 6, wherein the pattern formation of the resist upper layer film is carried out by any of a lithography method using light with a wavelength of 300 nm or less or EUV light, an electron beam direct drawing method, a directed self-assembly method and a nano-imprinting lithography method.

* * * * *